(12) United States Patent
Aketa et al.

(10) Patent No.: US 12,148,667 B2
(45) Date of Patent: Nov. 19, 2024

(54) SEMICONDUCTOR DEVICE MANUFACTURING METHOD AND WAFER-ATTACHED STRUCTURE

(71) Applicant: ROHM CO., LTD., Kyoto (JP)

(72) Inventors: Masatoshi Aketa, Kyoto (JP); Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/223,035

(22) Filed: Jul. 18, 2023

(65) Prior Publication Data

US 2023/0377973 A1 Nov. 23, 2023

Related U.S. Application Data

(63) Continuation of application No. 17/586,486, filed on Jan. 27, 2022, now Pat. No. 11,742,243, which is a (Continued)

(30) Foreign Application Priority Data

Jun. 19, 2017 (JP) .................................. 2017-119704

(51) Int. Cl.
  *H01L 21/78* (2006.01)
  *B23K 26/53* (2014.01)
  (Continued)

(52) U.S. Cl.
  CPC .......... *H01L 21/7813* (2013.01); *B23K 26/53* (2015.10); *H01L 21/304* (2013.01); (Continued)

(58) Field of Classification Search
  CPC ............... H01L 21/7813; H01L 21/304; H01L 21/30625; H01L 21/6835; H01L 23/544; (Continued)

(56) References Cited

U.S. PATENT DOCUMENTS 5,927,993 A 7/1999 Lesk et al.
8,921,239 B2 * 12/2014 Belle ................. H01L 21/76251
                                                            438/795
(Continued)

FOREIGN PATENT DOCUMENTS

JP 2009-061462 A 3/2009
JP 2010-016188 A 1/2010
(Continued)

OTHER PUBLICATIONS

International Search Report and Written Opinion issued for International Patent Application No. PCT/JP2018/023373, Date of mailing: Aug. 14, 2018, 8 pages.

(Continued)

*Primary Examiner* — Vu A Vu
(74) *Attorney, Agent, or Firm* — XSENSUS LLP

(57) ABSTRACT

A method for manufacturing a semiconductor device includes a step of preparing a semiconductor wafer source which includes a first main surface on one side, a second main surface on the other side and a side wall connecting the first main surface and the second main surface, an element forming step of setting a plurality of element forming regions on the first main surface of the semiconductor wafer source, and forming a semiconductor element at each of the plurality of element forming regions, and a wafer source separating step of cutting the semiconductor wafer source from a thickness direction intermediate portion along a horizontal direction parallel to the first main surface, and separating the semiconductor wafer source into an element formation wafer and an element non-formation wafer after the element forming step.

17 Claims, 55 Drawing Sheets

Related U.S. Application Data continuation of application No. 16/624,209, filed as application No. PCT/JP2018/023373 on Jun. 19, 2018, now Pat. No. 11,264,280.

(51) Int. Cl.
   *H01L 21/304* (2006.01)
   *H01L 21/306* (2006.01)
   *H01L 21/683* (2006.01)
   *H01L 23/544* (2006.01)

(52) U.S. Cl.
   CPC .... *H01L 21/30625* (2013.01); *H01L 21/6835* (2013.01); *H01L 23/544* (2013.01); *H01L 2221/68345* (2013.01); *H01L 2221/6835* (2013.01)

(58) Field of Classification Search
   CPC ... H01L 2221/68345; H01L 2221/6835; H01L 2221/68327; H01L 2221/6834; H01L 2221/68309; H01L 21/683; B23K 26/53; B23K 2103/56; B23K 2101/36; B28D 5/04
   USPC .......................................................... 438/478
   See application file for complete search history.

(56) References Cited

U.S. PATENT DOCUMENTS

| | | | |
|---|---|---|---|
| 9,087,873 | B2 | 7/2015 | Owada |
| 9,147,599 | B2 | 9/2015 | Nakajima |
| 9,214,353 | B2 * | 12/2015 | Yonehara ............... B23K 26/53 |
| 9,406,551 | B2 | 8/2016 | Werner et al. |
| 9,576,835 | B2 | 2/2017 | Wei et al. |
| 9,761,493 | B2 * | 9/2017 | Celler ................. H01L 21/7813 |
| 10,134,848 | B2 * | 11/2018 | Ruhl .................... H01L 21/6835 |
| 11,264,280 | B2 | 3/2022 | Aketa et al. |
| 11,721,547 | B2 * | 8/2023 | Hecht ............... H01L 21/76254 257/77 |
| 2010/0025695 | A1 * | 2/2010 | Shibagaki ......... H01L 29/66068 257/77 |
| 2014/0038392 | A1 | 2/2014 | Yonehara et al. |
| 2015/0179494 | A1 | 6/2015 | Kawamori et al. |
| 2016/0074960 | A1 | 3/2016 | Hirata et al. |
| 2016/0158882 | A1 | 6/2016 | Hirata et al. |
| 2016/0158883 | A1 | 6/2016 | Hirata et al. |
| 2016/0193690 | A1 | 7/2016 | Hirata et al. |
| 2016/0193691 | A1 | 7/2016 | Hirata et al. |
| 2016/0228984 | A1 | 8/2016 | Hirata et al. |
| 2016/0228985 | A1 | 8/2016 | Hirata et al. |
| 2016/0288250 | A1 | 10/2016 | Hirata et al. |
| 2016/0305042 | A1 | 10/2016 | Hirata |
| 2016/0307763 | A1 | 10/2016 | Hirata |
| 2017/0066078 | A1 | 3/2017 | Morikazu et al. |
| 2017/0136572 | A1 | 5/2017 | Hirata |
| 2018/0047619 | A1 | 2/2018 | Lehnert et al. |

FOREIGN PATENT DOCUMENTS

| | | | |
|---|---|---|---|
| JP | 2011-167718 | A | 9/2011 |
| JP | 2012-248704 | A | 12/2012 |
| JP | 2013-049161 | A | 3/2013 |
| JP | 2015-516672 | A | 6/2015 |
| JP | 2015-223589 | A | 12/2015 |
| JP | 2016-035965 | A | 3/2016 |
| JP | 2016-062949 | A | 4/2016 |
| JP | 2016-111143 | A | 6/2016 |
| JP | 2016-111144 | A | 6/2016 |
| JP | 2016-111145 | A | 6/2016 |
| JP | 2016-124015 | A | 7/2016 |
| JP | 2016-127186 | A | 7/2016 |
| JP | 2016-146446 | A | 8/2016 |
| JP | 2016-146447 | A | 8/2016 |
| JP | 2016-197698 | A | 11/2016 |
| JP | 2016-198788 | A | 12/2016 |
| JP | 2016-207702 | A | 12/2016 |
| JP | 2016-207703 | A | 12/2016 |
| JP | 2017-081813 | A | 5/2017 |
| WO | 2013/126927 | A1 | 8/2013 |

OTHER PUBLICATIONS

International Preliminary Report on Patentability issued for International Patent Application No. PCT/JP2018/023373, Date of mailing: Jan. 2, 2020, 13 pages.

Notice of Reasons for Refusal issued for Japanese Patent Application No. 2019-525648, Dispatch Date: Sep. 1, 2022, 14 pages.

First Office Action issued for Chinese Patent Application No. 201880040660.9, dated Jan. 18, 2023, 16 pages.

German Office Action dated Dec. 20, 2023, issued in German patent application No. 112018003116.0 which is corresponding to this U.S. patent application, 14 pages.

Office Action mailed Dec. 7, 2023, in Chinese Application No. 201880040660.9, 11 pages.

Chinese Office Action issued Mar. 12, 2024 in corresponding Chinese Patent Application No. 201880040660.9, 14 pages.

Office Action issued May 16, 2024 in corresponding Chinese Patent Application No. 201880040660.9.

Notice of Reasons for Refusal issued May 23, 2024 in corresponding Japanese Patent Application No. 2023-056437.

Office Action dated Jul. 19, 2024 in corresponding Chinese Patent Application No. 201880040660.9.

* cited by examiner

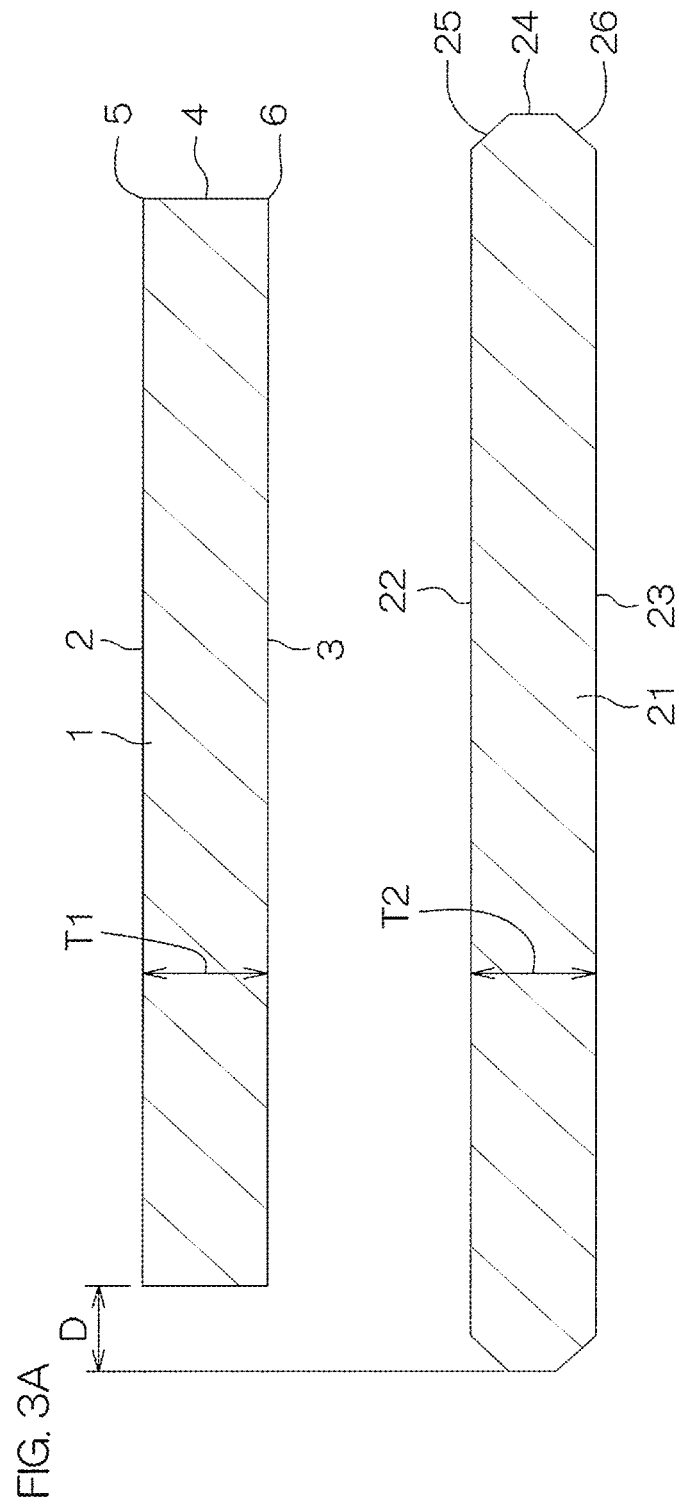

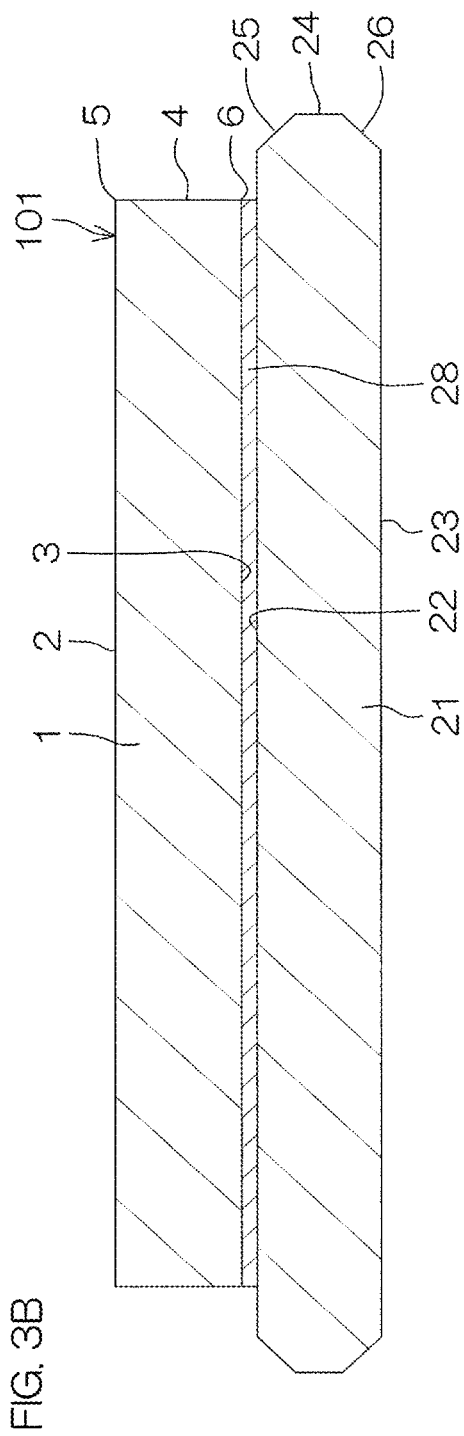

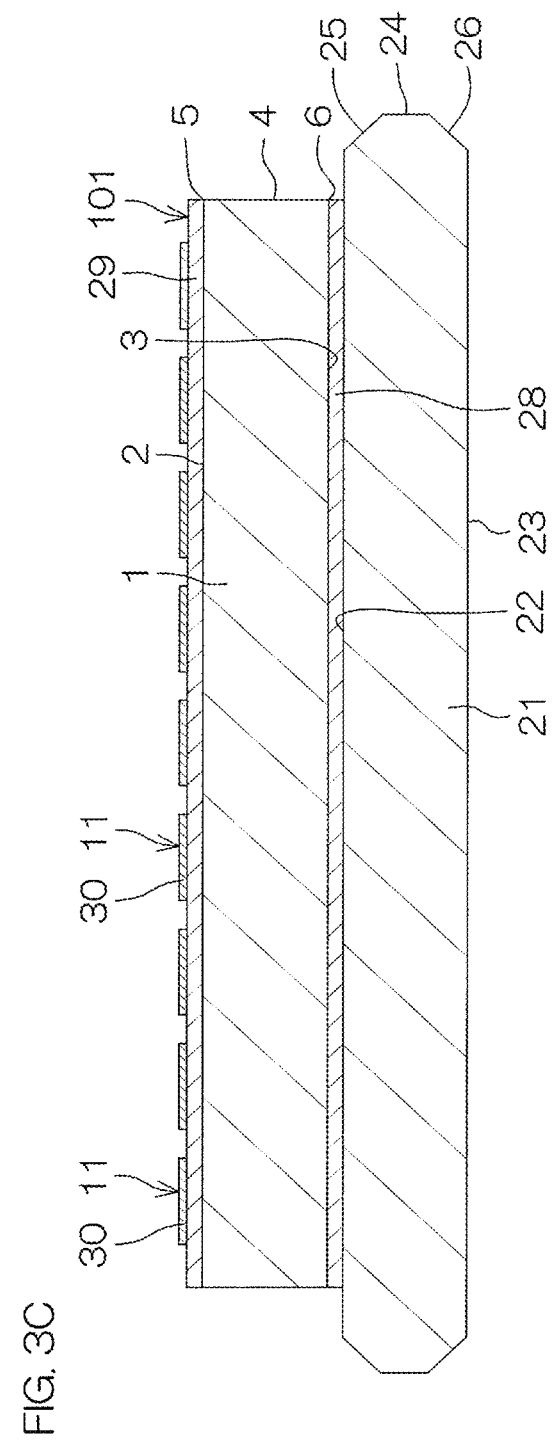

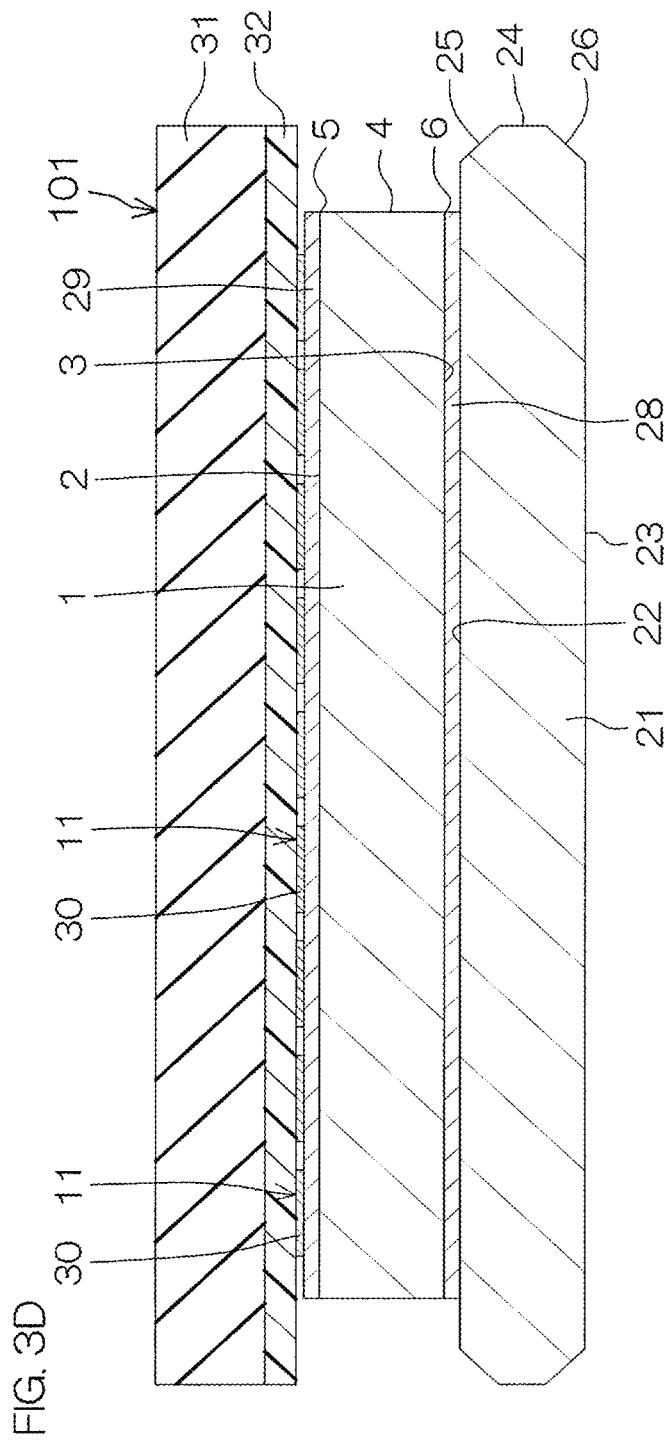

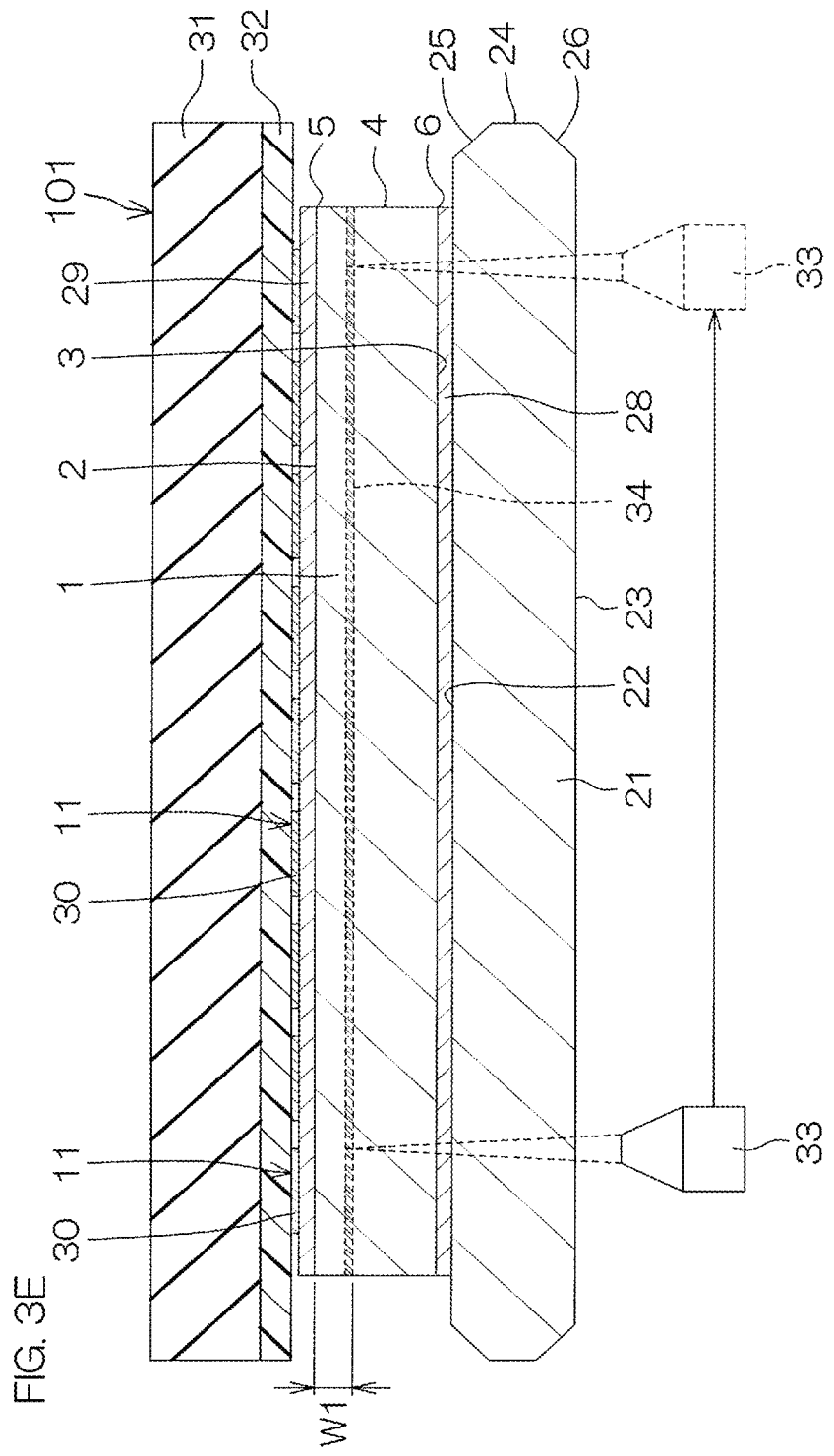

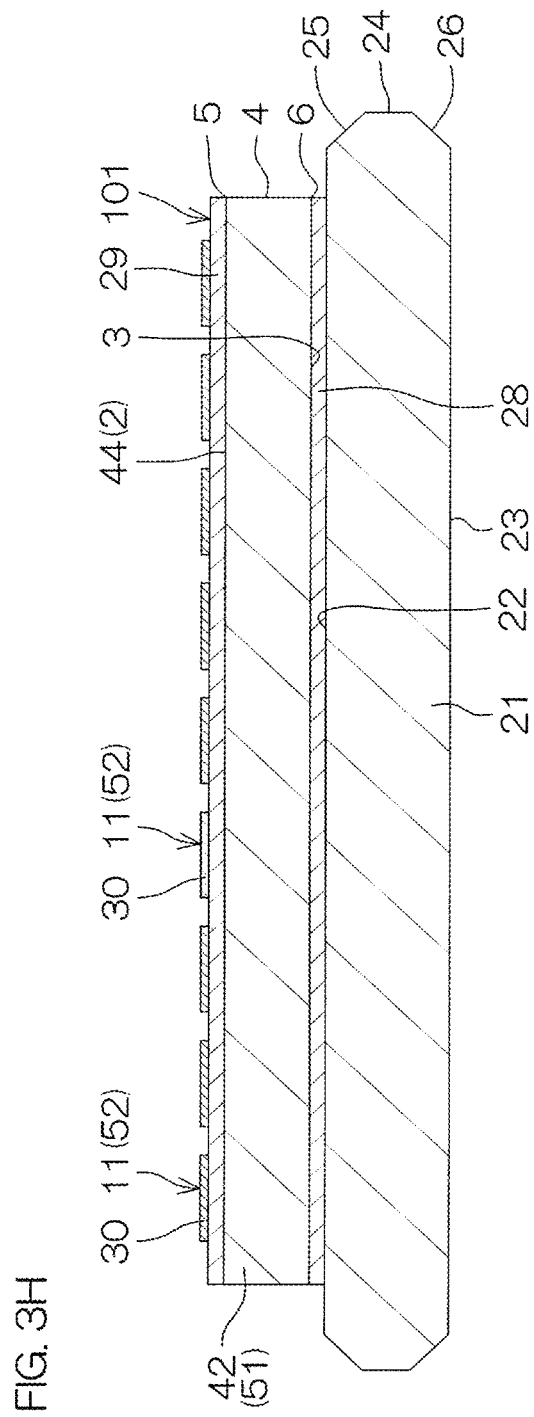

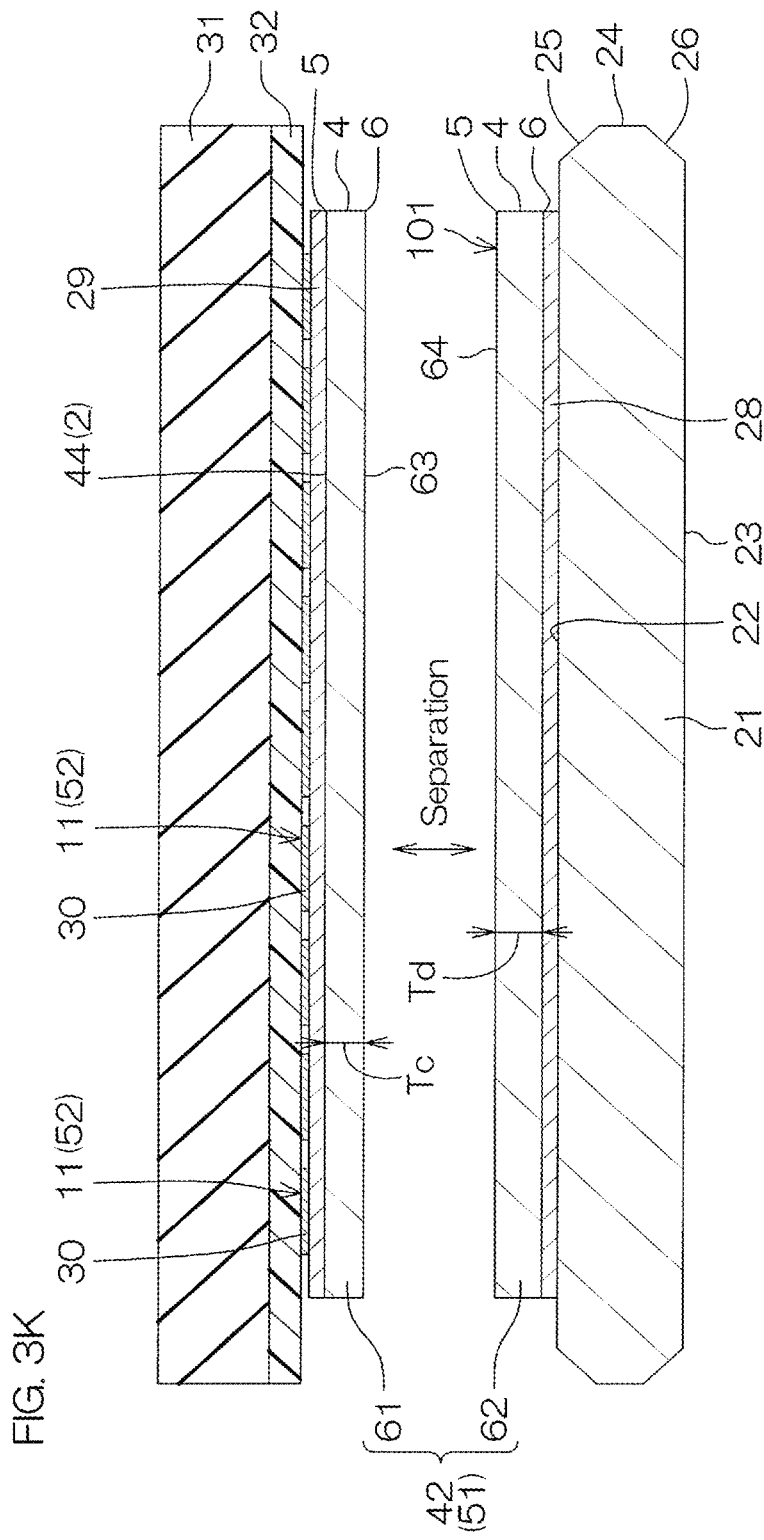

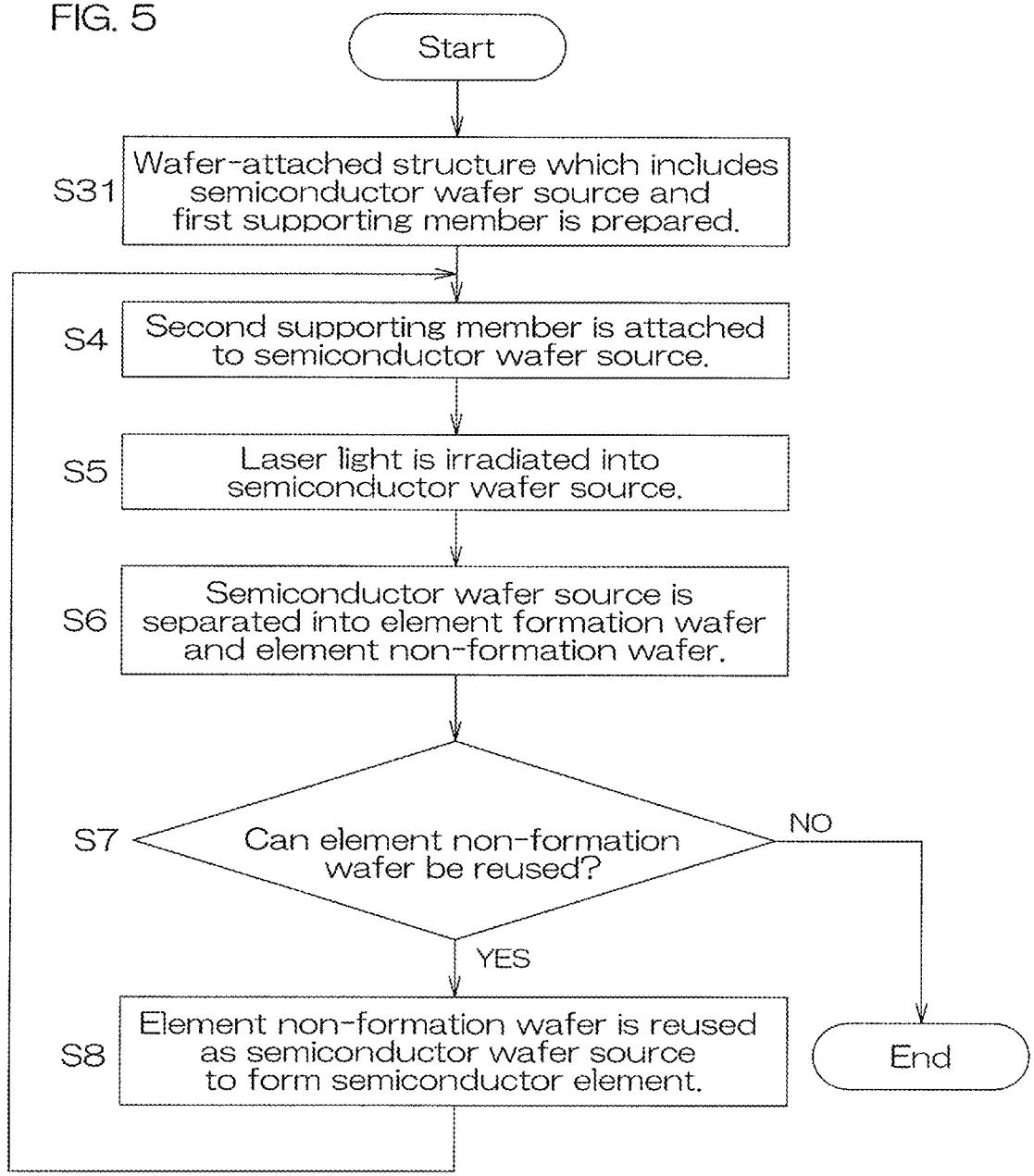

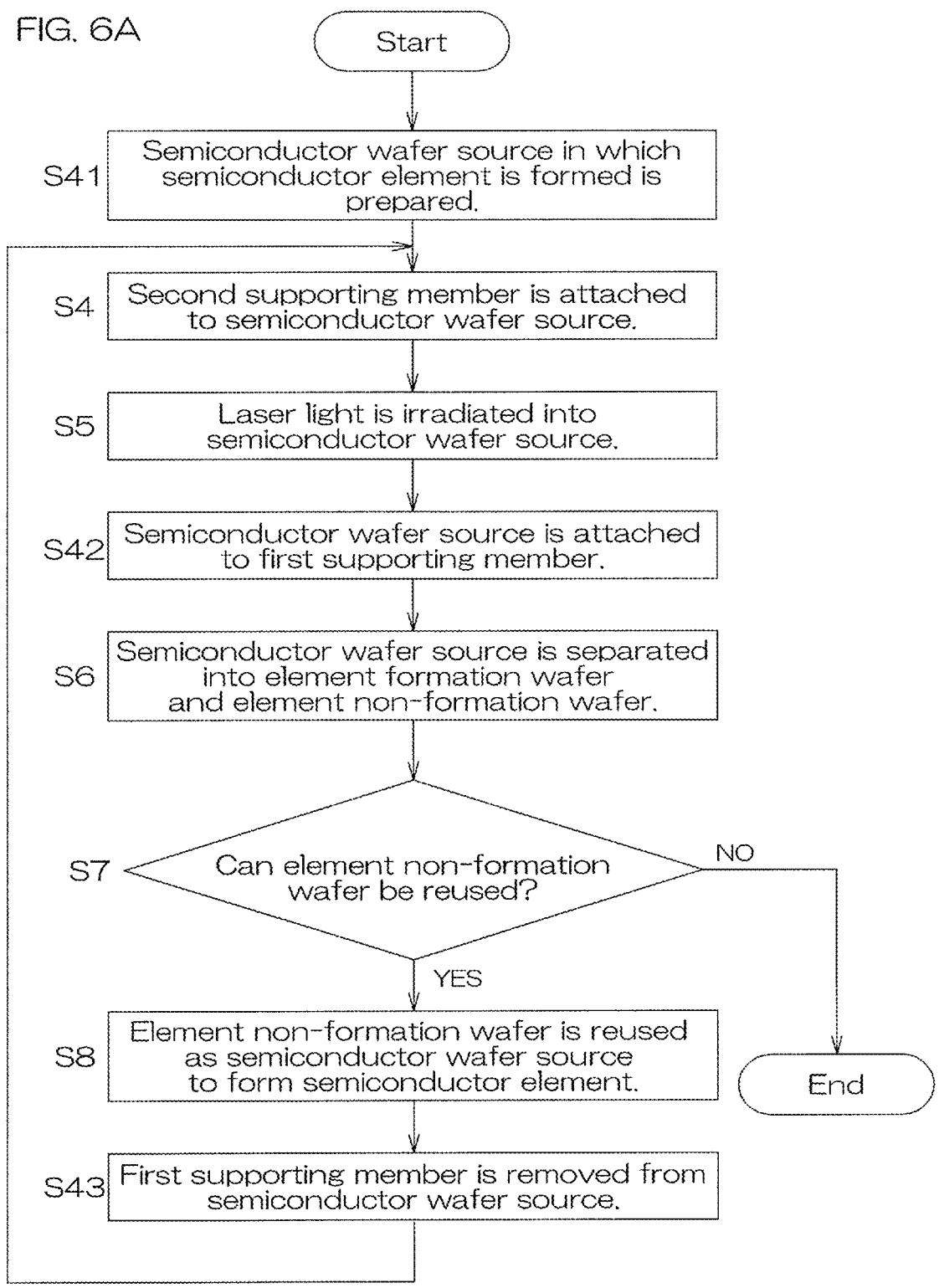

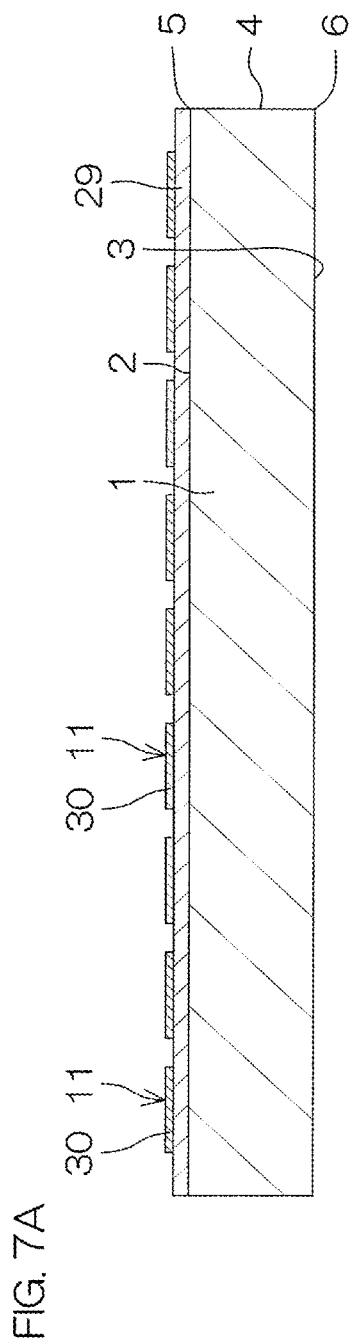

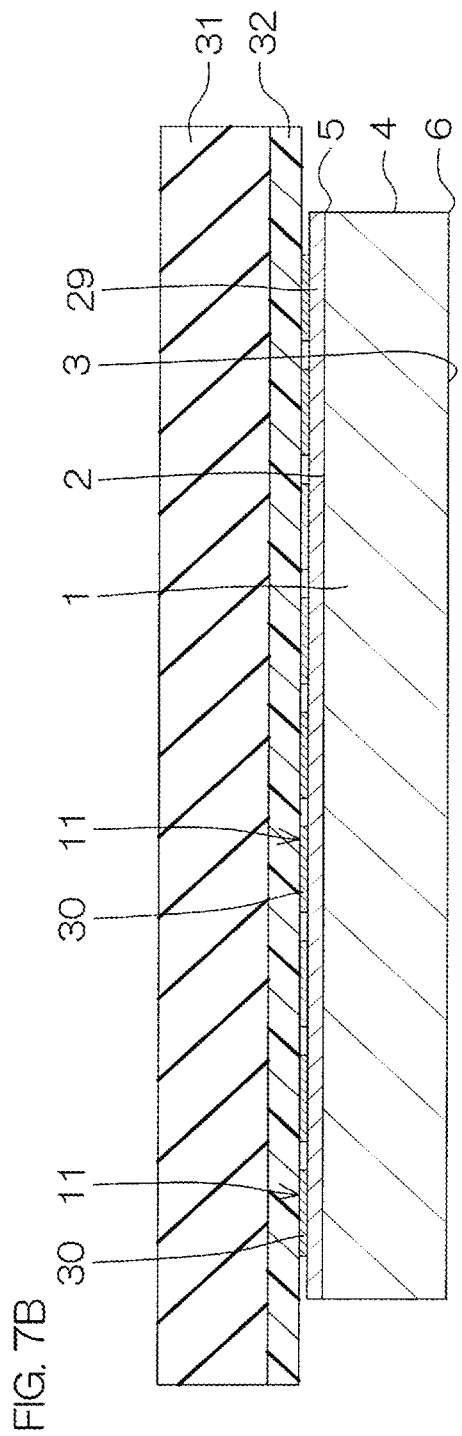

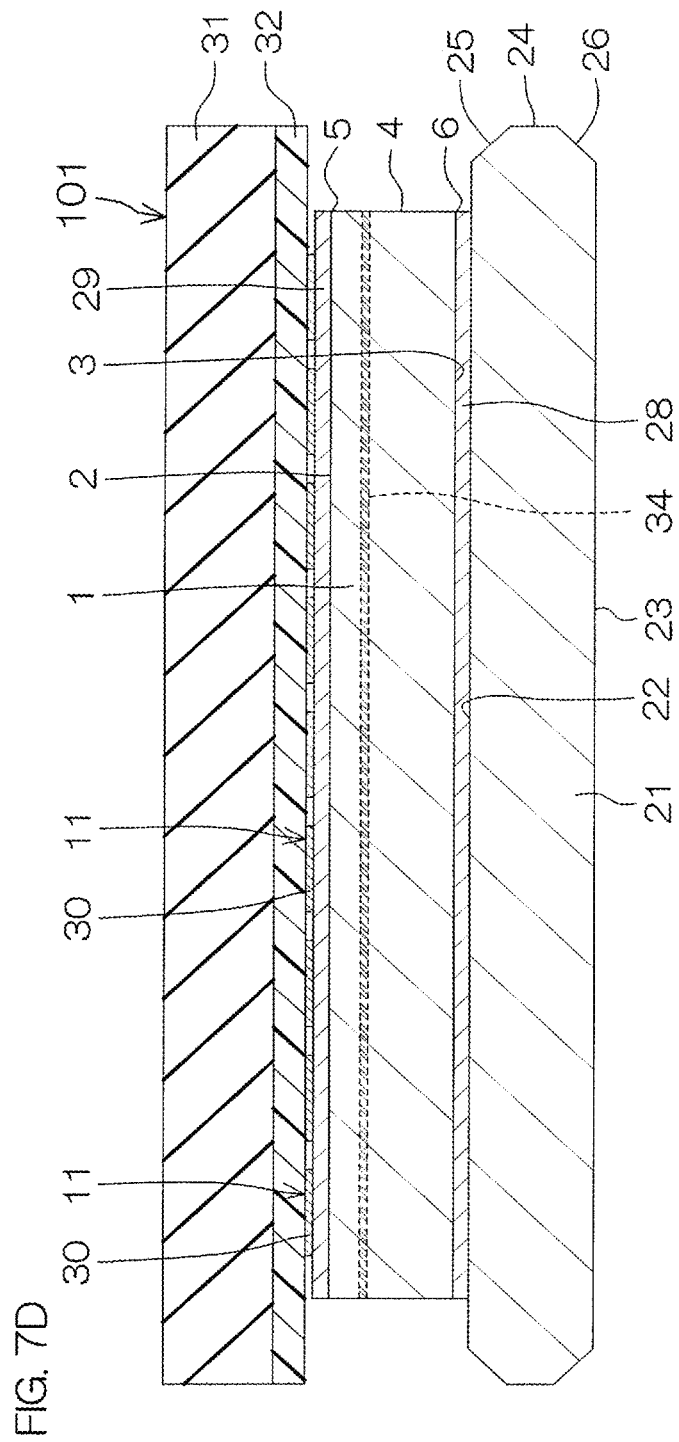

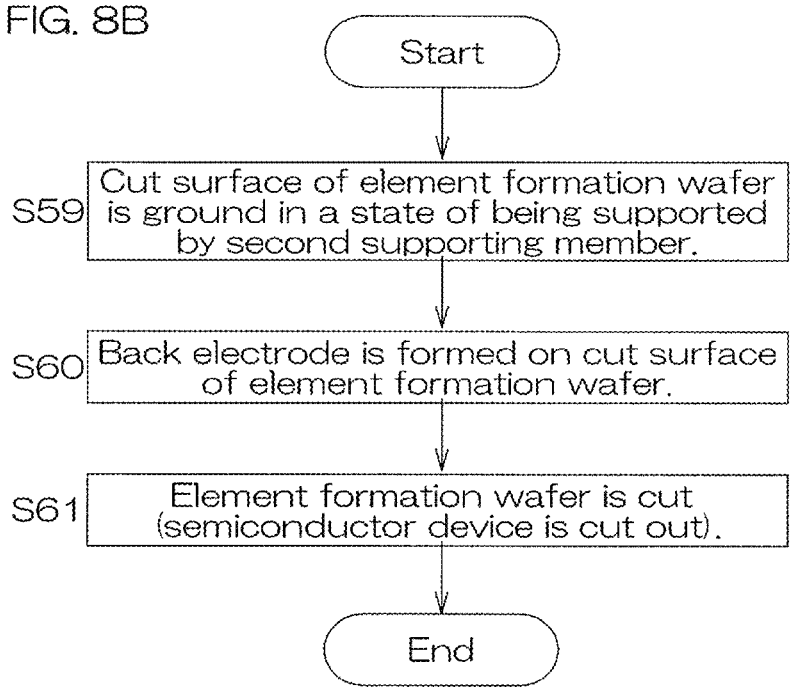

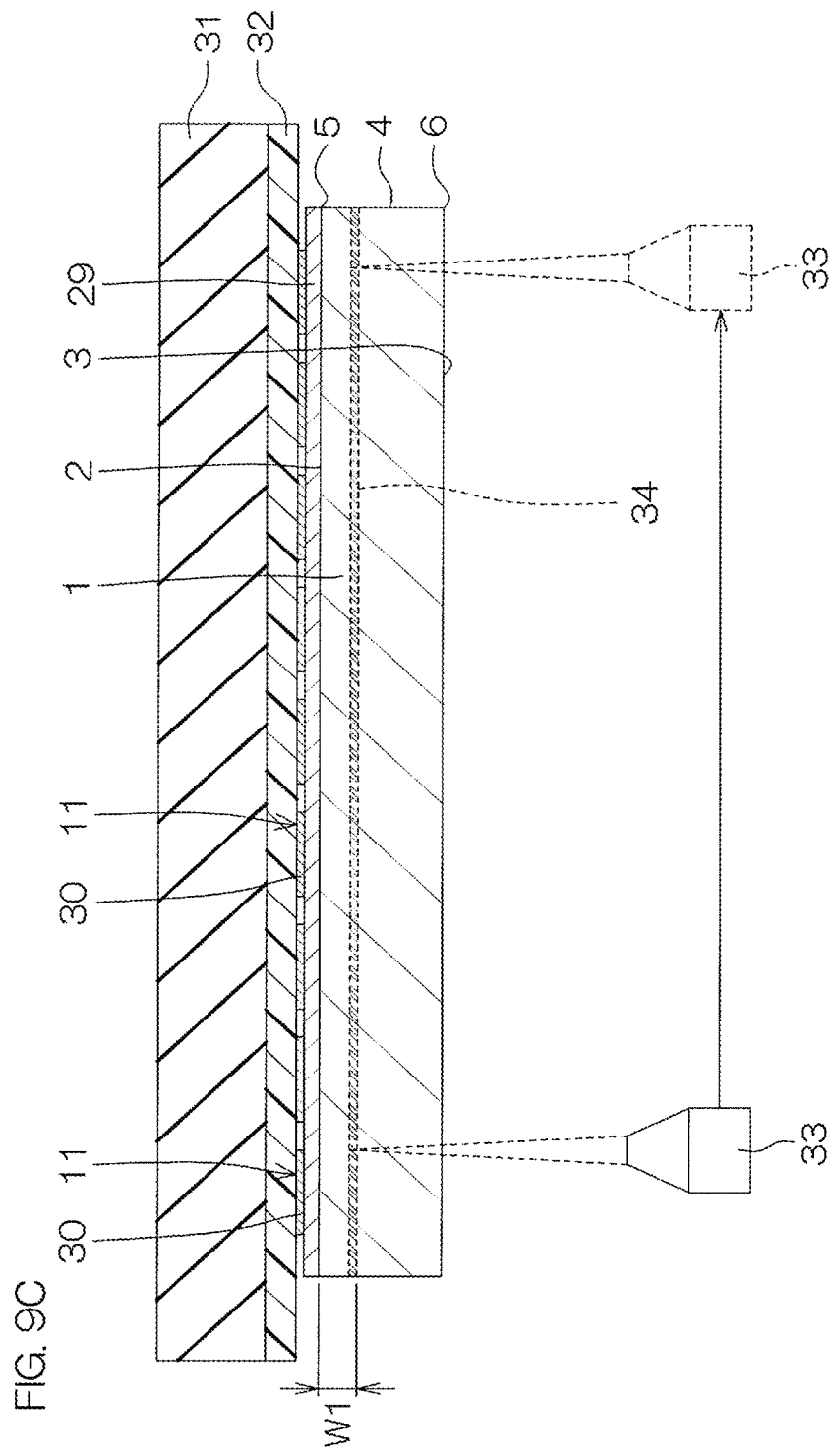

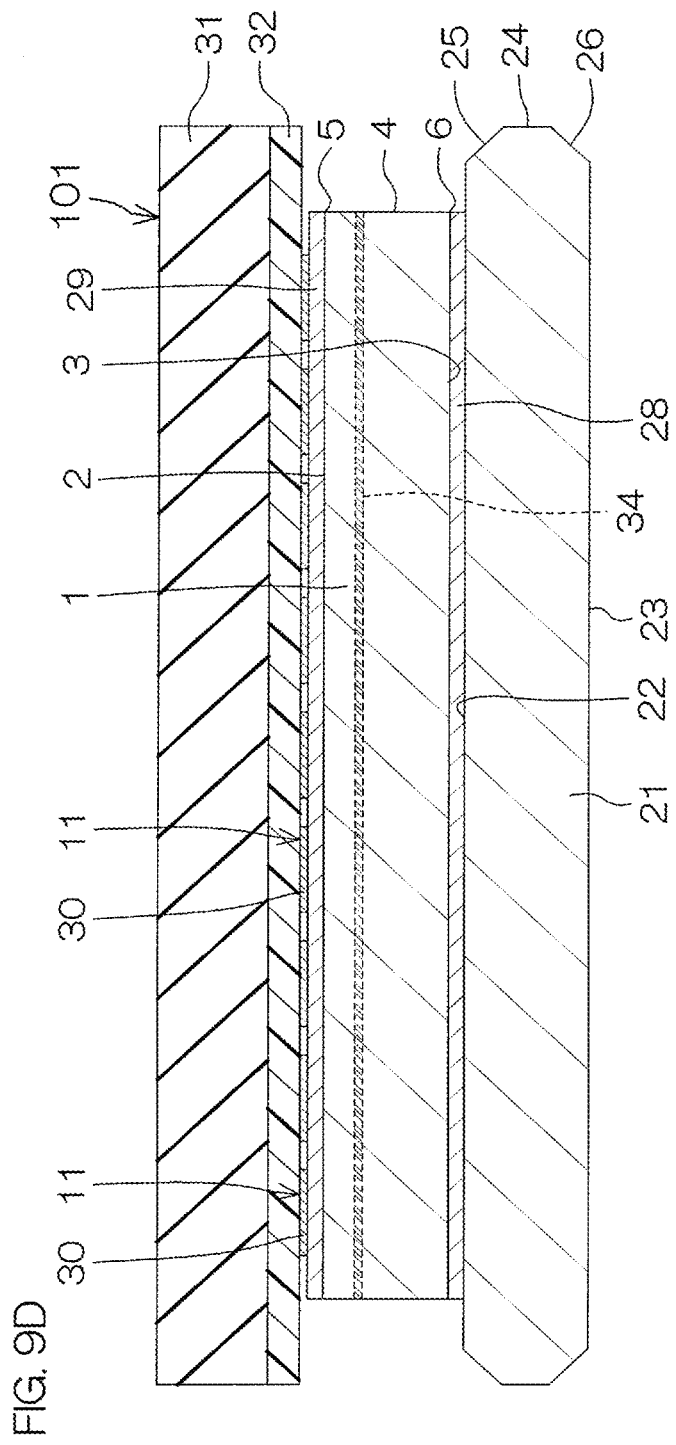

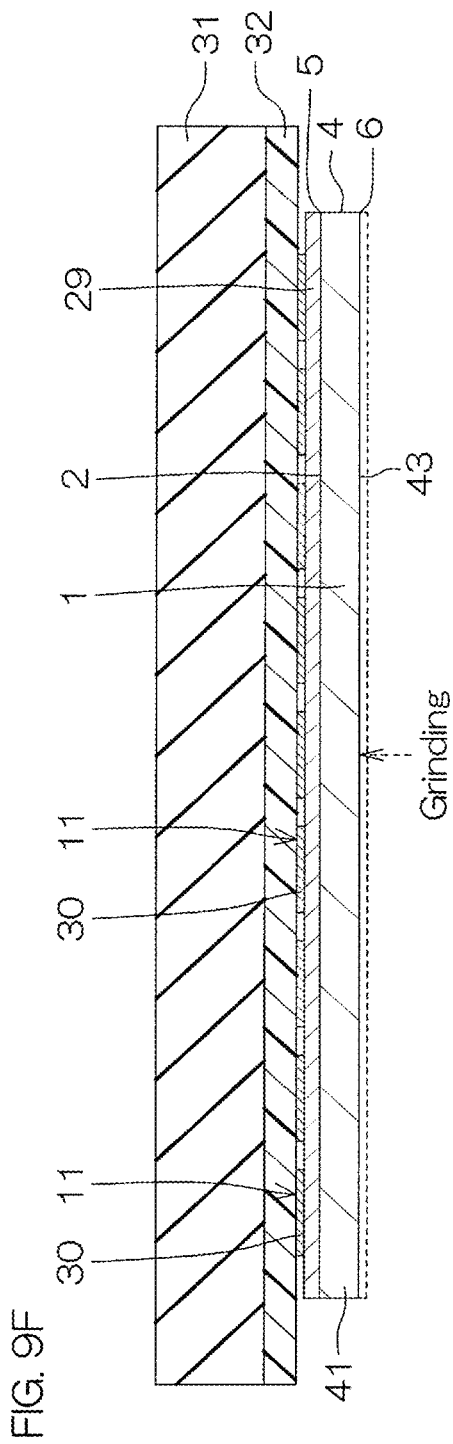

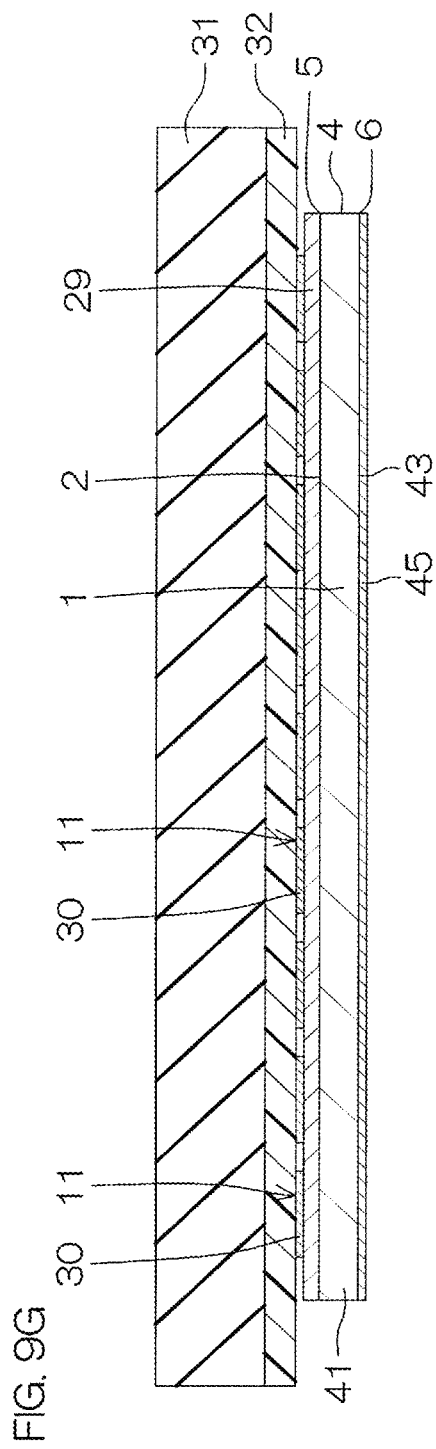

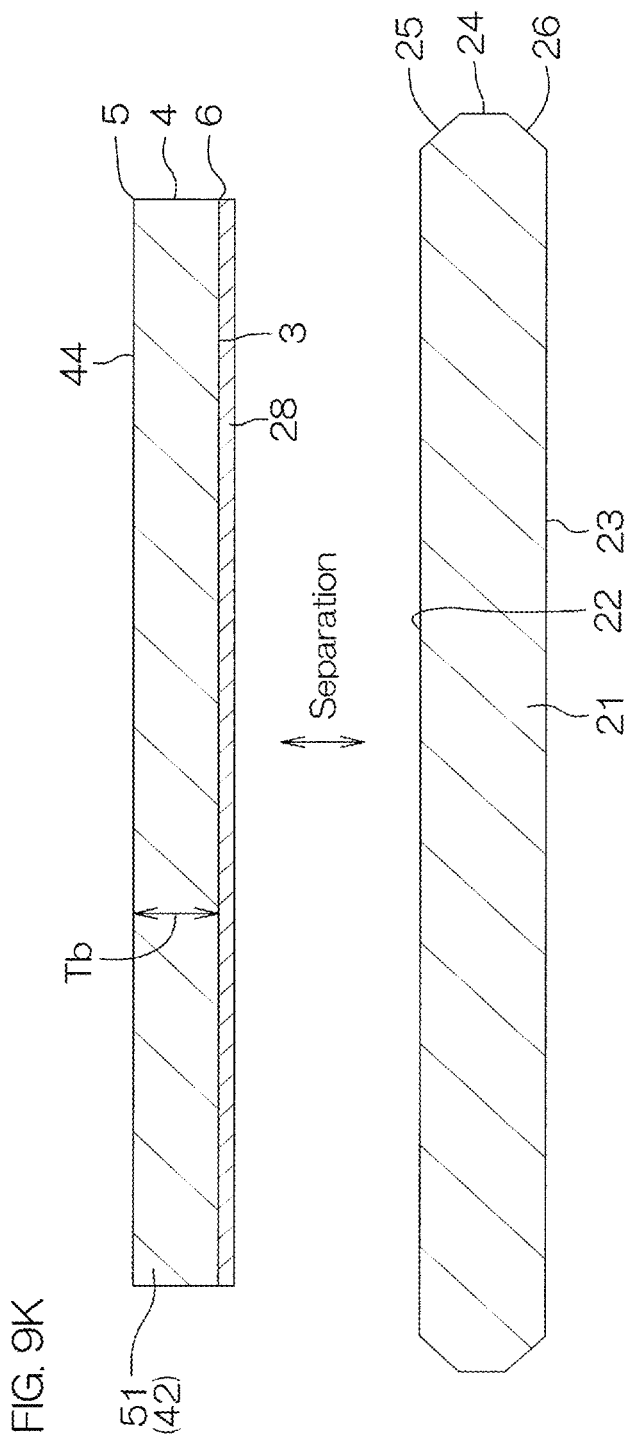

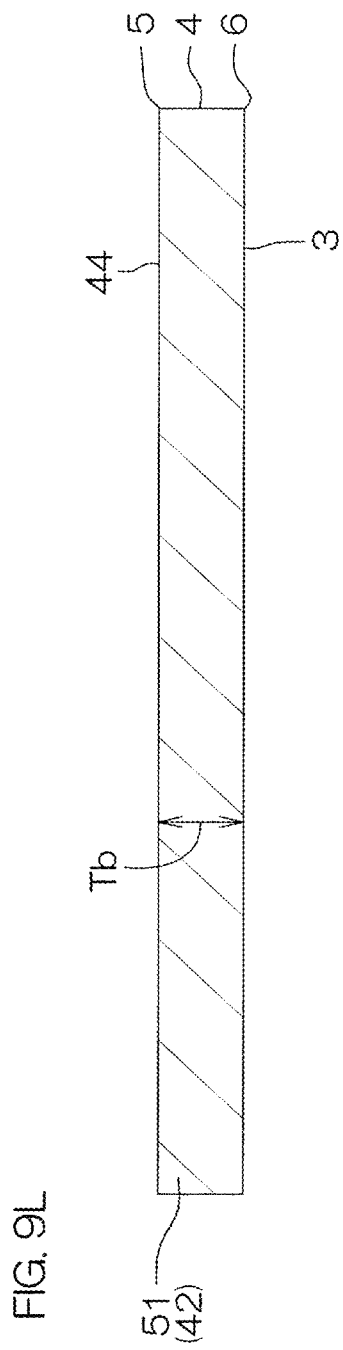

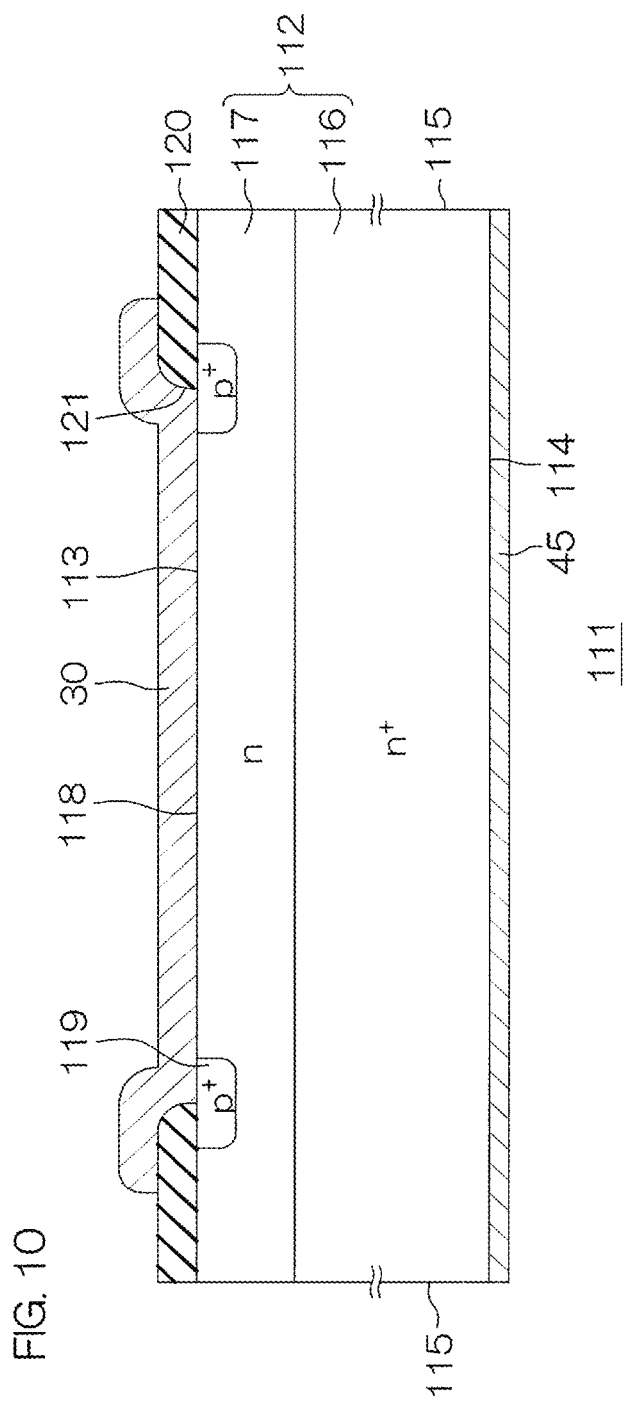

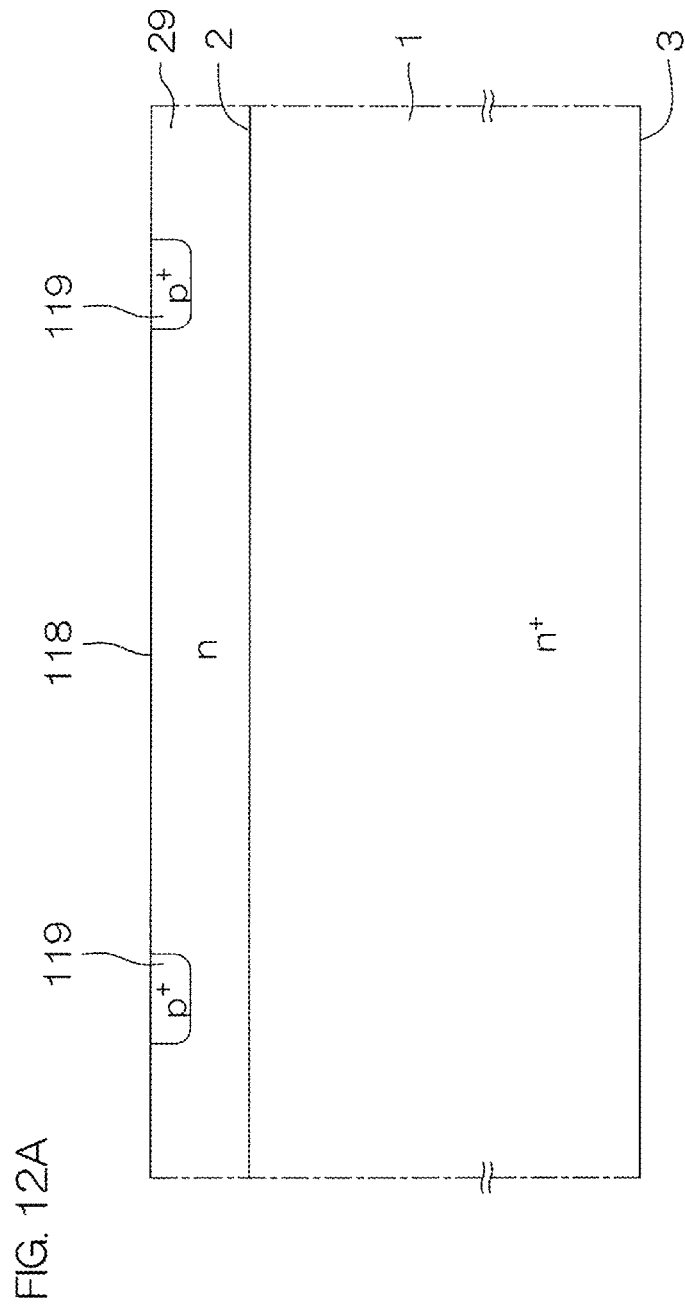

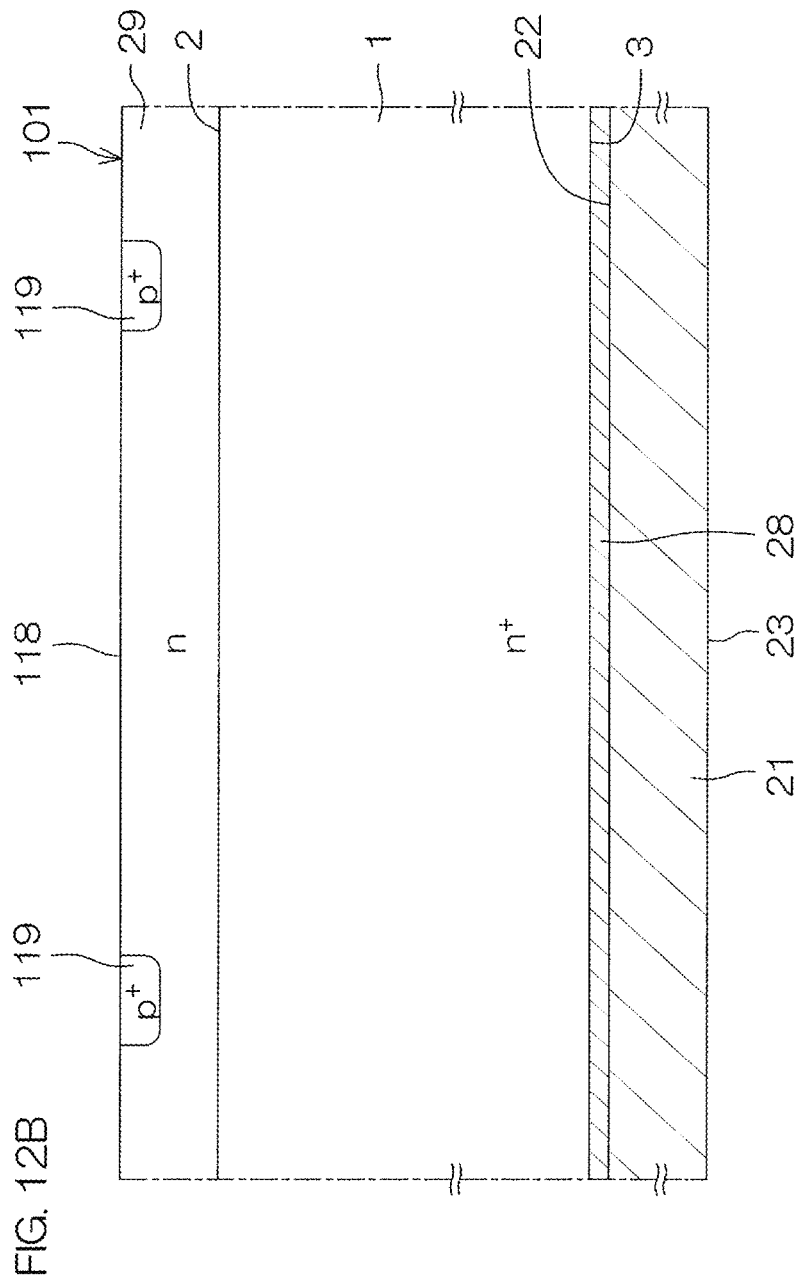

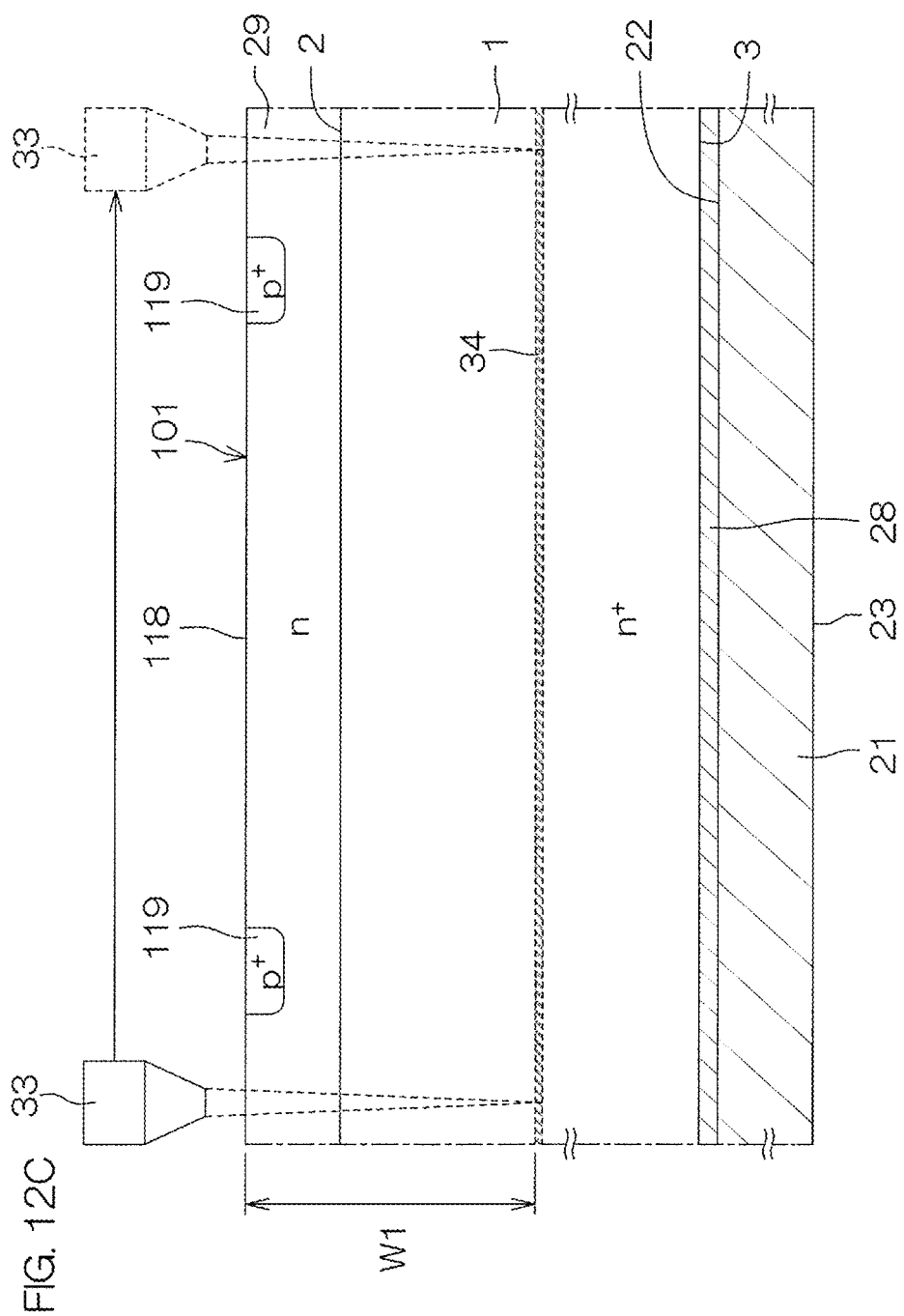

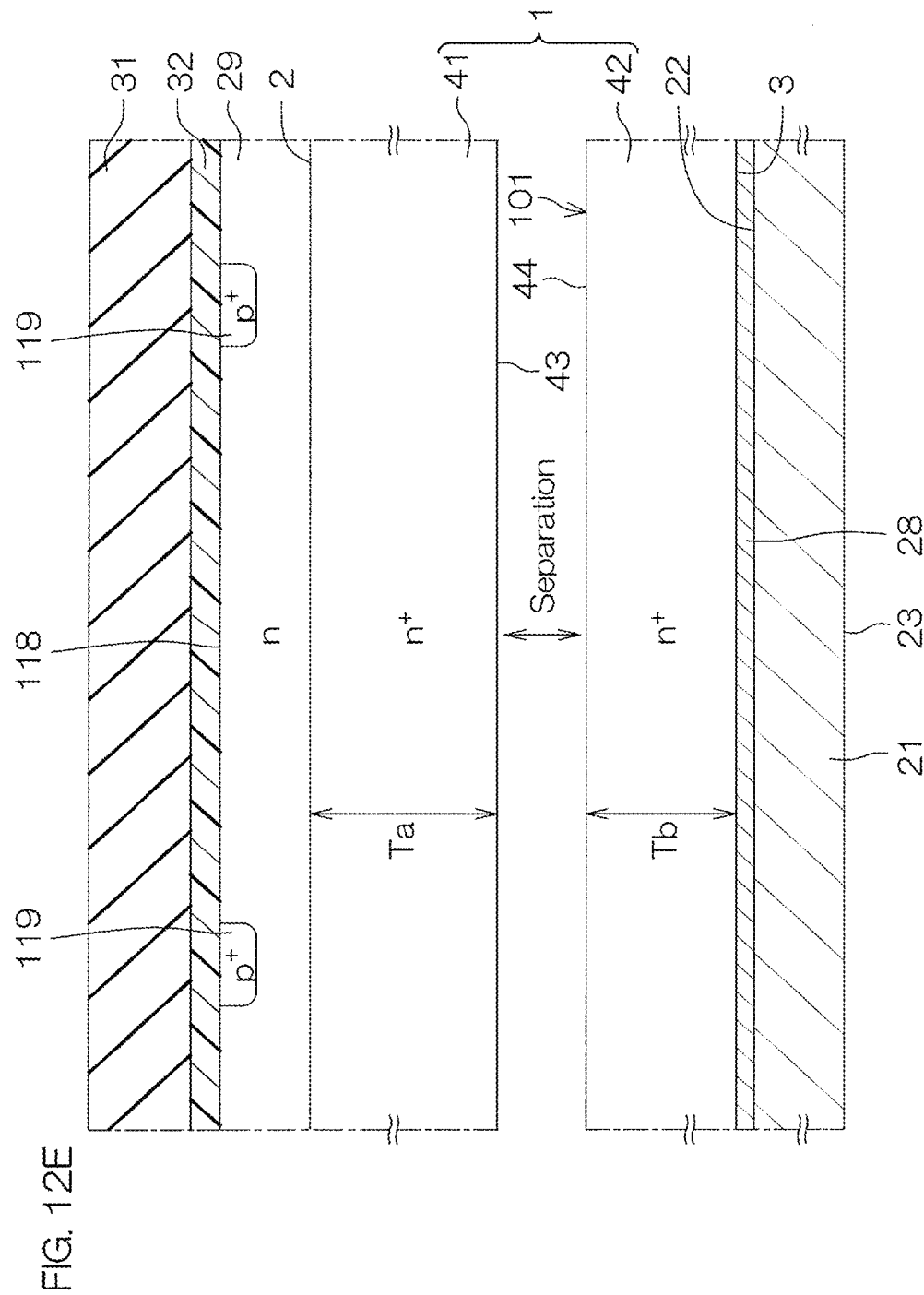

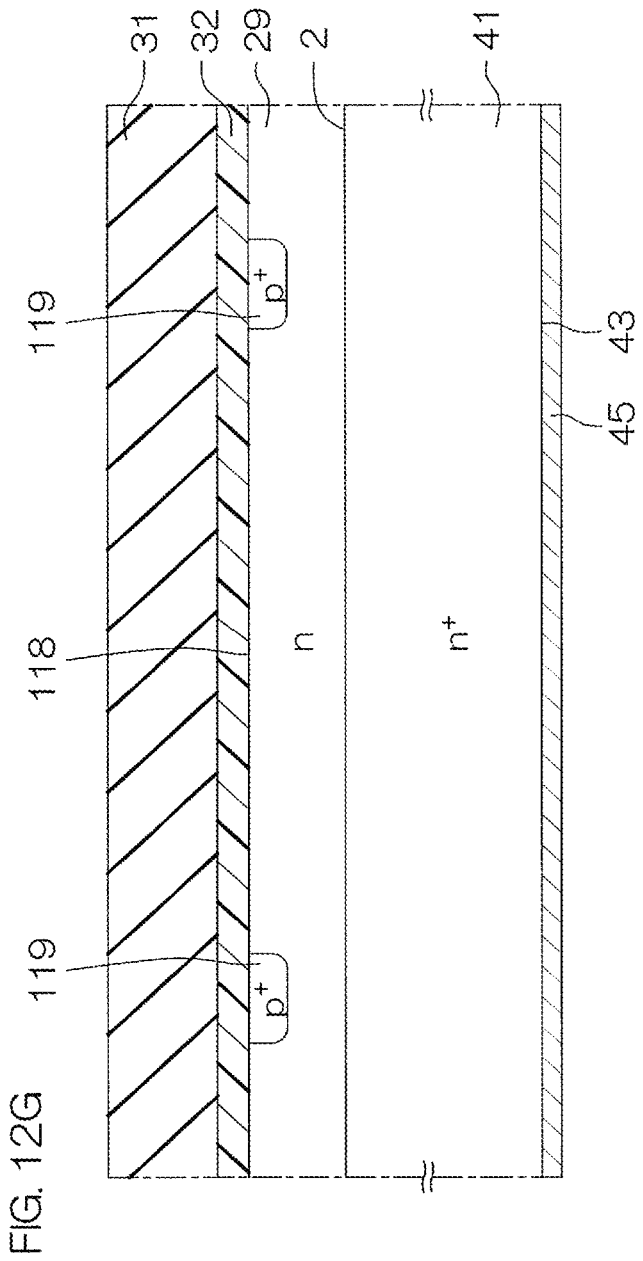

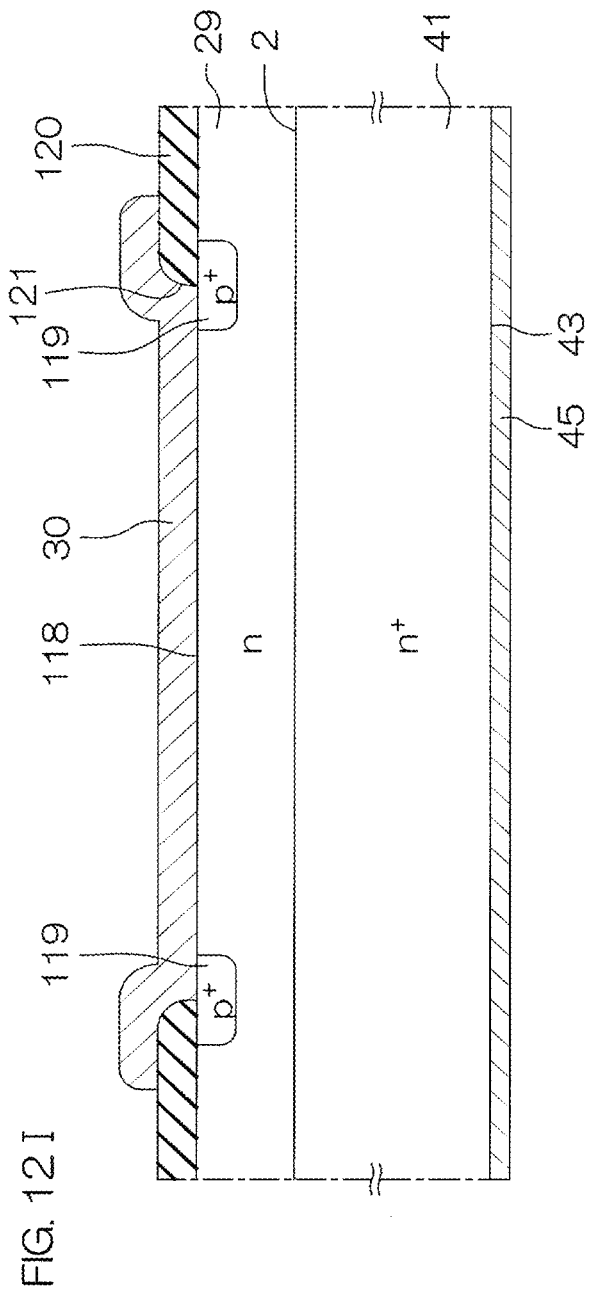

SEMICONDUCTOR DEVICE MANUFACTURING METHOD AND WAFER-ATTACHED STRUCTURE

CROSS-REFERENCE TO RELATED APPLICATIONS

This application is a continuation of U.S. application Ser. No. 17/586,486, filed Jan. 27, 2022, which is a continuation of U.S. application Ser. No. 16/624,209, filed Dec. 18, 2019 (now U.S. Pat. No. 11,264,280), which is the National Stage Application of International Patent Application No. PCT/JP2018/023373, filed Jun. 19, 2018, which claims the benefit of Japanese Patent Application No. 2017-119704, filed on Jun. 19, 2017, the contents of each application are hereby incorporated by reference herein in their entirety.

TECHNICAL FIELD

The present invention relates to a method for manufacturing a semiconductor device, and a wafer-attached structure.

BACKGROUND ART

Patent Literature 1 discloses a method for manufacturing a semiconductor device which includes a step of grinding and thinning a semiconductor wafer and a step of cutting out a plurality of semiconductor chips (semiconductor devices) from the thinned semiconductor wafer.

CITATION LIST

Patent Literature

Patent Literature 1: Japanese Patent Application Publication No. 2010-016188.

SUMMARY OF INVENTION

Technical Problem

In recent years, with the development of semiconductor device manufacturing technology, semiconductor devices have been made thinner. On the other hand, with the development of semiconductor device manufacturing technology, semiconductor wafers have been made larger in diameter. A semiconductor wafer is increased in thickness in proportion to a size of diameter from the viewpoint of suppressing deflection, etc., due to its own weight. That is, the semiconductor wafer manufacturing technology is proceeding in a direction of increasing the thickness of the semiconductor wafer, contrary to the manufacturing technology of the semiconductor device intended to reduce the thickness of the semiconductor device.

For example, in a conventional manufacturing method disclosed in Patent Literature 1, a plurality of semiconductor devices are cut out after a thick semiconductor wafer is ground and thinned. This manufacturing method is able to manufacture a semiconductor device with a desired thickness, regardless of the thickness of a semiconductor wafer.

However, in the case of the conventional manufacturing method, when a semiconductor wafer is increased in thickness, the portion of the semiconductor wafer to be removed by grinding increases. That is, according to the conventional manufacturing method, a semiconductor wafer larger in diameter and thicker in thickness results in a longer time of grinding for thinning a semiconductor device and also a relative decrease in the number of obtained semiconductor devices per unit volume, as compared with a semiconductor wafer smaller in diameter and thinner in thickness. For this reason, the semiconductor wafer cannot be consumed efficiently.

A preferred embodiment of the present invention provides a method for manufacturing a semiconductor device capable of efficiently consuming a semiconductor wafer, and a wafer-attached structure capable of the same.

Solution to Problem

A preferred embodiment of the present invention provides a method for manufacturing a semiconductor device including a step of preparing a semiconductor wafer source which includes a first main surface on one side, a second main surface on the other side and a side wall connecting the first main surface and the second main surface, an element forming step of setting a plurality of element forming regions on the first main surface of the semiconductor wafer source, and forming a semiconductor element at each of the plurality of element forming regions, and a wafer source separating step of cutting the semiconductor wafer source from a thickness direction intermediate portion along a horizontal direction parallel to the first main surface, and separating the semiconductor wafer source into an element formation wafer (element formed wafer) and an element non-formation wafer after the element forming step.

According to this method for manufacturing the semiconductor device, while a plurality of semiconductor devices can be cut out from the element formation wafer (element formed wafer), the element non-formation wafer can also be reused as a new semiconductor wafer source. Thereby, it is possible to suppress a manufacturing delay and also suppress an excessive consumption of the semiconductor wafer source. Thus, it is possible to provide the method for manufacturing the semiconductor device capable of efficiently consuming the semiconductor wafer source.

A preferred embodiment of the present invention provides a wafer-attached structure including a semiconductor wafer source having a first main surface as an element forming surface and a second main surface positioned on the opposite side of the first main surface, and having a thickness enough to be cut along a horizontal direction parallel to the first main surface from a thickness direction intermediate portion, and a supporting member having a first supporting main surface attached to the second main surface of the semiconductor wafer source and a second supporting main surface positioned on the opposite side of the first supporting main surface.

According to this wafer-attached structure, the semiconductor wafer source having a semiconductor element in the first main surface can be cut along a horizontal direction parallel to the first main surface from a thickness direction intermediate portion thereof. Thereby, it is possible to separate the semiconductor wafer source into an element formation wafer (element formed wafer) having a semiconductor element and an element non-formation wafer.

Then, while a plurality of semiconductor devices can be cut out from the element formation wafer, the element non-formation wafer supported on the supporting member can also be reused as a new semiconductor wafer source. Thereby, it is possible to suppress a manufacturing delay and also suppress an excessive consumption of the semiconductor wafer source. Thus, it is possible to provide a wafer-attached structure capable of efficiently consuming the semiconductor wafer source.

The aforementioned or other objects, features, and effects of the present invention will be clarified by the following description of preferred embodiments with reference to the accompanying drawings.

BRIEF DESCRIPTION OF DRAWINGS

FIG. 3A is a schematic cross sectional view for describing the manufacturing method shown in FIG. 2A and FIG. 2B.

FIG. 3B is a cross sectional view for describing a step subsequent to that of FIG. 3A.

FIG. 3C is a cross sectional view for describing a step subsequent to that of FIG. 3B.

FIG. 3D is a cross sectional view for describing a step subsequent to that of FIG. 3C.

FIG. 3E is a cross sectional view for describing a step subsequent to that of FIG. 3D.

FIG. 3H is a cross sectional view for describing a step subsequent to that of FIG. 3G.

FIG. 3K is a cross sectional view for describing a step subsequent to that of FIG. 3J.

FIG. 5 is a process chart for describing a method for manufacturing a semiconductor device according co a third preferred embodiment of the present invention.

FIG. 6A is a process chart for describing a method for manufacturing a semiconductor device according to a fourth preferred embodiment of the present invention.

FIG. 7A is a schematic cross sectional view for describing the manufacturing method shown in FIG. 6A and FIG. 6B.

FIG. 7B is a cross sectional view for describing a step subsequent to that of FIG. 7A.

FIG. 7D is a cross sectional view for describing a step subsequent to that of FIG. 7C.

FIG. 8B is a process chart for describing a step performed on an element formation wafer obtained from the step shown in FIG. 8A.

FIG. 9C is a cross sectional view for describing a step subsequent to that of FIG. 9B.

FIG. 9D is a cross sectional view for describing a step subsequent to that of FIG. 9C.

FIG. 9F is a cross sectional view for describing a step subsequent to that of FIG. 9E.

FIG. 9G is a cross sectional view for describing a step subsequent to that of FIG. 9F.

FIG. 9K is a cross sectional view for describing a step subsequent to that of FIG. 9J.

FIG. 9L is a cross sectional view for describing a step subsequent to that of FIG. 9K.

FIG. 10 is a cross sectional view of showing a semiconductor device according to one example of the present invention.

FIG. 12A is a schematic cross sectional view for describing the manufacturing method shown in FIG. 11A and FIG. 11B by applying the manufacturing method shown in FIG. 11A and FIG. 11B to the method for manufacturing the semiconductor device shown in FIG. 10.

FIG. 12B is a cross sectional view for describing a step subsequent to that of FIG. 12A.

FIG. 12C is a cross sectional view for describing a step subsequent to that of FIG. 12B.

FIG. 12E is a cross sectional view for describing a step subsequent to that of FIG. 12D.

FIG. 12G is a cross sectional view for describing a step subsequent to that of FIG. 12F.

FIG. 12I is a cross sectional view for describing a step subsequent to that of FIG. 12H.

DESCRIPTION OF EMBODIMENTS

Figure 1A:
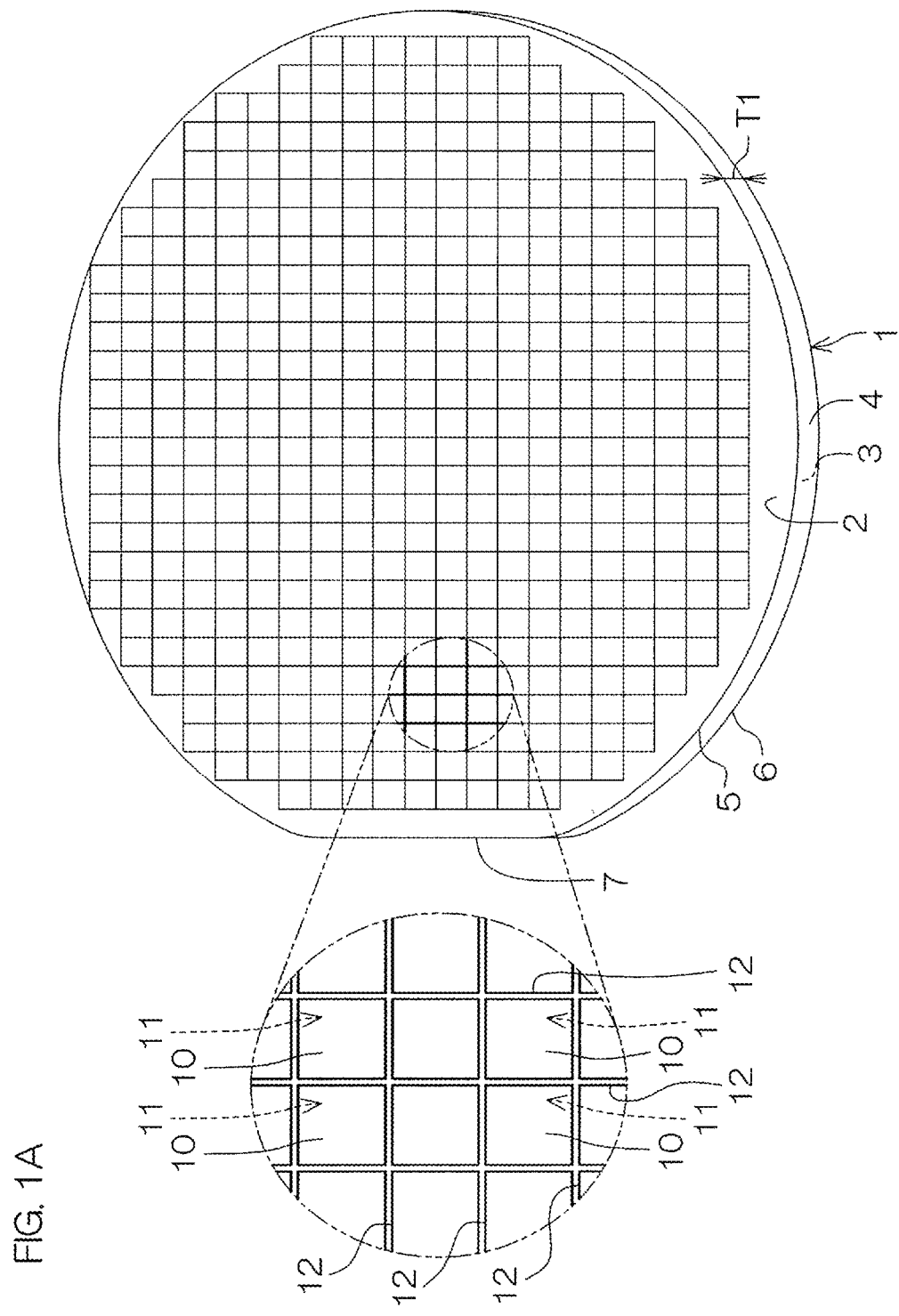
FIG. 1A is a perspective view for describing one example of a semiconductor wafer source which is applicable to a method for manufacturing a semiconductor device according to a first preferred embodiment of the present invention.

FIG. 1A is a perspective view for describing one example of a semiconductor wafer source 1 which is applicable to the method for manufacturing the semiconductor device according to the first preferred embodiment of the present invention.

With reference to FIG. 1A, a disc-shaped semiconductor wafer source 1 may be applied to the manufacture of a semiconductor device. In this mode, the semiconductor wafer source 1 includes SiC (silicon carbide). More specifically, the semiconductor wafer source 1 is made of an SiC monocrystal semiconductor wafer.

The semiconductor wafer source 1 has a first main surface 2 on one side, a second main surface 3 on the other side, and a side wall 4 connecting the first main surface 2 and the second main surface 3. The first main surface 2 of the semiconductor wafer source 1 is an element forming surface in which a semiconductor element is formed.

The semiconductor wafer source 1 has a thickness T1 allowing of being cut along a horizontal direction parallel to the first main surface 2 from a thickness direction intermediate portion thereof. The thickness T1 of the semiconductor wafer source 1 exceeds the thickness of a semiconductor substrate of a semiconductor device (semiconductor chip) which is to be obtained. The thickness T1 of the semiconductor wafer source 1 may be not less than 100 μm and not more than 1000 μm. The thickness T1 of the semiconductor wafer source 1 may be not less than 250 μm and not more than 500 μm.

The semiconductor wafer source 1 includes a first wafer edge portion 5 and a second wafer edge portion 6. The first wafer edge portion 5 connects the first main surface 2 and the side wall 4. More specifically, the first wafer edge portion 5 connects the first main surface 2 and the side wall 4 at a right angle. That is, the first wafer edge portion 5 is not chamfered.

The second wafer edge portion 6 connects the second main surface 3 and the side wall 4. More specifically, the second wafer edge portion 6 connects the second main surface 3 and the side wall 4 at a right angle. That is, the second wafer edge portion 6 is not chamfered. In the semiconductor wafer source 1, it is preferable that at least the second wafer edge portion 6 is not chamfered.

A first orientation flat 7 (first mark) which indicates a crystal orientation, etc., is formed in the semiconductor wafer source 1. The first orientation flat 7 includes a notched portion formed at a peripheral edge of the semiconductor wafer source 1. The first orientation flat 7 extends linearly at a peripheral edge of the semiconductor wafer source 1.

A plurality of element forming regions 10 (chip forming regions) are set in the first main surface 2 of the semiconductor wafer source 1. A semiconductor element 11 is formed in each of the plurality of element forming regions 10. The plurality of element forming region 10 may be set in a matrix form at a mutually spaced interval from each other. Each of the element forming regions 10 may be set in a rectangular shape in a plan view as viewed from a normal direction of the first main surface 2.

The semiconductor element 11 may include various functional elements formed by using a semiconductor material, properties of semiconductor materials, or the like. The semiconductor element 11 may include at least any one of a semiconductor rectifier element, a semiconductor switching element and a semiconductor passive element.

The semiconductor rectifier element may include various types of diode elements such as a pn junction diode, a Zener diode, a Schottky barrier diode and a fast recovery diode. The semiconductor switching element may include various types of transistors such as a bipolar transistor, a MISFET (Metal Insulator Semiconductor Field Effect Transistor), and an IGBT (Insulated Gate Bipolar Transistor). The semiconductor passive element may include various types of passive elements such as a capacitor, a resistor and an inductor.

The semiconductor element 11 may include a circuit network in which any two or more of a semiconductor rectifier element, a semiconductor switching element and a semiconductor passive element are selectively combined. The circuit network may form a part of or an entirety of an integrated circuit.

The integrated circuit may include an SSI (Small Scale Integration), an LSI (Large Scale Integration), an MSI (Medium Scale Integration), a VLSI (Very Large Scale Integration) and a ULSI (Ultra-Very Large Scale Integration).

A dicing line 12 is defined at a boundary region between the plurality of element forming regions 10. The semiconductor wafer source 1 is cut along the dicing line 12, so that a plurality of semiconductor devices are cut out.

Figure 1B:
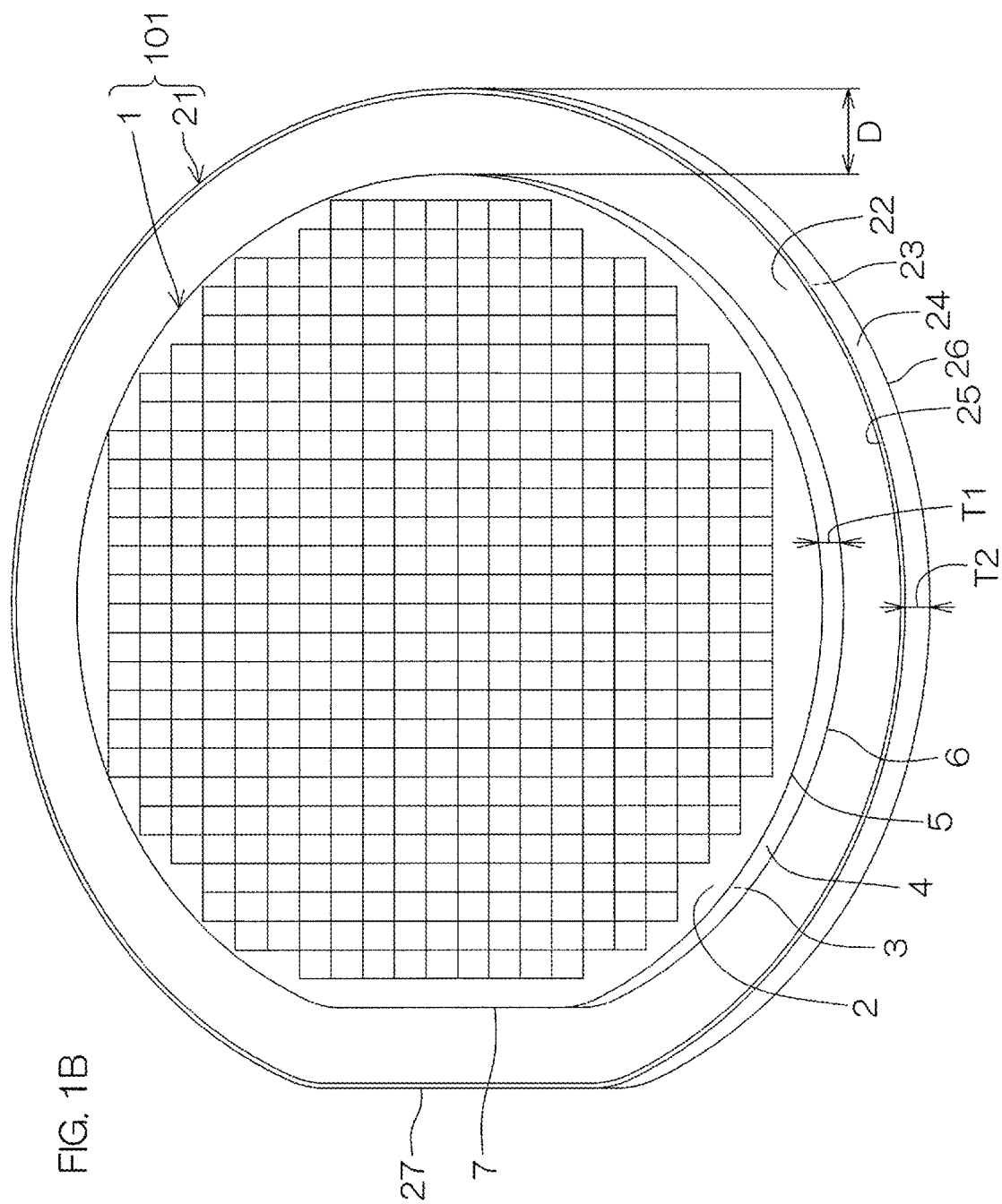
FIG. 1B is a perspective view for describing one example of a wafer-attached structure which is applicable to the method for manufacturing the semiconductor device according to the first preferred embodiment of the present invention.

FIG. 1B is a perspective view for describing one example of a wafer-attached structure 101 which is applicable to the method for manufacturing the semiconductor device according to the first preferred embodiment of the present invention.

With reference to FIG. 1B, a disc-shaped wafer-attached structure 101 may be applied to the manufacture of the semiconductor device. The wafer-attached structure 101 has a laminated structure which includes a semiconductor wafer source 1 and a first supporting member 21. The semiconductor wafer source 1 is attached to the first supporting member 21.

According to the wafer-attached structure 101, the semiconductor wafer source 1 and the first supporting member 21 are handled in an integrated manner. Thereby, the convenience in handling the semiconductor wafer source 1 is enhanced. In this description, term "handling" includes not only carrying in/carrying out of an apparatus for manufacturing semiconductor devices but also the distribution thereof to market. That is, the wafer-attached structure 101 can be a transaction object in a market.

The first supporting member 21 is made of a disc-shaped substrate (wafer) and supports the semiconductor wafer source 1 from the second main surface 3 side. The first supporting member 21 has a first supporting main surface 22 on one side, a second supporting main surface 23 on the other side and a supporting side wall 24 connecting the first supporting main surface 22 and the second supporting main surface 23.

The first supporting member 21 includes a first supporting edge portion 25 and a second supporting edge portion 26. The first supporting edge portion 25 connects the first supporting main surface 22 and the supporting side wall 24. The first supporting edge portion 25 includes a chamfered portion which is chamfered. The first supporting edge portion 25 may be C-chamfered. The first supporting edge portion 25 may be R-chamfered. In this case, the first supporting edge portion 25 may include a chamfered portion which is chamfered in a convexly curved shape or a shape close to a convexly curved shape.

The first supporting edge portion 25 may be chamfered at least by any one of a wire saw processing method, a dicing blade processing method and an etching processing method. The handling convenience of the wafer-attached structure 101 is increased by chamfering of the first supporting edge portion 25.

The second supporting edge portion 26 connects the second supporting main surface 23 and the supporting side wall 24. The second supporting edge portion 26 includes a chamfered portion which has been chamfered. The second supporting edge portion 26 may be C-chamfered. The second supporting edge portion 26 may be R-chamfered. In this case, the second supporting edge portion 26 may include a chamfered portion which is chamfered in a convexly curved shape or in a shape close to a convexly curved shape.

The second supporting edge portion 26 may be chamfered at least by any one of a wire saw processing method, a dicing blade processing method and an etching processing method. The handling convenience of the wafer-attached structure 101 is increased by chamfering of the second supporting edge portion 26.

The first supporting member 21 supports the semiconductor wafer source 1 from the second main surface 3 side. That is, the semiconductor wafer source 1 is arranged on the first supporting main surface 22 of the first supporting member 21 in a posture in which the second main surface 3 faces the first supporting main surface 22 of the first supporting member 21. The first supporting main surface 22 of the first supporting member 21 is attached to the second main surface 3 of the semiconductor wafer source 1.

In this mode, the first supporting member 21 is formed such as to be larger in planar area than the semiconductor wafer source 1. The wafer-attached structure 101 can be handled more conveniently. In a state in which the semiconductor wafer source 1 is supported at the central portion of the first supporting member 21, a distance D between a peripheral edge of the semiconductor wafer source 1 and a peripheral edge of the first supporting member 21 may be not less than 0 mm and not more than 10 mm.

Various types of materials can be used as a material of the first supporting member 21 as long as they are able to fix and support the semiconductor wafer source 1. In view of supporting the semiconductor wafer source 1, it is preferable that the first supporting member 21 has physical properties relatively close to those of the semiconductor wafer source 1. The physical properties include, for example, a thermal expansion coefficient and a melting point.

A ratio of thermal expansion coefficient of the first supporting member 21 in relation to the thermal expansion coefficient of the semiconductor wafer source 1 may be not less than 0.5 and not more than 1.5. It is preferable that the thermal expansion coefficient ratio is not less than 0.8 and not more than 1.2. A melting point of the first supporting member 21 may be not less than a melting point of the semiconductor wafer source 1. The melting point of the first supporting member 21 may be not less than 1600° C.

It is preferable that the first supporting member 21 includes a material that is the same type as the semiconductor wafer source 1. That is, the first supporting member 21 preferably includes SiC (silicon carbide). It is more preferable that the first supporting member 21 is made of an SiC monocrystal semiconductor wafer. Thereby, physical properties of the first supporting member 21 are approximately equal to those of the semiconductor wafer source 1.

A thickness T2 of the first supporting member 21 may be not less than 100 μm and not more than 1000 μm. The thickness T2 of the first supporting member 21 may be not less than 250 μm and not more than 500 μm. The thickness T2 of the first supporting member 21 may be equal to the thickness T1 of the semiconductor wafer source 1.

In the method for manufacturing the semiconductor device, laser light may be irradiated onto the semiconductor wafer source 1 via the first supporting member 21. In this case, it is preferable that the first supporting member 21 is optically transparent. The first supporting member 21 is preferably a light permeable wafer which suppresses attenuation of laser light irradiated into the semiconductor wafer source 1. The light permeable wafer may include a translucent wafer and a transparent wafer.

The first supporting member 21 is preferably a monocrystal semiconductor wafer (SiC monocrystal semiconductor wafer) with which no impurities are doped or which is low in concentrations of impurities. In this case, absorption (attenuation) of laser light by the first supporting member 21 is suppressed.

In a case in which the first supporting member 21 includes impurities, the first supporting member 21 is preferably not more than $1.0 \times 10^{18}$ cm$^{-3}$ in concentrations of impurities. It should be noted that laser light having a wavelength of not more than 390 μm has a tendency of being absorbed (attenuated) by the first supporting member 21 made of an SiC monocrystal semiconductor wafer, regardless of whether impurities are doped.

The first supporting member 21 may be a monocrystal semiconductor wafer (SiC monocrystal semiconductor wafer) with which vanadium is doped. The first supporting member 21 may be a monocrystal semiconductor wafer (SiC monocrystal semiconductor wafer) with which p type impurities are doped. The first supporting member 21 may be a monocrystal semiconductor wafer (SiC monocrystal semiconductor wafer) with which n type impurities are doped.

The first supporting member 21 may be a monocrystal semiconductor wafer (SiC monocrystal semiconductor wafer) with which p type impurities and n type impurities are doped. The p type impurities and the n type impurities may be similar in concentrations. In other modes, the first supporting member 21 made of various types of materials can be adopted on the basis of physical properties of the semiconductor wafer source 1 and a wavelength of laser light.

A second orientation flat 27 (second mark) which indicates a crystal orientation, etc., is formed in the first supporting member 21. The second orientation flat 27 includes a notched portion which is formed at a peripheral edge of the first supporting member 21. The second orientation flat 27 extends linearly at a peripheral edge of the first supporting member 21.

The second orientation flat 27 of the first supporting member 21 may indicate a crystal orientation equal to that of the first orientation flat 7 of the semiconductor wafer source 1. Thereby, it is possible to attach the semiconductor wafer source 1 to the first supporting member 21, with the crystal orientation understood.

The second orientation flat 27 of the first supporting member 21 may be positionally aligned with the first orientation flat 7 of the semiconductor wafer source 1. That is, the second orientation flat 27 may extend in parallel along the first orientation flat 7 at a position proximate to the first orientation flat 7.

Thereby, the crystal orientation of the semiconductor wafer source 1 is in agreement with that of the first supporting member 21, thus making it possible to easily judge the crystal orientation of the semiconductor wafer source 1. Thereby, it is possible to increase the handling convenience of the wafer-attached structure 101.

Figure 2A:
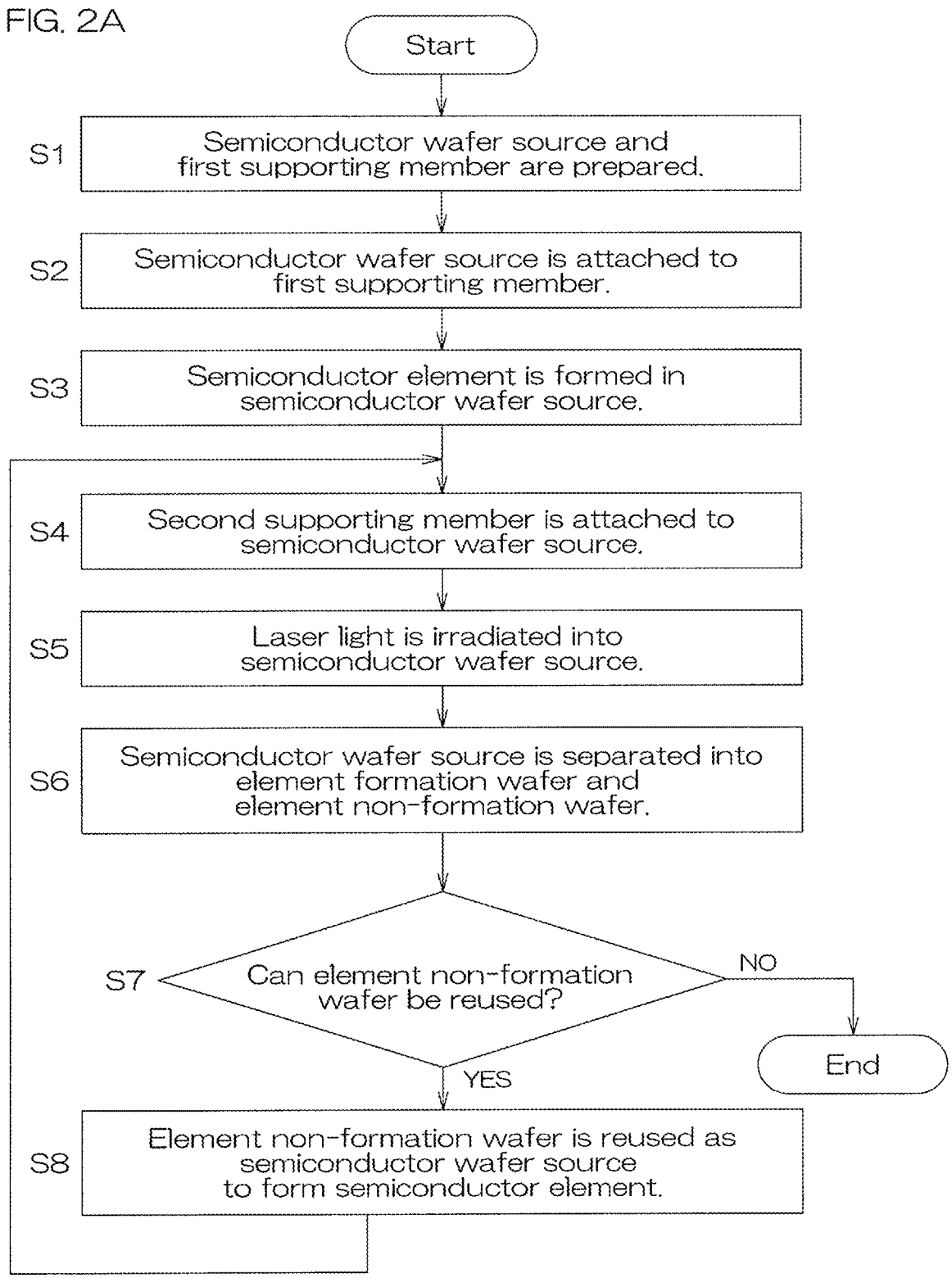
FIG. 2A is a process chart for describing the method for manufacturing the semiconductor device according to the first preferred embodiment of the present invention.
Figure 2B:
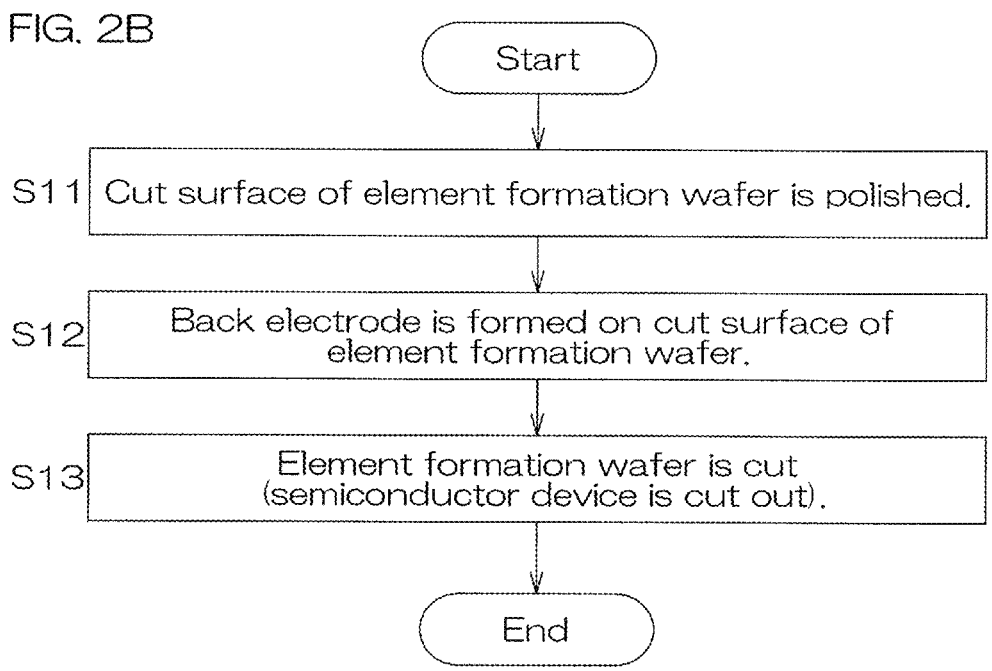
FIG. 2B is a process chart for describing a step performed on an element formation wafer obtained from a step shown in FIG. 2A.

FIG. 2A is a process chart for describing the method for manufacturing the semiconductor device according to the first preferred embodiment of the present invention. FIG. 2B is a process chart for describing a step performed on an element formation wafer 41 (new semiconductor wafer source 51, element formed wafer) obtained from the step shown in FIG. 2A.

FIG. 3A to FIG. 3K are each a schematic cross sectional view for describing the manufacturing method shown in FIG. 2A and FIG. 2B. In FIG. 3A to FIG. 3K, for the sake of convenience of description, a structure of the semiconductor wafer source 1 and that of the first supporting member 21 are shown in a simplified manner.

First, with reference to FIG. 3A, the semiconductor wafer source 1 is prepared (Step S1 of FIG. 2A). The first supporting member 21 is also prepared.

Next, with reference to FIG. 3B, the semiconductor wafer source 1 is attached to the first supporting member 21 (Step S2 of FIG. 2A). The semiconductor wafer source 1 is attached to the first supporting member 21 in a posture that the second main surface 3 faces the first supporting main surface 22 of the first supporting member 21. Thereby, the wafer-attached structure 101 is formed.

The semiconductor wafer source 1 may be attached to the first supporting member 21 by an adhesive agent. In a case in which the semiconductor wafer source 1 and the first supporting member 21 are made of the same type of material (SiC), the semiconductor wafer source 1 may be bonded to the first supporting member 21 by a wafer direct bonding method. The wafer direct bonding method may include a room temperature bonding method, a hydroxyl group bonding method or a plasma bonding method.

In the room temperature bonding method, first, ion beams are irradiated onto each of the second main surface of the semiconductor wafer source 1 and the first supporting main surface 22 of the first supporting member 21. Thereby, an atom with an atomic bonding is formed on each of the second main surface 3 of the semiconductor wafer source 1 and the first supporting main surface 22 of the first supporting member 21. Thereafter, the second main surface 3 of the semiconductor wafer source 1 is attached to the first supporting main surface 22 of the first supporting member 21.

In the hydroxyl group bonding method, first, a hydrophilic treatment is performed to each of the second main surface 3 of the semiconductor wafer source 1 and the first supporting main surface 22 of the first supporting member 21. An oxidizing chemical liquid such as sulfuric acid/hydrogen peroxide may be used in the hydrophilic treatment. Thereby, a hydroxyl group is introduced into each of the second main surface 3 of the semiconductor wafer source 1 and the first supporting main surface 22 of the first supporting member 21. Thereafter, the second main surface 3 of the semiconductor wafer source 1 is attached to the first supporting main surface 22 of the first supporting member 21.

In the plasma bonding method, first, an oxygen plasma treatment is performed to each of the second main surface 3 of the semiconductor wafer source 1 and the first supporting main surface 22 of the first supporting member 21. Thereby, an active region is formed on each of the second main surface 3 of the semiconductor wafer source 1 and the first supporting main surface 22 of the first supporting member 21. The active region may include a hydroxyl group and/or an atom with an atomic bonding. Thereafter, the second main surface 3 of the semiconductor wafer source 1 is attached the first supporting main surface 22 of the first supporting member 21.

In the wafer direct bonding method, a thermal treatment process and/or a pressing process for increasing a bonding strength between the semiconductor wafer source 1 and the first supporting member 21 may be performed as necessary.

The wafer-attached structure 101 may include a bonding layer 28 which bonds the semiconductor wafer source 1 and the first supporting member 21 at a boundary region between the semiconductor wafer source 1 and the first supporting member 21. In a case in which the semiconductor wafer source 1 and the first supporting member 21 are attached by an adhesive agent, the bonding layer 28 may include an adhesive agent.

In a case in which the semiconductor wafer source 1 and the first supporting member 21 are attached by the wafer direct bonding method, the bonding layer 28 may include a semiconductor bonding layer. The semiconductor bonding layer may nave a crystalline state different from a crystalline state of the semiconductor wafer source 1 and/or a crystalline state of the first supporting member 21. The semiconductor bonding layer may include an amorphous layer. The amorphous layer may have a material of the semiconductor wafer source 1 and/or a material of the first supporting member 21.

Next, with reference to FIG. 3C, the semiconductor element 11 is formed in each of the plurality of element forming regions 10 set in the first main surface 2 of the semiconductor wafer source 1 (Step S3 of FIG. 2A).

A step of forming the semiconductor element 11 may include a step of polishing the first main surface 2 of the semiconductor wafer source 1. The step of forming the semiconductor element 11 may include a step of forming an epitaxial layer 29 on the first main surface 2 of the semiconductor wafer source 1.

The step of forming the semiconductor element 11 may include a step of selectively introducing n type impurities and/or p type impurities into the epitaxial layer 29 depending on properties of the semiconductor element 11. The step of forming the semiconductor element 11 may include a step of forming a first main surface electrode 30 on the epitaxial layer 29.

In the polishing step, the first main surface 2 of the semiconductor wafer source 1 may be polished until an arithmetic average roughness Re becomes not more than 1 nm. The polishing step may be performed by a CMP (Chemical Mechanical Polishing) method.

In the step of forming the epitaxial layer 29, SiC undergoes epitaxial growth from the first main surface 2 of the semiconductor wafer source 1. The epitaxial layer 29 can be formed appropriately on the first main surface 2 of the semiconductor wafer source 1, if being formed after the polishing step. Thereby, it is possible to appropriately form the semiconductor element 11 in the first main surface 2 of the semiconductor wafer source 1.

In the step of forming the first main surface electrode 30, the first train surface electrode 30 electrically connected to the element forming region 10 is formed on each of the plurality of element forming regions 10.

Next, with reference to FIG. 3D, a second supporting member 31 is attached to the semiconductor wafer source 1 (Step S4 of FIG. 2A). The wafer-attached structure 101 may be handled in a state of having the second supporting member 31.

The second supporting member 31 supports the semiconductor wafer source 1 from the first main surface 2 side of the semiconductor wafer source 1. The second supporting member 31 may be attached to the semiconductor wafer source 1 via a double-sided adhesive tape 32.

Various types of materials can be applied to the second supporting member 31 as long as they are able to support the semiconductor wafer source 1. For example, a member similar in structure to the first supporting member 21 may be adopted as the second supporting member 31. In this case, a description of the first supporting member 21 applies to a description of the second supporting member 31.

The second supporting member 31 may be a disc-shaped glass plate. The glass plate may be similar in external shape to the first supporting member 21. The second supporting member 31 may be directly attached to the semiconductor wafer source 1 without use of the tape 32. In this case, the second supporting member 31 may be a single-sided adhesive tape.

The second supporting member 31 may be set such as to be equal to or larger in planar area than the semiconductor wafer source 1 in view of handling convenience. In this case, the wafer-attached structure 101 has a structure in which the semiconductor wafer source 1 is housed at a region where the first supporting member 21 and the second supporting member 31 face each other.

Thereby, the semiconductor wafer source 1 can be appropriately protected from an external force, etc., by the first supporting member 21 and the second supporting member 31. Of course, the planar area of the second supporting member 31 may be less than or equal to the planar area of the semiconductor wafer source 1.

Next, with reference to FIG. 3E, laser light is irradiated into the semiconductor wafer source 1 from a laser light irradiation apparatus 33 (Step S5 of FIG. 2A). Laser light is irradiated toward the semiconductor wafer source 1 in a state in which the semiconductor wafer source 1 is supported by the second supporting member 31. Laser light is irradiated toward the semiconductor wafer source 1 via the first supporting member 21 from the second main surface 3 side of the semiconductor wafer source 1.

A light collecting portion (a focal point) of laser light is set in a thickness direction intermediate portion of the semiconductor wafer source 1. A distance from the first main surface 2 of the semiconductor wafer source 1 to the light collecting portion of laser light is set according to thickness of a semiconductor device which is to be obtained. The distance W1 may be not less than 50 μm and not more than 100 μm.

A laser light irradiation position to the semiconductor wafer source 1 is moved along a horizontal direction parallel to the first main surface 2 of the semiconductor wafer source 1. Thereby, a first altered layer 34, the crystalline state of which is altered in properties different from those of other regions, is formed in the thickness direction intermediate portion of the semiconductor wafer source 1.

The first altered layer 34 is formed in the thickness direction intermediate portion of the semiconductor wafer source 1 along a horizontal direction. The first altered layer 34 is a laser processing trace formed by irradiation of laser light. The first altered layer 34 is also a layer in which a density, a refractive index, a mechanical strength (crystalline strength) and other physical characteristics are modified different state from states of other regions due to alteration.

The first altered layer 34 may include at least any one of a melted-and-rehardened layer, a defect layer, a dielectric breakdown layer and a refractive index change layer. The melted-and-rehardened layer is a layer in which the semiconductor wafer source 1 is partially melted and thereafter re-cured. The defect layer is a layer which includes vacancies, cracks, etc. The dielectric breakdown layer is a layer resulting from dielectric breakdown. The refractive index change layer is a layer having a refractive index different from that of another region.

Figure 3F:
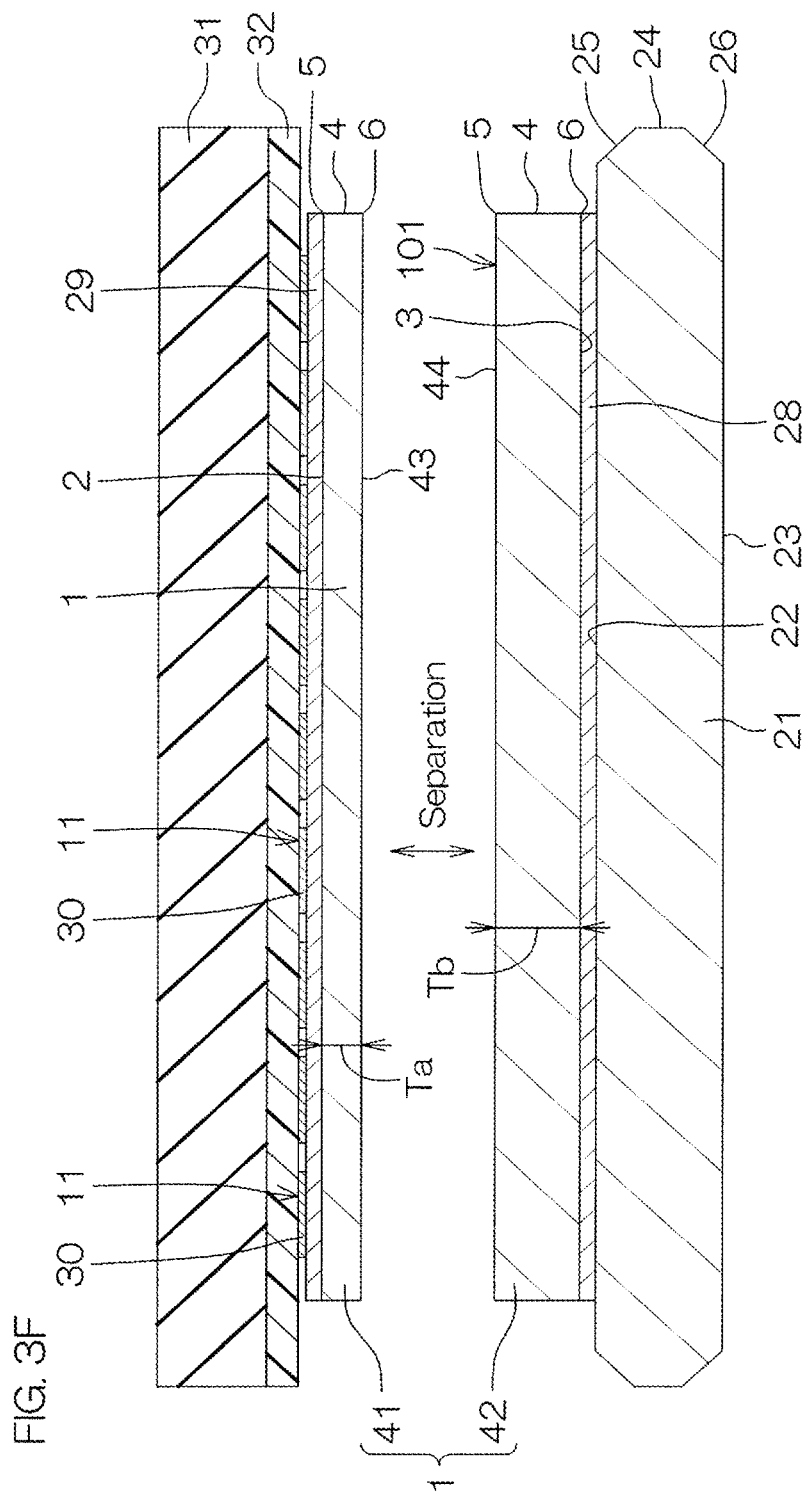
FIG. 3F is a cross sectional view for describing a step subsequent to that of FIG. 3E.

Next, with reference to FIG. 3F, the semiconductor wafer source 1 is cut along a horizontal direction parallel to the first main surface 2 from a thickness direction intermediate portion of the semiconductor wafer source 1 (Step S6 of FIG. 2A). More specifically, the semiconductor wafer source 1 is cleaved along the horizontal direction, with the first altered layer 34 as a starting point. The semiconductor wafer source 1 is cleaved in a state in which the semiconductor wafer source 1 is supported by (held between) the first supporting member 21 and the second supporting member 31.

Thereby, the semiconductor wafer source 1 is separated into an element formation wafer 41 having the semiconductor element 11 and an element non-formation wafer 42 free of the semiconductor element 11. The element formation wafer 41 includes a first main surface 2 on one side and a first cut surface 43 on the other side. The element formation wafer 41 has a thickness Ta. The element non-formation wafer 42 includes a second cut surface 44 on one side and the second main surface 3 on the other side. The element non-formation wafer 42 has a thickness Tb.

Figure 3G:
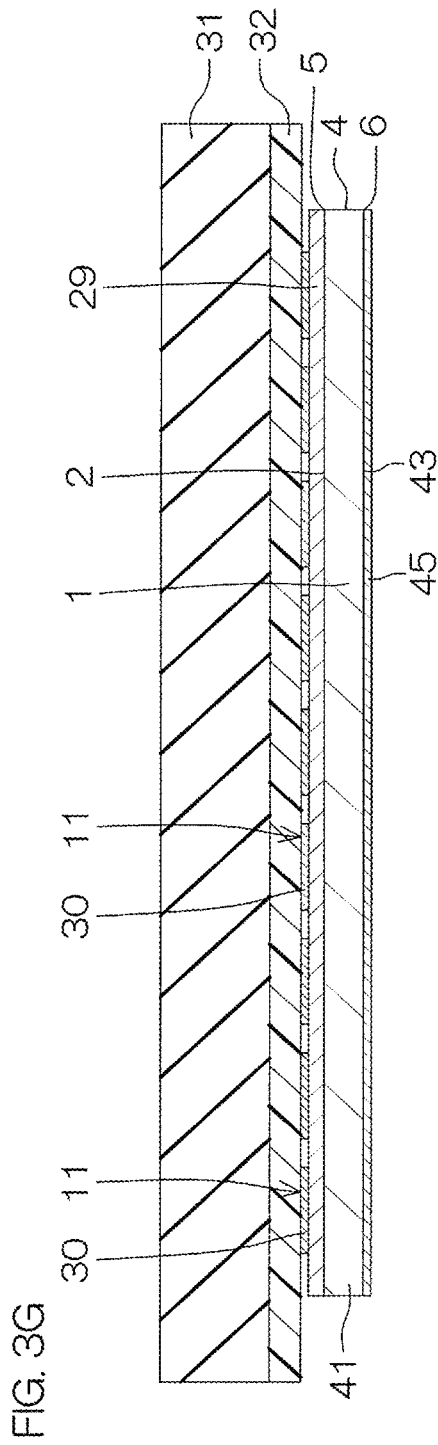
FIG. 3G is a cross sectional view for describing a step subsequent to that of FIG. 3F.

With reference to FIG. 3G, after a step of separating the semiconductor wafer source 1, the first cut surface 43 of the element formation wafer 41 is ground (Step S11 of FIG. 2B). The step of grinding the first cut surface 43 may be performed by a CMP method.

The step of grinding the first cut surface 43 may be performed until the element formation wafer 41 attains a desired thickness. That is, the step of grinding the first cut surface 43 may include a step of thinning the element formation wafer 41.

After the step of grinding the first cut surface 43, a second main surface electrode 45 is formed on the first cut surface 43 of the element formation wafer 41 (Step S12 of FIG. 2B). Of course, the step of grinding the first cut surface 43 maybe omitted. That is, the second main surface electrode 45 may be directly formed on the first cut surface 43 immediately after step of separating the semiconductor wafer source 1.

Thereafter, the element formation wafer 41 is cut along a dicing line 12 (also refer to FIG. 1A and FIG. 1B) (Step S13 of FIG. 2B). Thereby, a plurality of semiconductor devices are cut out from the element formation wafer 41.

The step of cutting the element formation wafer 41 may be performed in a state of being supported by the second supporting member 31. In this case, after the step of cutting the element formation wafer 41, the second supporting member 31 is removed. The step of cutting the element formation wafer 41 may be performed after removal of the second supporting member 31.

After the step of separating the semiconductor wafer source 1, a determination is made on whether the element non-formation wafer 42 is reusable as a new semiconductor wafer source (Step S7 of FIG. 2A).

The determination on whether the element non-formation wafer 42 is reusable may be made on the basis of the thickness Ta of the element formation wafer 41 and the thickness Tb of the element non-formation wafer 42. In a case in which the thickness Tb of the element non-formation wafer 42 is not more than the thickness Ta of the element formation wafer 41 (Tb≤Ta), a determination that it is not reusable may be made. The non-reusable condition may be Tb≤Ta.

The determination on whether the element non-formation wafer 42 is reusable may be made on the basis of a thickness Tch1 of a semiconductor device which is to be obtained from the element non-formation wafer 42. In a case in which the thickness Tch1 of the semiconductor device which is to be obtained is not less than the thickness Tb of the element non-formation wafer 42 (Tch1≥Tb), the determination that it is not reusable may be made. The non-reusable condition may be Tch1>Tb.

The condition that the element non-formation wafer 42 is not reusable may include a case in which although the element non-formation wafer 42 has a sufficient thickness Tb (for example, Tch1<Tb), a situation that does not allow the reusable is occurred.

In a case in which the element non-formation wafer 42 is not reusable (Step S7 of FIG. 2A: NO), the method for manufacturing the semiconductor device by using one semiconductor wafer source 1 is ended.

In a case in which the element non-formation wafer 42 is not reusable, a step of removing the element non-formation wafer 42 from the first supporting member 21 may be performed. The element non-formation wafer 42 that is not reusable may be removed by a polishing process. The polishing process may be performed by a CMP method. After the removal step, a step of reusing the first supporting member 21 as a supporting member for supporting another semiconductor wafer source may be performed.

With reference to FIG. 3H, in a case in which the element non-formation wafer 42 is reusable as a new semiconductor wafer source (Step S7 of FIG. 2A: YES), a new semiconductor element 52 is formed in the element non-formation wafer 42 (Step S8 of FIG. 2A).

Hereinafter, the element non-formation wafer 42 is referred to as a "new semiconductor wafer source 51." The second cut surface 44 of the new semiconductor wafer source 51 corresponds to the first main surface 2 of the semiconductor wafer source 1. The new semiconductor element 52 may be formed on the second cut surface 44 of the new semiconductor wafer source 51 in a state in which the new semiconductor wafer source 51 is supported by the first supporting member 21.

The new semiconductor element 52 may be the same type as the semiconductor element 11 described above or may be different therefrom. FIG. 3H shows a case that the new semiconductor element 52 is the same type as the semiconductor element 11. The new semiconductor element 52 is made into each of a plurality of element forming regions 10 set on the second cut surface 44 of the new semiconductor wafer source 51.

The step of forming the new semiconductor element 52 may include a step of polishing the second cut surface 44 of the new semiconductor wafer source 51. The step of forming the new semiconductor element 52 may include a step of forming an epitaxial layer 29 on the second cut surface 44 of the new semiconductor wafer source 51.

The step of forming the new semiconductor element 52 may include a step of selectively introducing n type impurities and/or p type impurities into the epitaxial layer 29 depending on properties of the new semiconductor element 52. The step of forming the new semiconductor element 52 may include a step of forming a first main surface electrode 30 on the epitaxial layer 29.

In the polishing step, the second cut surface 44 of the new semiconductor wafer source 51 may be polished until an arithmetic average roughness Ra becomes not more than 1 nm. The polishing step may be performed by a CMP method.

In the step of forming the epitaxial layer 29, SiC undergoes epitaxial growth from the second cut surface 44 of the new semiconductor wafer source 51. The epitaxial layer 29 can be appropriately formed on the second cut surface 44 of the new semiconductor wafer source 51, if being formed after the polishing step. Thereby, it is possible to appropriately form the new semiconductor element 52 in the second cut surface 44 of the new semiconductor wafer source 51.

In the step of forming the first main surface electrode 30, the first main surface electrode 30 electrically connected to the element forming region 10 is formed on each of the plurality of element forming regions 10.

Figure 3I:
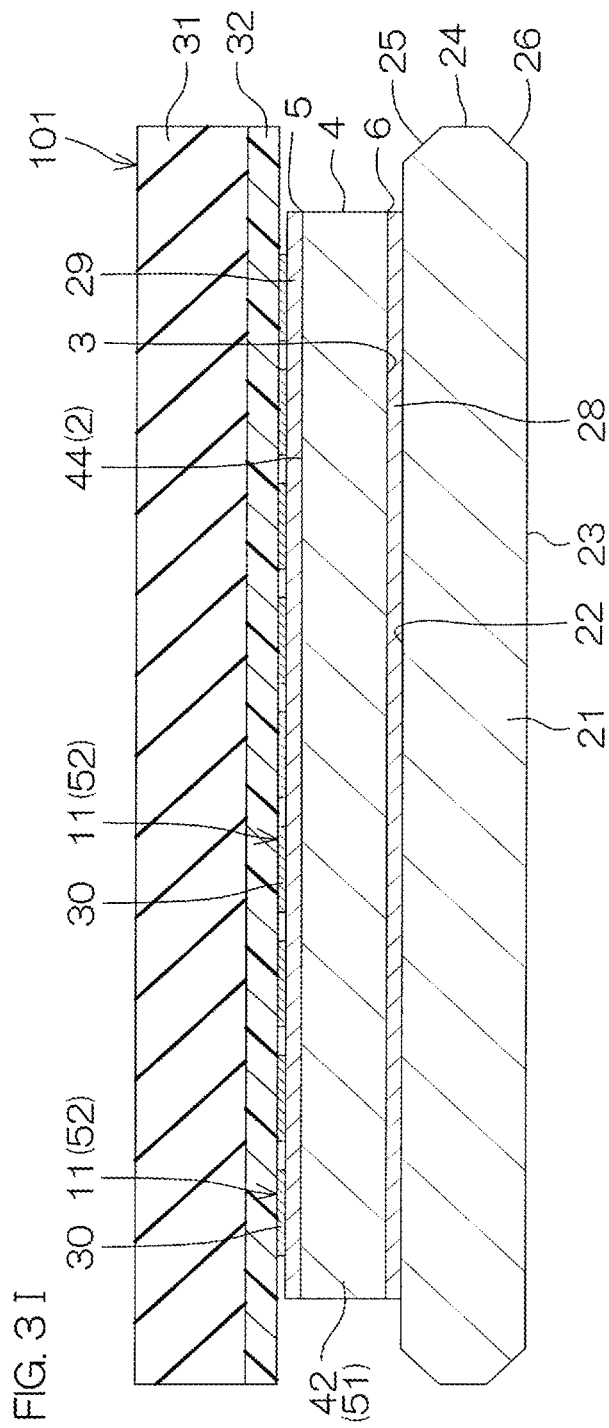
FIG. 3I is a cross sectional view for describing a step subsequent to that of FIG. 3H.

Next, with reference to FIG. 3I, the second supporting member 31 is attached to the new semiconductor wafer source 51 (Step S4 of FIG. 2A). The second supporting member 31 supports the semiconductor wafer source 1 from the second cut surface 44 side of the new semiconductor wafer source 51. The second supporting member 31 may be attached to the semiconductor wafer source via a double-sided adhesive tape 32.

Figure 3J:
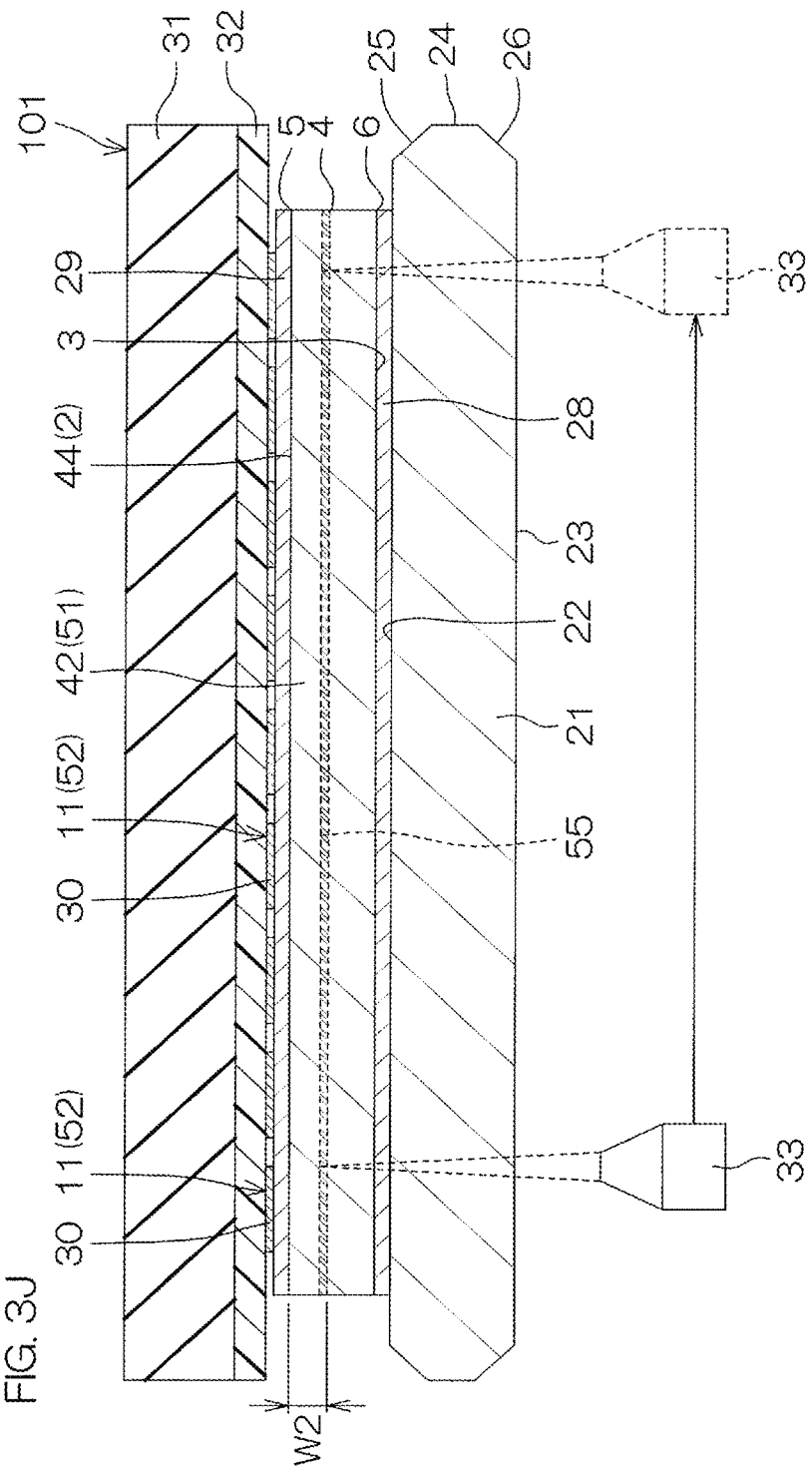
FIG. 3J is a cross sectional view for describing a step subsequent to that of FIG. 3I.

Next, with reference to FIG. 3J, laser light is irradiated toward the new semiconductor wafer source 51 from a laser light irradiation apparatus 33 (Step S5 of FIG. 2A). Laser light is irradiated toward the new semiconductor wafer source 51 in a state in which the new semiconductor wafer source 51 is supported by the second supporting member 31. Laser light is irradiated into the new semiconductor wafer source 51 via the first supporting member 21 from the second main surface 3 side of the new semiconductor wafer source 51.

A light collecting portion (a focal point) of laser light is set in a thickness direction intermediate portion of the new semiconductor wafer source 51. A distance W2 from the second cut surface 44 of the new semiconductor wafer source 51 to the light collecting portion of laser light is set depending on the thickness Tch1 of the semiconductor device which is to be obtained. The distance W2 may be not less than 50 μm and not more than 100 μm.

A laser light irradiation position to the new semiconductor wafer source 51 is moved along a horizontal direction parallel to the second cut surface 44 of the new semiconductor wafer source 51. Thereby, a second altered layer 55, the crystalline state of which is altered in properties different from those of the other regions, is formed in a thickness direction intermediate portion of the new semiconductor wafer source 51.

The second altered layer 55 is formed in the thickness direction intermediate portion of the new semiconductor wafer source 51 along the horizontal direction. The second altered layer 55 is approximately similar in a structure to the previously described first altered layer 34. A specific description of the second altered layer 55 will be omitted.

Next, with reference to FIG. 3K, anew semiconductor wafer source 51 is cut along the horizontal direction parallel to the second cut surface 44 from a thickness direction intermediate portion of the new semiconductor wafer source 51 (Step S6 of FIG. 2A).

More specifically, the new semiconductor wafer source 51 is cleaved along the horizontal direction, with the second altered layer 55 as a starting point. The new semiconductor wafer source 51 is cleaved in a state in which the new semiconductor wafer source 51 is supported by (held between) the first supporting member 21 and the second supporting member 31.

Thereby, the new semiconductor wafer source 51 is separated into a second element formation wafer 61 (element formed wafer) in which the new semiconductor element 52 is formed and a second element non-formation wafer 62 in which the new semiconductor element 52 is not formed.

The second element formation wafer 61 includes a second cut surface 44 on one side and a third cut surface 63 on the other side. The second element formation wafer 61 has a thickness Tc. The second element non-formation wafer 62 includes a fourth cut surface 64 on one side and the second main surface 3 on the other side. The second element non-formation wafer 62 has a thickness Td.

After the step of separating the new semiconductor wafer source 51, the third cut surface 63 of the second element formation wafer 61 is ground (Step S11 of FIG. 2B). The step of grinding the third cut surface 63 may be performed by a CMP method.

The step of grinding the third cut surface 63 may be performed until the second element formation wafer 61 attains a desired thickness. That is, the step of grinding the third cut surface 63 may include a step of thinning the second element formation wafer 61.

After the step of grinding the third cut surface 63, a second main surface electrode 45 is formed on the third cut surface 63 of the second element formation wafer 61 (Step S12 of FIG. 2B). Of course, the step of grinding the third cut surface 63 may be omitted. That is, the second main surface electrode 45 may be formed directly on the third cut surface 63 immediately after the step of separating the new semiconductor water source 51.

Thereafter, the second element formation wafer 61 is cut along a dicing line 12 (also refer to FIG. 1A and FIG. 1B) (Step S13 of FIG. 2B). Thereby, a plurality of semiconductor devices are cut out from the second element formation wafer 61.

The step of cutting the second element formation wafer 61 may be performed in a state of being supported by the second supporting member 31. In this case, after the step of cutting the second element formation wafer 61, the second supporting member 31 is removed. The step of cutting the second element formation wafer 61 may be performed after removal of the second supporting member 31.

After the step of separating the new semiconductor wafer source 51, a determination on whether the second element non-formation wafer 62 is reusable as a new semiconductor wafer source is made (Step S7 of FIG. 2A).

The determination on whether the second element non-formation wafer 62 is reusable may be made on the basis of the thickness Tc of the second element formation wafer 61 and the thickness Td of the second element non-formation wafer 62. In a case in which the thickness Td of the second element non-formation wafer 62 is not more than the thickness Tc of the second element formation wafer 61 (Td≤Tc), a determination that it is not reusable may be made. The non-reusable condition may be Td<Tc.

The determination on whether the second element non-formation wafer 62 is reusable may be made on the basis of a thickness Tch2 of a semiconductor device which is to be obtained from the second element non-formation wafer 62. In a case in which the thickness Tch2 of the semiconductor device which is to be obtained is not less than a thickness Td of the second element non-formation wafer 62 (Tch2≥Td), a determination that it is not reusable may be made. The non-reusable condition may be Tch2>Td.

The condition that the second element non-formation wafer 62 is not reusable may include a case in which although the second element non-formation wafer 62 has a sufficient thickness Td (for example, Tch2<Td), a situation that does not allow the reusable is occurred.

In a case in which the second element non-formation wafer 62 is not reusable as a new semiconductor wafer source (Step S7 of FIG. 2A: NO), the method for manufacturing the semiconductor device by using one semiconductor wafer source 1 is ended.

In a case in which the second element non-formation wafer 62 is not reusable, there may be performed a step of removing the second element non-formation wafer 62 from the first supporting member 21. The second element non-formation wafer 62 which is not reusable may be removed by a polishing process. The polishing process may be performed by a CMP method. After the removal step, a step of reusing the first supporting member 21 as a supporting member for supporting another semiconductor wafer source may be performed.

In a case in which the second element non-formation wafer 62 is reusable as a new semiconductor wafer source (Step S7 of FIG. 2A: YES), Step S8 is performed. As described above, in this embodiment, the process of Step S4 to Step S7 is repeated until the element non-formation wafer is to be not reusable as a new semiconductor wafer source.

As described above, in this embodiment, after the step of forming the semiconductor element 11 (Step S3 of FIG. 2A), the step of separating the semiconductor wafer source 1 (Step S5 and Step S6 of FIG. 2A) is performed. The step of separating the semiconductor wafer source 1 is performed on the wafer-attached structure 101 in which the semiconductor wafer source 1 is attached to the first supporting member 21.

The semiconductor wafer source 1 is cleaved and separated into the element formation wafer 41 and the element non-formation wafer 42. In this case, the element non-formation wafer 42 is in a state of being attached to the first supporting member 21. Therefore, while the plurality of semiconductor devices can be cut out from the element formation wafer 41, the element non--formation wafer 42 supported by the first supporting member 21 is reusable as the new semiconductor wafer source 51.

Thereby, it is possible to suppress a manufacturing delay and also an excessive consumption of the semiconductor wafer source 1. Thus, it is possible to provide the wafer-attached structure 101 capable of efficiently consuming the semiconductor wafer source 1.

Further, in this embodiment, the new semiconductor element 52 is made into the new semiconductor wafer source 51 which is reused (Step S8 of FIG. 2A). Still further, in this embodiment, the wafer source reuse repeating step in which the step of separating the semiconductor wafer source 1 and the step of reusing the semiconductor wafer source 1 are repeated alternately is performed (Step S5 to Step S7 of FIG. 2A). Thereby, it is possible to increase the number of semiconductor devices that can be obtained from one semiconductor wafer source 1.

Further, in this embodiment, a step of cleaving the semiconductor wafer source 1 by using the laser light irradiation method in the step of separating the semiconductor wafer source 1 is performed (Step S5 and Step S6 of FIG. 2A). Thereby, it is not necessary to adjust the thickness of the semiconductor device by grinding the semiconductor wafer source 1. Thus, it is possible to suppress an increased cost resulting from the grinding.

In particular, the laser light irradiation method is applicable to the SiC monocrystal semiconductor wafer source which is relatively high in hardness. Further, the SiC monocrystal semiconductor wafer source 1 can be appropriately separated into the element formation wafer 41 and the element non-formation wafer 42.

The laser light irradiation method is also advantageous in that it is possible to suppress an increased cost resulting from the grinding even where the initial element non-formation wafer 42 is not reusable (Step 57 of FIG. 2A: NO). The laser light irradiation method is particularly helpful in the case of the SiC monocrystal semiconductor wafer source 1 which is relatively high in hardness.

Further, in this embodiment, in the step of separating the semiconductor wafer source 1 (Step S5 and Step S6 of FIG. 2A), laser light is irradiated from the second main surface 3 side of the semiconductor wafer source 1 to the thickness direction intermediate portion of the semiconductor wafer source 1.

No semiconductor element 11 is formed on the second main surface 3 of the semiconductor wafer source 1. Therefore, laser light can be irradiated with respect to the interior of the semiconductor wafer source 1 from the second main surface 3 side of the semiconductor wafer source 1 with few obstacles. Thereby, the first altered layer 34 and the second altered layer 55 can be appropriately formed on the semiconductor wafer source 1 to appropriately separate (cleave) the semiconductor wafer source 1.

In a case in which the second wafer edge portion 6 of the semiconductor wafer source 1 has a chamfered portion, a clearance is formed at a region between the second wafer edge portion 6 of the semiconductor wafer source 1 and the first supporting main surface 22 of the first supporting member 21. Errors occurring at the light collecting portion (the focal point) of laser light include an error resulting from this clearance.

Thus, in this embodiment, the second wafer edge portion 6 which is free of a chamfered portion in the semiconductor wafer source 1 is formed. Thereby, it is possible to suppress the formation of a clearance at a region between the second wafer edge portion 6 of the semiconductor wafer source 1 and the first supporting main surface 22 of the first supporting member 21.

Thus, it is possible to suppress an error occurring at the light collecting portion (the focal point) of laser light and, therefore, possible to appropriately form the first altered layer 34 inside the semiconductor wafer source 1. As a result, the semiconductor wafer source 1 can be appropriately separated (cleaved) into the element formation wafer 41 and the element non-formation wafer 42.

It is also possible to suppress an error occurring at the light collecting portion (the focal point) of laser light and, therefore, possible to appropriately form the second altered layer 55 inside the new semiconductor wafer source 51. As a result, the new semiconductor wafer source 51 can be appropriately separated (cleaved) into a second element formation wafer 61 and a second element non-formation wafer 62.

In a case in which the first supporting member 21 is made of a monocrystal semiconductor wafer, etc., with which no impurities are doped or which is low in concentrations of impurities, it is possible to suppress absorption (attenuation) of laser light. Therefore, consideration is given to a material of the first supporting member 21, by which it is also possible to improve the quality of the first altered layer 34 formed in the semiconductor wafer source 1 and the quality of the second altered layer 55 formed in the new semiconductor wafer source 51.

Further, in this embodiment, the melting point of the first supporting member 21 is not less than the melting point of the semiconductor wafer source 1. Thereby, it is possible to suppress the melting and deformation of the first supporting member 21 in the course of manufacture.

Further, in this embodiment, the ratio of the thermal expansion coefficient of the supporting member in relation to the thermal expansion coefficient of the semiconductor wafer source 1 is not less than 0.5 and not more than 1.5. Thereby, it is possible to reduce a difference in stress between a thermal stress occurring on the semiconductor wafer source 1 (new semiconductor wafer source 51) side and a thermal stress occurring on the first supporting member 21 side in the course of manufacture. Thus, it is possible to suppress warping of the semiconductor wafer source 1 (new semiconductor wafer source 51).

In a case in which the first supporting member 21 is made of the same type of material (SiC) as the semiconductor wafer source 1, the melting point and the thermal expansion coefficient thereof are to be equal. Therefore, it is possible to reliably suppress the warping of the semiconductor wafer source 1 (new semiconductor wafer source 51). It is also possible to reliably suppress the melting and deformation of the first supporting member 21.

Figure 4:
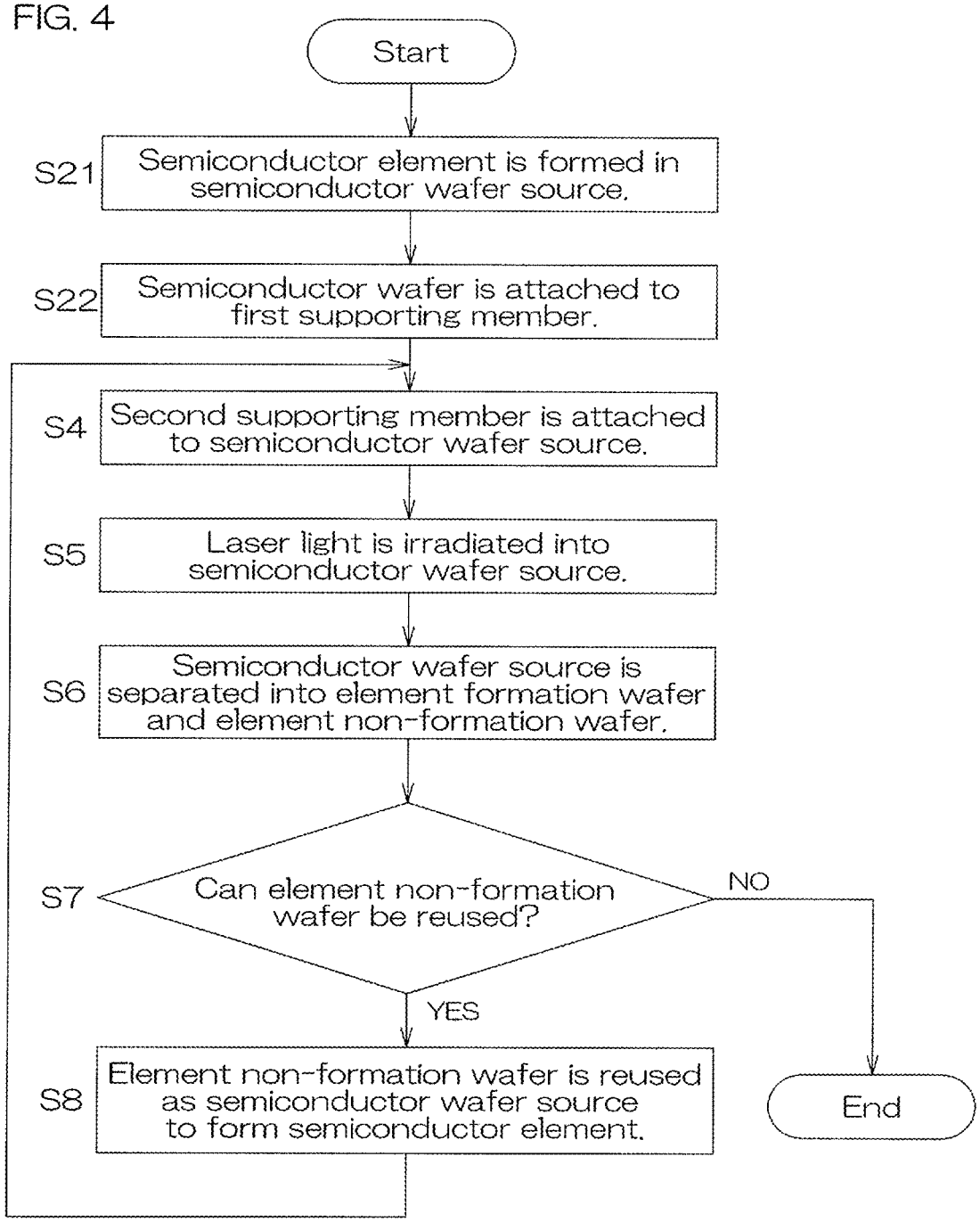
FIG. 4 is a process chart for describing a method for manufacturing a semiconductor device according to a second preferred embodiment of the present invention.

FIG. 4 is a process chart for describing the method for manufacturing the semiconductor device according to the second preferred embodiment of the present invention. Hereinafter, a description of a step corresponding to the step described in the first preferred embodiment will be omitted.

In this embodiment, in place of Step S1 to Step S3 (refer to FIG. 2A) according to the first preferred embodiment, Step S21 to Step S22 are performed. More specifically, first, the semiconductor wafer source 1 in which the semiconductor element 11 is formed at each of the plurality of element forming regions 10 is prepared (Step S21 of FIG. 4).

Next, the semiconductor wafer source 1 in which the semiconductor element 11 is formed is attached to a first supporting member 21 (Step S22 of FIG. 4). Thereby, the wafer-attached structure 101 is formed. Thereafter, Step S4 to Step S8 are performed.

As described above, in this embodiment, prior to the step of attaching the semiconductor wafer source 1 to the first supporting member 21 (Step S22 of FIG. 4), the semiconductor element 11 is formed in the semiconductor wafer source 1 (Step S21 of FIG. 4). Even with this manufacturing method, the same effects as those described in the first embodiment can be realized.

FIG. 5 is a process chart for describing the method for manufacturing the semiconductor device according to the third preferred embodiment of the present invention. Hereinafter, a description of a step corresponding to the step described in the first preferred embodiment will be omitted.

In this embodiment, in place of Step S1 to Step S3 (refer to FIG. 2A) according to the first preferred embodiment, Step S31 is performed. More specifically, first, the wafer-attached structure 101 is prepared (Step S31). The step of preparing the wafer-attached structure 101 may include a step of obtaining the wafer-attached structures 101 distributed in market.

The wafer-attached structure 101 may be manufactured through steps similar to Step S1 to Step S3 according to the first preferred embodiment (also refer to FIG. 2A). Thereafter, Step S4 to Step S8 are performed. Even with this manufacturing method, the same effects as those described in the first embodiment can be realized.

Figure 6B:
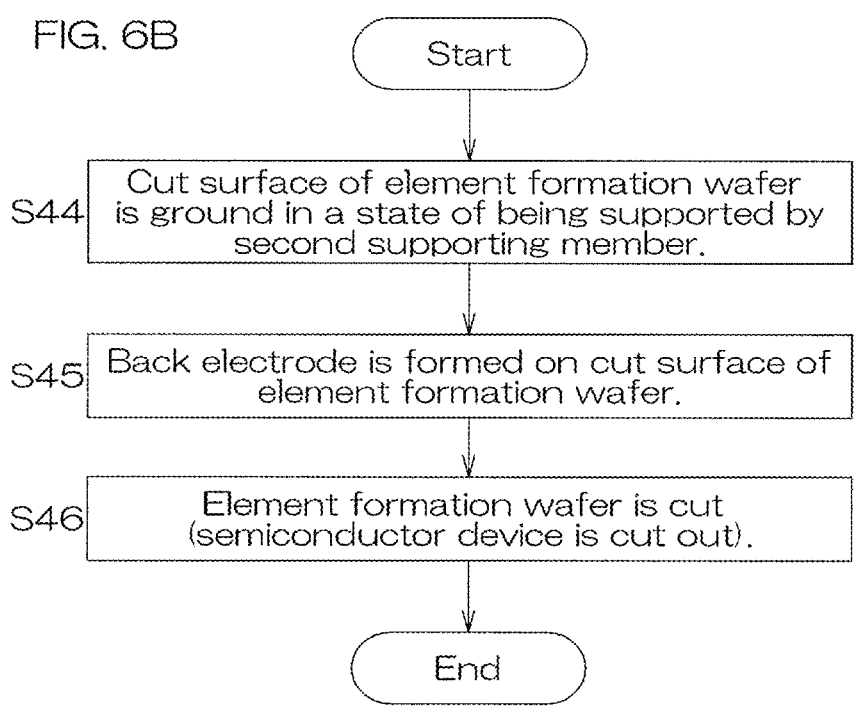
FIG. 6B is a process chart for describing a step performed on an element formation wafer obtained from the step shown in FIG. 6A.

FIG. 6A is a process chart for describing the method for manufacturing the semiconductor device according to the fourth preferred embodiment of the present invention. FIG. 6B is a process chart for describing a step performed on an element formation wafer 41 (new semiconductor wafer source 51) obtained from the step shown in FIG. 6A.

FIG. 7A to FIG. 7G are each a schematic cross sectional view for describing the manufacturing method shown in FIG. 6A and FIG. 6B. Hereinafter, a description of a step corresponding to the step described in the first preferred embodiment will be omitted.

In this embodiment, in place of Step S1 to Step S3 (refer to FIG. 2A) according to the first preferred embodiment, Step S41 is performed. Further, in this embodiment, after Step S5 according to the first preferred embodiment and prior to Step S6, Step S42 is performed. In this embodiment, after Step S8, Step S43 is also performed.

More specifically, with reference to FIG. 7A, the semiconductor wafer source 1 in which the semiconductor element 11 is formed in a first main surface 2 is prepared (Step S41 of FIG. 6A). In this embodiment, a second main surface 3 of the semiconductor wafer source 1 is exposed outside. That is, no second main surface electrode 45 is formed on the second main surface 3 of the semiconductor wafer source 1.

Next, with reference to FIG. 7B, the second supporting member 31 is attached to the first main surface 2 side of the semiconductor wafer source 1 (Step S4 of FIG. 6A). The second supporting member 31 may be attached to the semiconductor wafer source 1 via the double-sided adhesive tape 32.

Figure 7C:
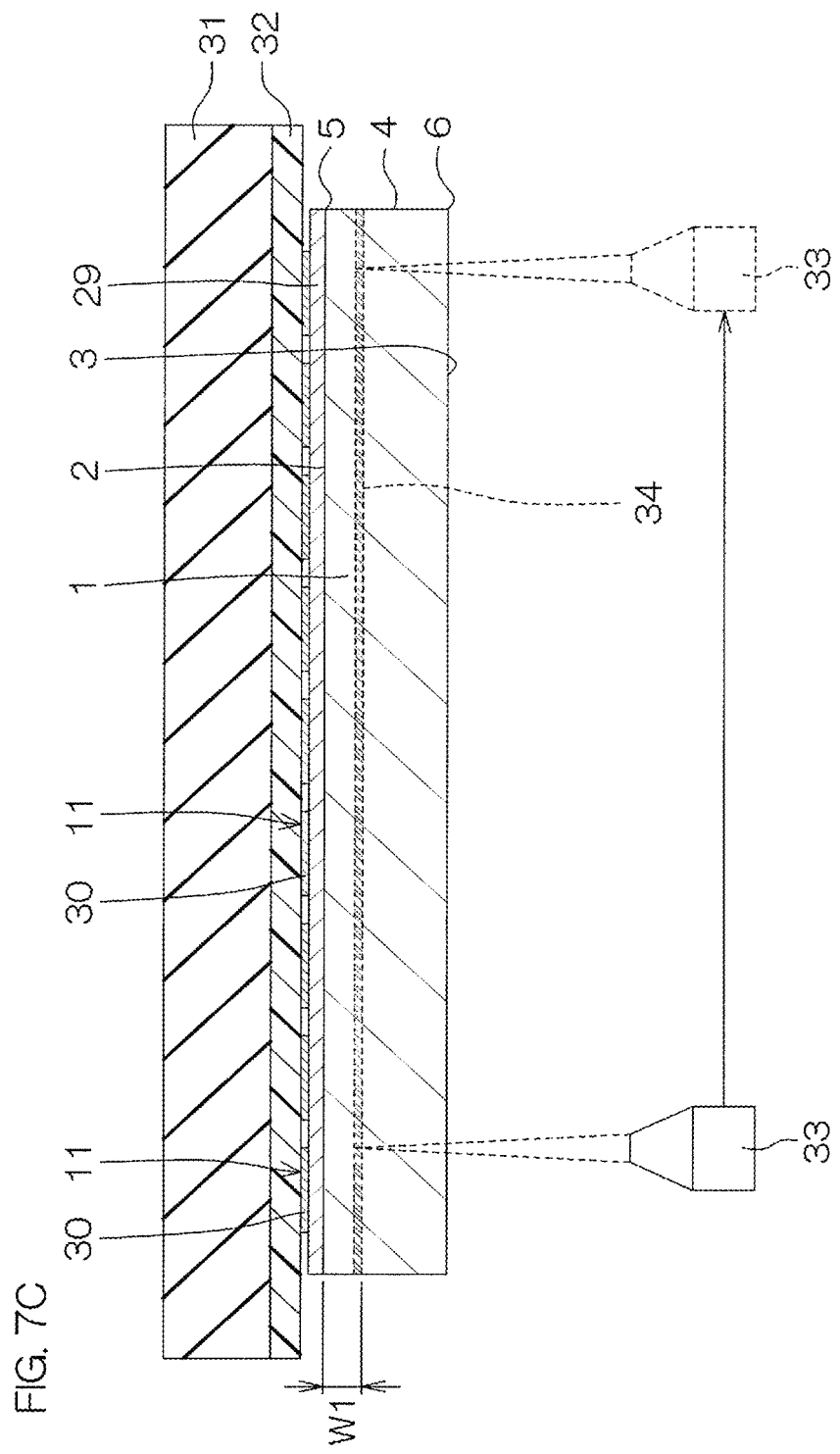
FIG. 7C is a cross sectional view for describing a step subsequent to that of FIG. 7B.

Next, with reference to FIG. 7C, laser light is irradiated toward the semiconductor wafer source 1 from the laser light irradiation apparatus 33 (Step S5 of FIG. 6A). Laser light is irradiated toward the second main surface 3 of the semiconductor wafer source 1 in a state in which the semiconductor wafer source 1 is supported by the second supporting member 31.

In this embodiment, laser light is directly irradiated into the thickness direction intermediate portion of the semiconductor wafer source 1 from the second main surface 3 side of the semiconductor wafer source 1. The distance W1 from the first main surface 2 of the semiconductor wafer source 1 to the light collecting portion of laser light is set depending on the thickness of the semiconductor device which is to be obtained. The distance W1 may be not less than 50 μm and not more than 100 μm.

The laser light irradiation position to the semiconductor wafer source 1 is moved along a horizontal direction parallel to the first main surface 2 of the semiconductor wafer source 1. Thereby, the first altered layer 34, the crystalline state of which is altered in properties different from those of other regions, is formed in the thickness direction intermediate portion of the semiconductor wafer source 1. In a case in which the semiconductor wafer source 1 includes an $n^+$ type SiC semiconductor substrate, the first altered layer 34 may be formed in the intermediate portion of the SiC semiconductor substrate.

In a case in which the semiconductor wafer source 1 has a chamfered portion at an edge portion thereof, an error will occur at the light collecting portion (the focal point) of laser light. Therefore, there is a possibility that the first altered layer 34 will not be formed such as to be parallel to the first main surface 2. Thus, in this embodiment, the semiconductor wafer source 1 which includes the second wafer edge portion 6 which is free of being chamfered is prepared.

Thereby, it is possible to suppress an error occurring at the light collecting portion (the focal point) of laser light. As a result, the first altered layer 34 can be formed such as to be parallel to the first main surface 2 inside the semiconductor wafer source 1 across an entire region of the semiconductor wafer source 1 in the thickness direction. Thus, it is possible to appropriately separate (cleave) the semiconductor wafer source 1 into the element formation wafer 41 and the element non-formation wafer 42.

Next, with reference to FIG. 7D, the semiconductor wafer source 1 having the first altered layer 34 is attached to the first supporting member 21 (Step S42 of FIG. 6A). The semiconductor wafer source 1 is attached to the first supporting member 21 in a posture that the second main surface 3 faces a first supporting main surface 22 of the first supporting member 21. Thereby, the wafer-attached structure 101 is formed. A method for attaching the semiconductor wafer source 1 to the first supporting member 21 is as described in the first preferred embodiment and, therefore, a description thereof will be omitted.

Figure 7E:
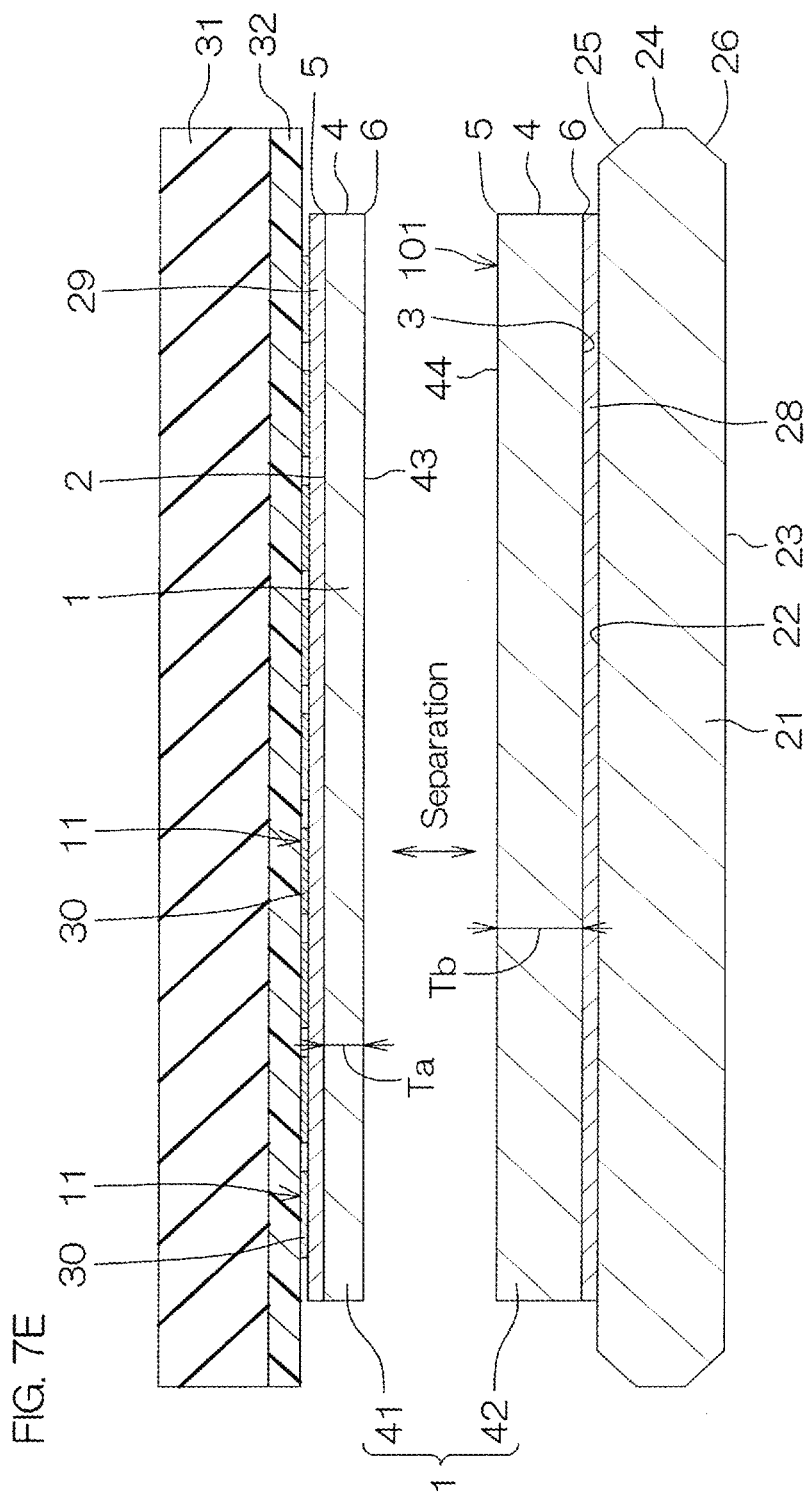
FIG. 7E is a cross sectional view for describing a step subsequent to that of FIG. 7D.

Next, with reference to FIG. 7E, the semiconductor wafer source 1 is cut along the horizontal direction parallel to the first main surface 2 from the thickness direction intermediate portion of the semiconductor wafer source 1 (Step S6 of FIG. 6A). More specifically, the semiconductor wafer source 1 is cleaved along horizontal direction with the first altered layer 34 as a starting point.

The semiconductor wafer source 1 is cleaved in a state in which the semiconductor wafer source 1 is supported by (held between) the first supporting member 21 and the second supporting member 31. Thereby, the semiconductor wafer source 1 is separated into the element formation wafer 41 which has the semiconductor element 11 and the element non-formation wafer 42 which is free of the semiconductor element 11.

In the step of cutting the semiconductor wafer source 1 (Step S6 of FIG. 6A), the semiconductor wafer source 1 only needs to be separated into the element formation wafer 41 which has the semiconductor element 11 and the element non-formation wafer 42 free of the semiconductor element 11. In addition to a case that the semiconductor wafer source 1 which is cleaved as in this embodiment, for example, the first altered layer 34 is adjusted for a position and a condition of formation so that the semiconductor wafer source 1 may be separated by itself into the element formation wafer 41 and the element non-formation wafer 42.

Figure 7F:
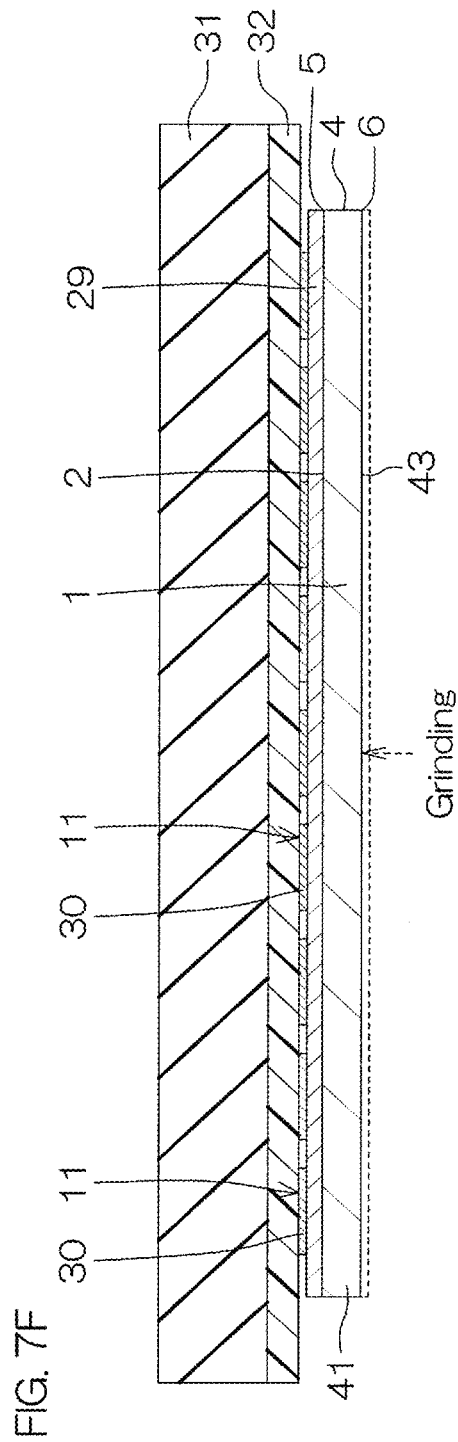
FIG. 7F is a cross sectional view for describing a step subsequent to that of FIG. 7E.

With reference to FIG. 7F, after the step of separating the semiconductor wafer source 1, the first cut surface 43 of the element formation wafer 41 is ground (Step S44 of FIG. 6B). The step of grinding the first cut surface 43 may be performed by a CMP method.

The step of grinding the first cut surface 43 may be performed until the element formation wafer 41 attains a desired thickness. That is, the step of grinding the first cut surface 43 may include a step of thinning the element formation wafer 41.

Figure 7G:
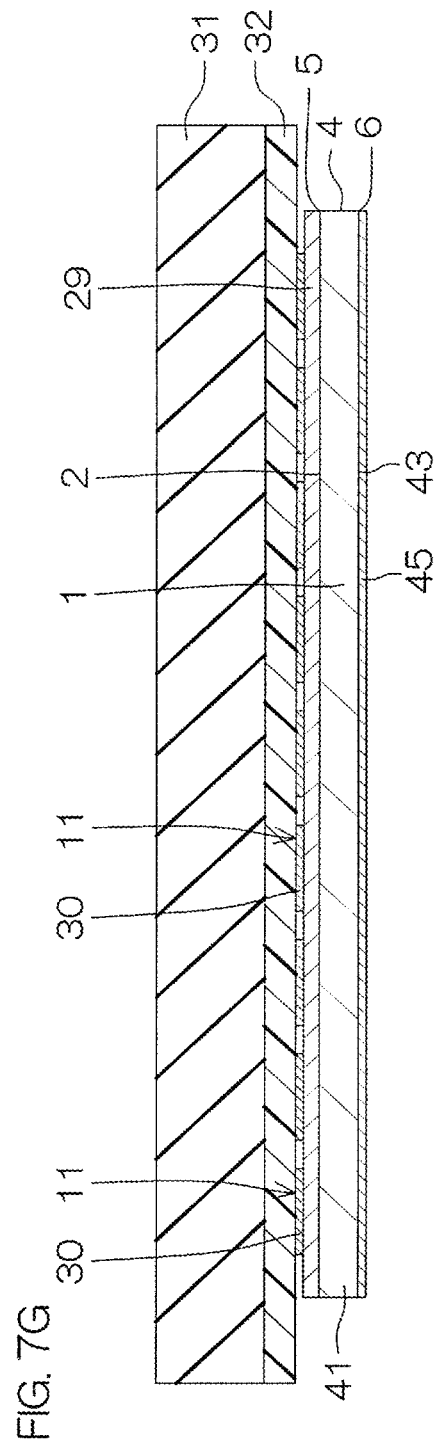
FIG. 7G is a cross sectional view for describing a step subsequent to that of FIG. 7F.

Next, with reference to FIG. 7G, the second main surface electrode 45 is formed on the first cut surface 43 of the element formation wafer 41 (Step S45 of FIG. 6B). Of course, the step of grinding the first cut surface 43 may be omitted. That is, the second main surface electrode 45 may be directly formed on the first cut surface 43 immediately after the step of separating the semiconductor wafer source 1.

After the step of grinding the element formation wafer 41 (Step S44 of FIG. 6B) and prior to the step of forming the second main surface electrode 45 (Step S45 of FIG. 6B), annealing treatment may be performed on the first cut surface 43 (ground surface) of the element formation wafer 41. Annealing treatment may be performed by a laser light irradiation method. In this case, ohmic property of the second main surface electrode 45 in relation to the first cut surface 43 of the element formation wafer 41 can be enhanced.

Thereafter, the element formation wafer 41 is cut along the dicing line 12 (also refer to FIG. 1A and FIG. 1B) (Step S46 of FIG. 6B). Thereby, a plurality of semiconductor devices are cut out from the element formation wafer 41.

The step of cutting the element formation wafer 41 may be performed in the state of being supported by the second supporting member 31. In this case, after the step of cutting the element formation wafer 41, the second supporting member 31 is removed. The step of cutting the element formation wafer 41 may be performed after removal of the second supporting member 31.

After the step of separating the semiconductor wafer source 1, a determination on whether the element non-formation wafer 42 is reusable as the new semiconductor wafer source 51 is made (Step S7 of FIG. 6A). The way of the determination on whether the element non-formation wafer 42 is reusable is as described in the first preferred embodiment and, therefore a description thereof will be omitted.

In a case in which the element non-formation wafer 42 is not reusable (Step S7 of FIG. 6A: NO), the method for manufacturing the semiconductor device by using one semiconductor wafer source 1 is ended.

In a case in which the element non-formation wafer 42 is reusable as the new semiconductor wafer source 51 (Step S7 of FIG. 6A: YES), the new semiconductor element 52 is formed on the element non-formation wafer 42 (Step S8 of FIG. 6A).

Next, the first supporting member 21 is removed from the new semiconductor wafer source 51 (Step S43 of FIG. 6A). Thereby, the second main surface 3 of the new semiconductor wafer source 51 is exposed outside. In a case in which the bonding layer 28 adheres on the second main surface 3 of the new semiconductor wafer source 51, the bonding layer 28 is removed from the semiconductor wafer source 51.

The first supporting member 21 may be removed by a polishing process. The polishing process may be performed by a CMP method. The first supporting member 21 may be removed by an etching method. The first supporting member 21 may be removed by abrasion. In a case in which the first supporting member 21 is reusable, the first supporting member 21 may be used as the supporting member for supporting another semiconductor wafer source. Thereafter, Step S4 is performed.

Then, a process of Step S4 to Step S7 is repeated until the element non-formation wafer is not reusable as a new semiconductor wafer source as with the first preferred embodiment. Even with this manufacturing method, the same effects as those described n the first embodiment can be realized.

In this embodiment, a description has been made for an example in which after the step of forming the new semiconductor element 52 (Step S8 of FIG. 6A), the step of removing the first supporting member 21 is performed (Step S43 of FIG. 6A). However, the step of removing the first supporting member 21 (Step S43 of FIG. 6A) may be performed after the determination on whether the element non-formation wafer 42 is reusable (Step S7 of FIG. 6A) and prior to the step of forming the new semiconductor element 52 (Step S8 of FIG. 6A).

Figure 8A:
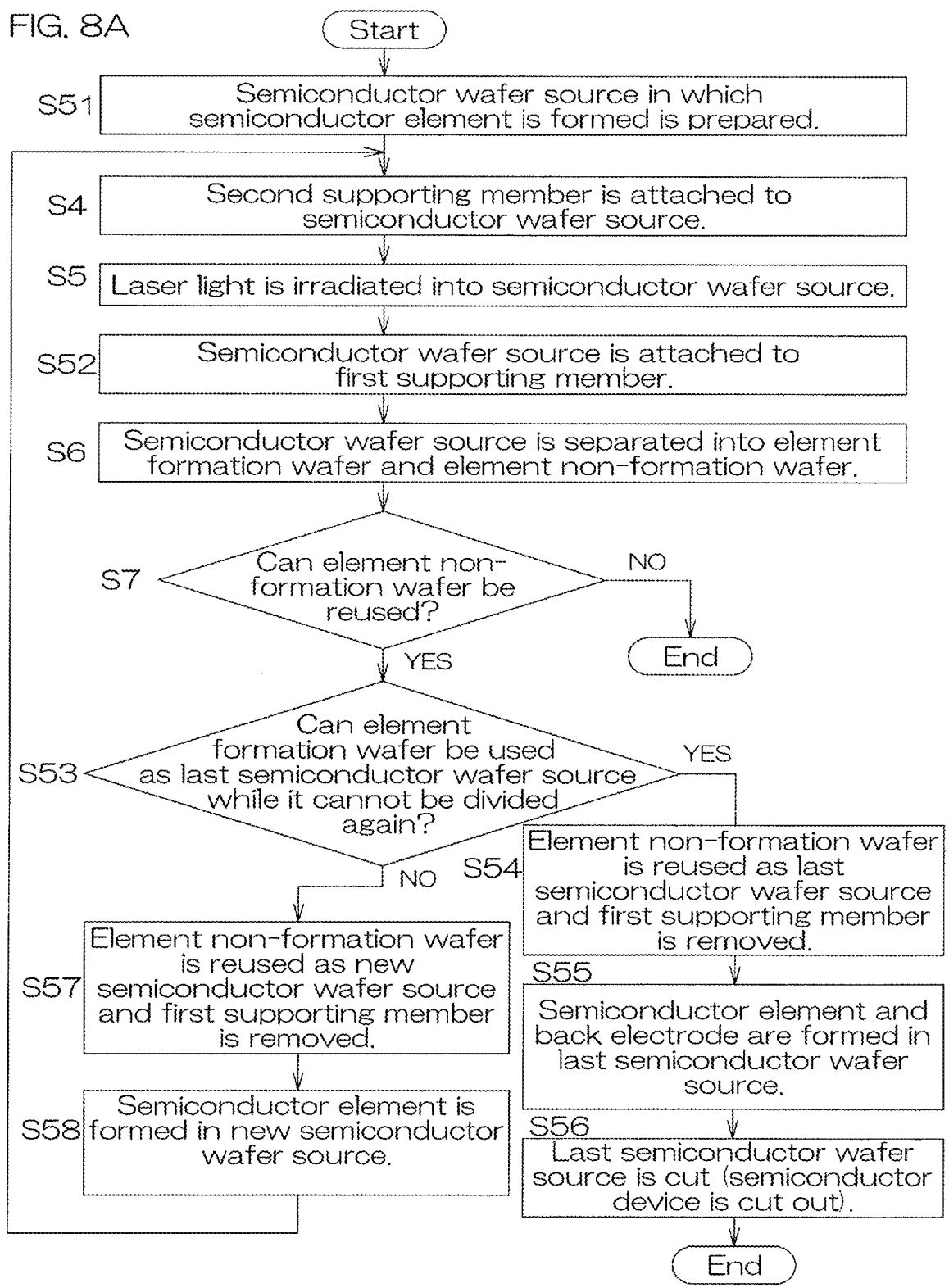
FIG. 8A is a process chart for describing a method for manufacturing a semiconductor device according to a fifth preferred embodiment of the present invention.

FIG. 8A is a process chart for describing the method for manufacturing the semiconductor device according to the fifth preferred embodiment of the present invention. FIG. 8B is a process chart for describing a step performed on an element formation wafer 41 (new semiconductor wafer source 51) obtained from the step shown in FIG. 8A.

FIG. 9A to FIG. 9M are each a schematic cross sectional view for describing the manufacturing method shown in FIG. 8A and FIG. 8B. Hereinafter, a description of a step corresponding to the step described in the first preferred embodiment will be omitted.

In this embodiment, in place of Step S1 to Step S3 (refer to FIG. 2A) according to the first preferred embodiment, Step S51 is performed. Further, in this embodiment, after Step S5 according to the first preferred embodiment and prior to Step S6, Step S52 is performed. Further, in this embodiment, after Step S7 according to the first preferred embodiment, Step S53 to S56 or Steps S53, S57, S58 are performed.

Figure 9A:
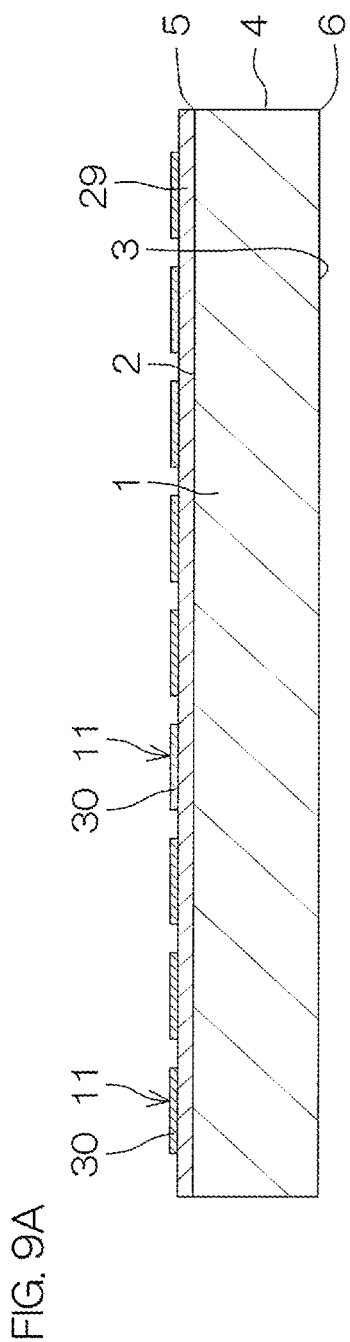
FIG. 9A is a schematic cross sectional view for describing the manufacturing method shown in FIG. 8A and FIG. 8B.

More specifically, with reference to FIG. 9A, the semiconductor wafer source 1 in which a semiconductor element 11 is formed on a first main surface 2 is prepared (Step S51 of FIG. 8A).

Figure 9B:
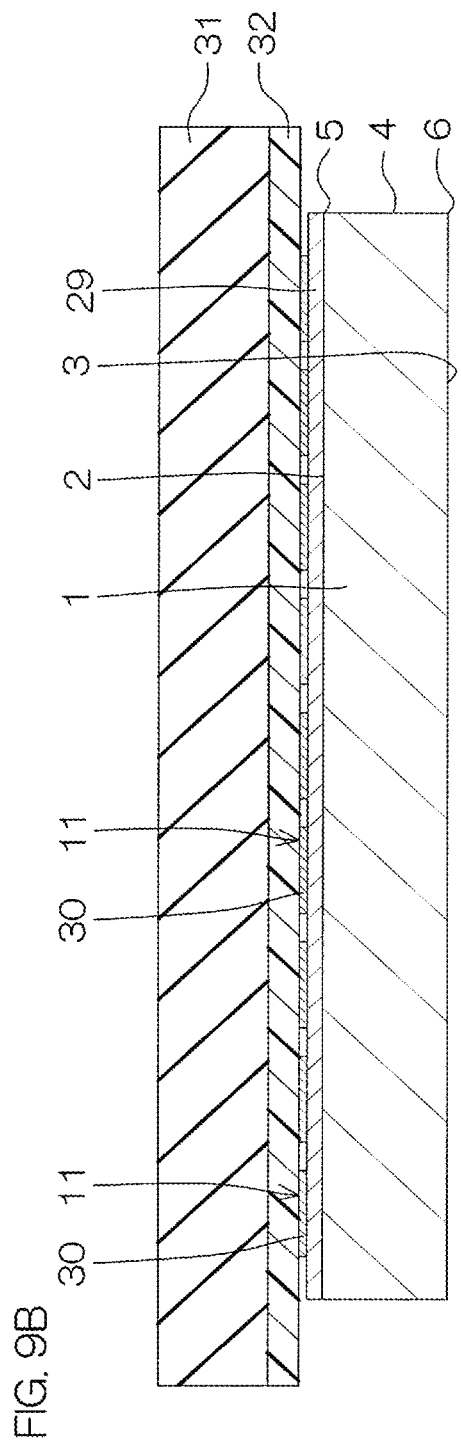
FIG. 9B is a cross sectional view for describing a step subsequent to that of FIG. 9A.

Next, with reference to FIG. 9B, a second supporting member 31 is attached to the first main surface 2 side of the semiconductor wafer source 1 (Step S4 of FIG. 8A). The second supporting member 31 may be attached to the semiconductor wafer source 1 via the double-sided adhesive tape 32.

Next, with reference to FIG. 9C, laser light is irradiated from the laser light irradiation apparatus 33 toward the semiconductor wafer source 1 (Step S5 of FIG. 8A). Laser light is irradiated toward the second main surface 3 of the semiconductor wafer source 1 in a state in which the semiconductor wafer source 1 is supported by the second supporting member 31.

In this embodiment, laser light is directly irradiated into the thickness direction intermediate portion of the semiconductor wafer source 1 from the second main surface 3 side of the semiconductor wafer source 1. The distance W1 from the first main surface 2 of the semiconductor wafer source 1 to the light collecting portion of laser light is set depending on the thickness of the semiconductor device which is to be obtained. The distance W1 may be not less than 50 μm and not more than 100 μm.

The laser light irradiation position to the semiconductor wafer source 1 is moved along the horizontal direction parallel to the first main surface 2 of the semiconductor wafer source 1. Thereby, the first altered layer 34, the crystalline state of which is altered in properties different from those of other regions, is formed in the thickness direction intermediate portion of the semiconductor wafer source 1. In a case in which the semiconductor wafer source 1 includes an n$^+$ type SiC semiconductor substrate, the first altered layer 34 may be formed at the intermediate portion of the SiC semiconductor substrate.

In a case in which the semiconductor wafer source 1 has a chamfered portion at an edge portion thereof, an error will occur at a light collecting portion (a focal point) of laser light and, therefore, there is a possibility that the first altered layer 34 will not be formed such as to be parallel to the first main surface 2. Thus, in this embodiment, the semiconductor wafer source 1 which includes the second wafer edge portion 6 that is free of being chamfered is prepared.

Thereby, it is possible to suppress an error occurring at the light collecting portion (the focal point) of laser light. As a result, the first altered layer 34 can be formed inside the semiconductor wafer source 1 across an entire region of the semiconductor wafer source 1 in the thickness direction such as to be parallel to the first main surface 2. Thus, it s possible to appropriately separate (cleave) the semiconductor wafer source 1 into the element formation wafer 41 and the element non-formation wafer 42.

Next, with reference to FIG. 9D, the semiconductor wafer source 1 having the first altered layer 34 is attached to a first supporting member 21 (Step S52 of FIG. 8A). The semiconductor wafer source 1 is attached to the first supporting member 21 in a posture that the second main surface 3 faces the first supporting main surface 22 of the first supporting member 21. Thereby, the wafer-attached structure 101 is formed. The method for attaching the semiconductor wafer source 1 to the first supporting member 21 is as described in the first preferred embodiment and, therefore, a description thereof will be omitted.

Figure 9E:
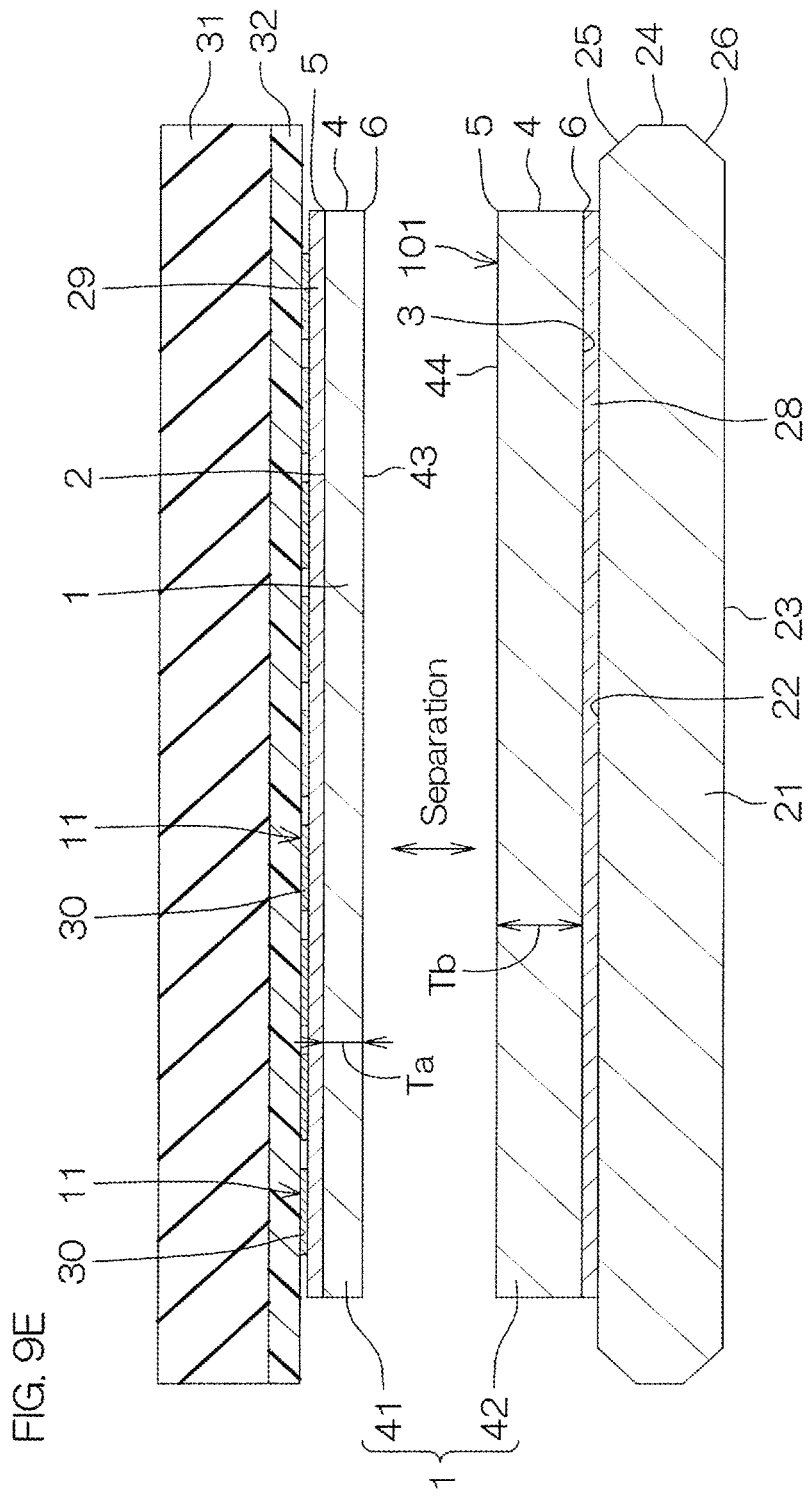
FIG. 9E is a cross sectional view for describing a step subsequent to that of FIG. 9D.

Next, with reference to FIG. 9E, the semiconductor wafer source 1 is cut along the horizontal direction parallel to the first main surface 2 from the thickness direction intermediate portion of the semiconductor wafer source 1 (Step S6 of FIG. 8A). More specifically, the semiconductor wafer source is cleaved along the horizontal direction with the first altered layer 34 as a starting point.

The semiconductor wafer source 1 is cleaved in a state in which the semiconductor wafer source 1 is supported by (held between) the first supporting member 21 and the second supporting member 31. Thereby, the semiconductor wafer source 1 is separated into the element formation wafer 41 having the semiconductor element 11 and the element non-formation wafer 42 free of the semiconductor element 11.

In a step of cutting the semiconductor wafer source 1 (Step S6 of FIG. 6A) the semiconductor wafer source 1 only needs to be separated into the element formation wafer 41 having the semiconductor element 11 and the element non-formation wafer 42 free of the semiconductor element 11. In addition to a case that the semiconductor wafer source 1 is cleaved as in this embodiment, for example, the first altered layer 34 is adjusted for a position and a condition of the formation so that the semiconductor wafer source 1 can be by itself separated into the element formation wafer 41 and the element non--formation wafer 42.

With reference to FIG. 9F, after the step of separating the semiconductor wafer source 1, the first cut surface 43 of the element formation wafer 41 is ground (Step S59 of FIG. 8B). The step of grinding the first cut surface 43 may be performed by a CMP method.

The step of grinding the first cut surface 43 may be performed until the element formation wafer 41 attains a desired thickness. That is, the step of grinding the first cut surface 43 may include a step of thinning the element formation wafer 41.

Next, with reference to FIG. 9G, the second main surface electrode 45 is formed on the first cut surface 43 of the element formation wafer 41 (Step S60 of FIG. 8B). Of course, the step of grinding the first cut surface 43 may be omitted. That is, the second main surface electrode 45 may be directly formed on the first cut surface 43 immediately after the step of separating the semiconductor wafer source 1.

After the step of grinding the element formation wafer 41 (Step S44 of FIG. 6B) and prior to the step of forming the second main surface electrode 45 (Step S45 of FIG. 6B), annealing treatment may be performed on the first cut surface 43 (ground surface) of the element formation wafer 41. Annealing treatment may be performed by a laser light irradiation method. In this case, ohmic property of the second main surface electrode 45 in relation to the first cut surface 43 of the element formation wafer 41 can be enhanced.

Thereafter, the element formation wafer 41 is cut along the dicing line 12 (also refer to FIG. 1A and FIG. 1B) (Step S61 of FIG. 8B). Thereby, a plurality of semiconductor devices are cut out from the element formation wafer 41.

The step of cutting the element formation wafer 41 may be performed in the state of being supported by the second supporting member 31. In this case, after the step of cutting the element formation wafer 41, the second supporting member 31 is removed. The step of cutting the element formation wafer 41 may be performed after removal of the second supporting member 31.

After the step of separating the semiconductor wafer source 1, the determination on whether the element non-formation wafer 42 is reusable as the new semiconductor wafer source 51 is made (Step S7 of FIG. 8A). In a case in which the element non-formation wafer 42 is not reusable (Step S7 of FIG. 8A: NO), the method for manufacturing the semiconductor device by using one semiconductor wafer source 1 is ended. The way of the determination on whether the element non-formation wafer 42 is reusable is as described in the first preferred embodiment and, therefore a description thereof will be omitted.

In a case in which the element non-formation wafer 42 is reusable as the new semiconductor wafer source 51 (Step S7 of FIG. 8A: YES), a determination on whether the element non-formation wafer 42 cannot be divided again and also on whether it can be used as a last semiconductor wafer source is made (Step S53 of FIG. 8A). The determination on whether the element non-formation wafer 42 can be divided again may be made on the basis of the thickness of a semiconductor device which is to be obtained.

In a case in which the element non-formation wafer 42 cannot be divided and has such a thickness that it can be made equal in thickness to a semiconductor device by a short-time grinding, a determination that it can be used as the last semiconductor wafer source may be made. Further, in a case in which the element non-formation wafer 42 cannot be divided and has such a thickness that it is substantially equal in thickness to a semiconductor device which is to be obtained, a determination that it can be used as the last semiconductor wafer source may be made.

Figure 9H:
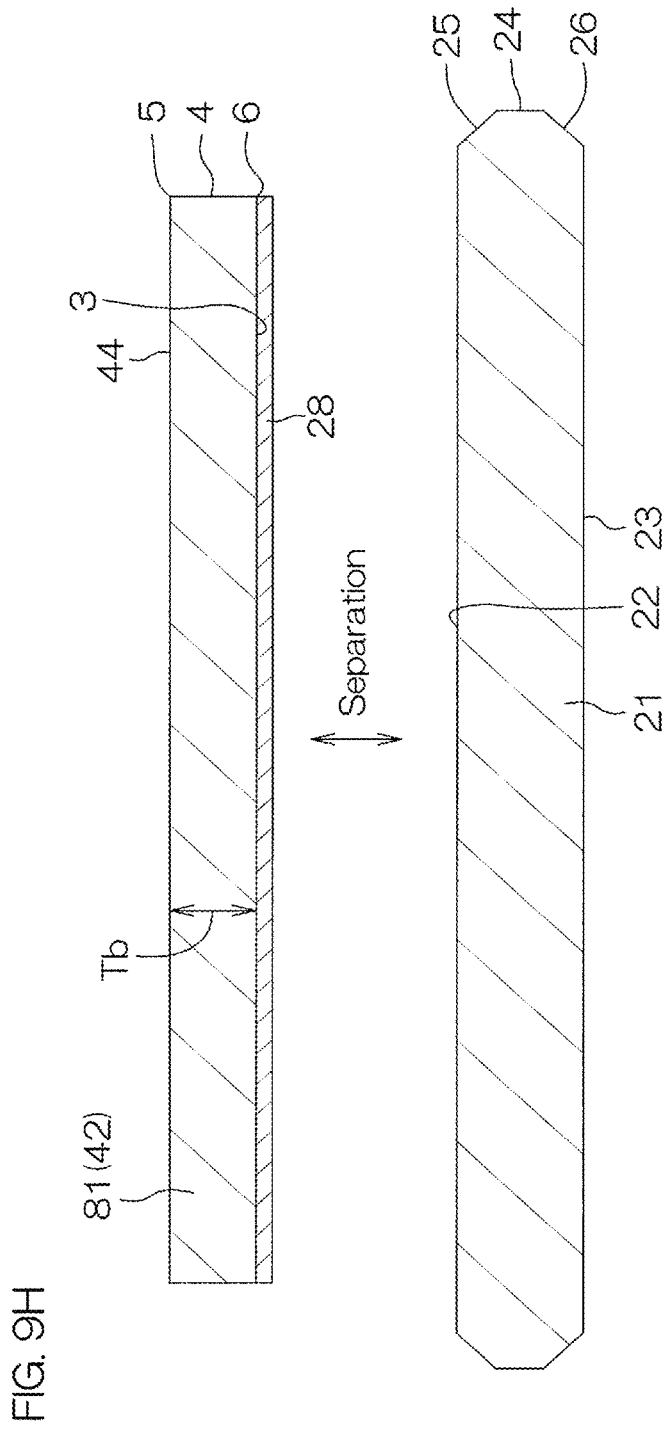
FIG. 9H is a cross sectional view for describing a step subsequent to that of FIG. 9G.

With reference to FIG. 9H, in a case in which the element non-formation wafer 42 cannot be divided and can be used as the last semiconductor wafer source (Step S53 of FIG. 8A: YES), the element non-formation wafer 42 is reused as a last semiconductor wafer source 81.

Then, the first supporting member 21 is removed from the last semiconductor wafer source 81 (Step S54 of FIG. 8A). Thereby, the second main surface 3 of the last semiconductor wafer source 81 is exposed outside.

The first supporting member 21 may be removed by a polishing process. The polishing process may be performed by a CMP method. The first supporting member 21 may be removed by an etching method. The first supporting member 21 may be removed by abrasion. In a case in which the first supporting member 21 is reusable, the first supporting member 21 may be used as a supporting member for supporting another semiconductor wafer source.

Figure 9I:
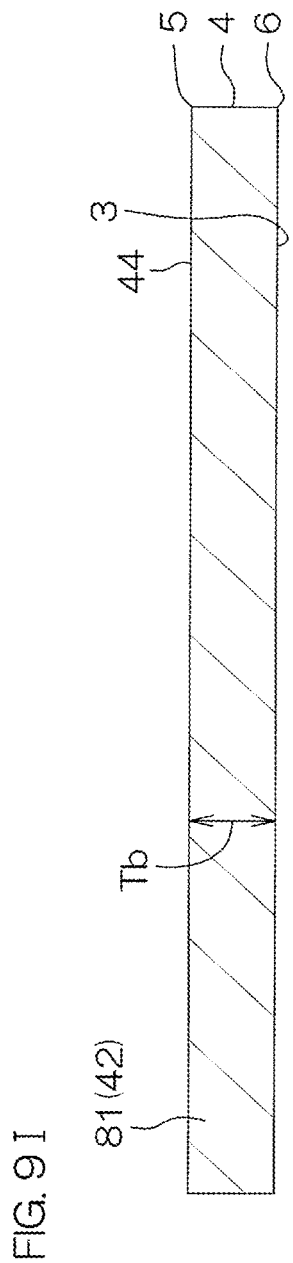
FIG. 9I is a cross sectional view for describing a step subsequent to that of FIG. 9H.

Next, with reference to FIG. 9I, in a case in which the bonding layer 28 adheres on the second main surface 3 of the last semiconductor wafer source 81, the bonding layer 28 is removed from the last semiconductor wafer source 81.

Figure 9J:
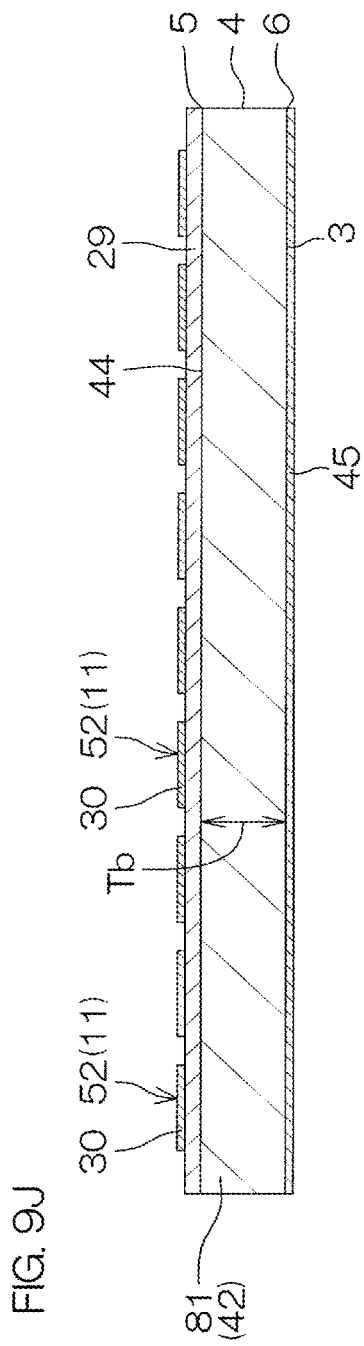
FIG. 9J is a cross sectional view for describing a step subsequent to that of FIG. 9I.

Next, with reference to FIG. 9J, the new semiconductor element 52 is formed on the second cut surface 44 of the last semiconductor wafer source 81 (Step S55 of FIG. 8A). The new semiconductor element 52 may be the same type as the previously described semiconductor element 11 or may be different therefrom.

FIG. 9J shows an example in which the new semiconductor element 52 is the same type as the semiconductor element 11. The new semiconductor element 52 is formed in each of the plurality of element forming regions 10 set on the second cut surface 44 of the last semiconductor wafer source 81. The step of forming the new semiconductor element 52 is as described in the first preferred embodiment and, therefore, a description thereof will be omitted. Then, the second main surface electrode 45 is formed on the second main surface 3 of the last semiconductor wafer source 81.

Prior to the step of forming the second main surface electrode 45, annealing treatment may be performed on the second main surface 3 (ground surface) of the last semiconductor wafer source 81. Annealing treatment may be performed by a laser light irradiation method. In this case, ohmic property of the second main surface electrode 45 in relation to the second main surface 3 of the last semiconductor wafer source 81 can be enhanced.

Thereafter, the last semiconductor wafer source 81 is cut along the dicing line 12 (also refer to FIG. 1A and FIG. 1B) (Step S13 of FIG. 2B) Thereby, a plurality of semiconductor devices are cut out from the last semiconductor wafer source 81.

On the other hand, with reference to FIG. 9K, in a case in which the element non-formation wafer 42 can be divided again and cannot be used as the last semiconductor wafer source (Step S53 of FIG. 8A: NO), the element non-formation wafer 42 is reused as the new semiconductor wafer source 51.

Then, the first supporting member 21 is removed from the new semiconductor wafer source 51 (Step S57 of FIG. 8A). Thereby, the second main surface 3 of the new semiconductor wafer source 51 is exposed outside.

The first supporting member 21 may be removed by a polishing process. The polishing process may be performed by a CMP method. The first supporting member 21 may be removed by an etching method. The first supporting member 21 may be removed by abrasion. In a case in which the first supporting member 21 is reusable, the first supporting member 21 may be used as a supporting member for supporting another semiconductor wafer source.

Next, with reference to FIG. 9L, in a case in which the bonding layer 28 adheres on the second main surface 3 of the new semiconductor wafer source 51, the bonding layer 28 is removed from the new semiconductor wafer source 51.

Figure 9M:
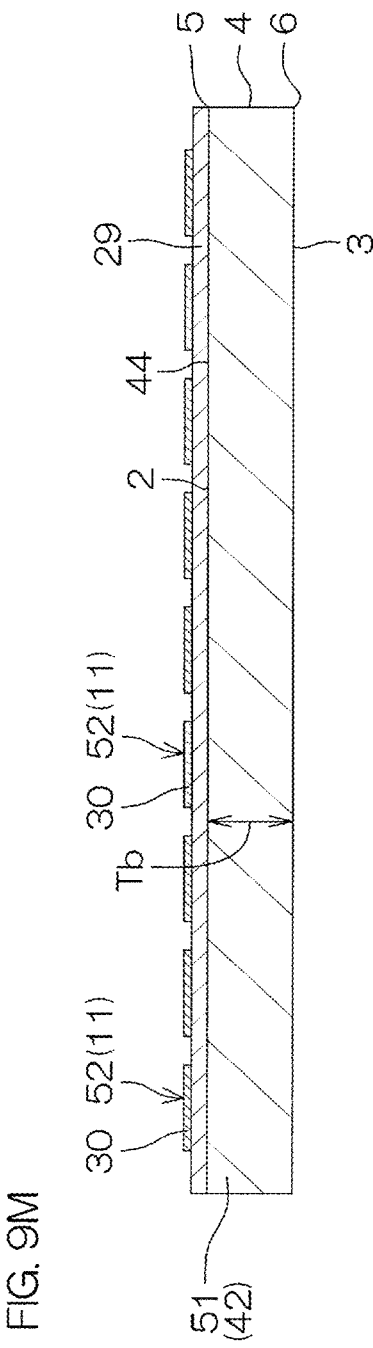
FIG. 9M is a cross sectional view for describing a step subsequent to that of FIG. 9L.

Next, with reference to FIG. 9M, the new semiconductor element 52 is formed on the second cut surface 44 of the new semiconductor wafer source 51 (Step S58 of FIG. 8A). The new semiconductor element 52 may be the same type as the previously described semiconductor element 11 or may be different therefrom.

FIG. 9M shows an example in which the new semiconductor element 52 is the same type as the semiconductor element 11. The new semiconductor element 52 is formed in each of the plurality of element forming regions 10 set on the second cut surface 44 of the new semiconductor wafer source 51. The step of forming the new semiconductor element 52 is as described in the first preferred embodiment and, therefore, a description thereof will be omitted.

As described above, in this embodiment, the step of Step S4 to Step S7 is repeated until the element non-formation wafer is not reusable as the new semiconductor wafer source. Further, in this embodiment, a process of Step S4 to Step S53 is repeated until the element non-formation wafer can be the last semiconductor wafer source.

Even with this manufacturing method, the same effects as those described in the first embodiment can be realized. In particular, in the present preferred embodiment, the element non-formation wafer 42 is reusable as the last semiconductor wafer source 81 (Step S53 to Step S56). Thereby, an initial semiconductor wafer source 1 can be consumed without being wasted.

In this process, a description has been made for an example in which the step of forming the new semiconductor element 52 in the last semiconductor wafer source 81 (Step S55 of FIG. 8A) is performed after the step of removing the first supporting member 21 (Step S54 of FIG. 8A). However, the step of forming the new semiconductor element 52 (Step S55 of 8A) may be performed prior to the step of removing the first supporting member 21 (Step S54 of FIG. 8A).

In this process, a description has been made for an example in which the step of forming the new semiconductor element 52 in the new semiconductor wafer source 51 (Step S58 of FIG. 8A) is performed after the step of removing the first supporting member 21 (Step S57 of FIG. 8A). However, the step of forming the new semiconductor element 52 (Step S58 of FIG. 8A) may be performed prior to the step of removing the first supporting member 21 (Step S57 of FIG. 8A).

FIG. 10 is a cross sectional view which shows a semiconductor device 111 according to one example of the present invention.

With reference to FIG. 10, the semiconductor device 111 includes a Schottky barrier diode as one example of the semiconductor element 11. The semiconductor device 111 includes a chip-shaped SiC semiconductor layer 112. The SiC semiconductor layer 112 has a first main surface 113 on one side, a second main surface 114 on the other side and a side surface 115 connecting the first main surface 113 and the second main surface 114.

In this mode, the SiC semiconductor layer 112 has a laminated structure which includes an $n^+$ type SiC semiconductor substrate 116 and an n type SiC epitaxial layer 117. An n type impurity concentration of the SiC epitaxial layer 117 is less than an n type impurity concentration of the SiC semiconductor substrate 116.

The SiC semiconductor substrate 116 forms the second main surface 114 of the SiC semiconductor layer 112. The SiC epitaxial layer 117 forms the first main surface 113 of the SiC semiconductor layer 112. The SiC semiconductor substrate 116 and the SiC epitaxial layer 117 form the side surface 115 of the SiC semiconductor layer 112.

A diode region 118 of n type is formed at a surface layer portion of the first main surface 113 of the SiC semiconductor layer 112. In this mode, the diode region 118 is formed at a central portion of the first main surface 113 of the SiC semiconductor layer 112 in a plan view as viewed in a normal direction of the first main surface 113 of the SiC semiconductor layer 112 (hereinafter, simply referred to as a "plan view"). In this mode, the diode region 118 is formed by using a part of the SiC epitaxial layer 117.

A guard region 119 of $p^+$ type is formed at the surface layer portion of the first main surface 113 of the SiC semiconductor layer 112. The guard region 119 is formed in a band shape extending along the diode region 118 in plan view. More specifically, the guard region 119 is formed in an endless shape surrounding the diode region 118 in plan view (for example, a quadrilateral annular shape, a quadrilateral annular shape, a corner of which is chamfered, or a circular annular shape). Thereby, the guard region 119 is formed as a guard ring region.

P type impurities of the guard region 119 may not be activated. In this case, the guard region 119 is formed as a non-semiconductor region. The p type impurities of the guard region 119 may be activated. In this case, the guard region 119 is formed as a semiconductor region of p type.

An insulation layer 120 is formed on the first main surface 113 of the SiC semiconductor layer 112. An opening 121 for exposing the diode region 118 is formed on the insulation layer 120. In this mode, in addition to the diode region 118, an inner peripheral edge of the guard region 119 is also exposed from the opening 121.

A first main surface electrode 30 is formed on the insulation layer 120. The first main surface electrode 30 enters into the opening 121 on the insulation layer 120. The first main surface electrode 30 is electrically connected to the diode region 118 inside the opening 121.

The first main surface electrode 30 forms a Schottky junction with the diode region 118. Thereby, a Schottky barrier diode having the first main surface electrode 30 served as an anode and the diode region 118 served as a cathode is formed.

A second main surface electrode 45 is formed on the second main surface 114 of the SiC semiconductor layer 112. The second main surface electrode 45 forms an ohmic contact with the second main surface 114 of the SiC semiconductor layer 112.

Figure 11A:
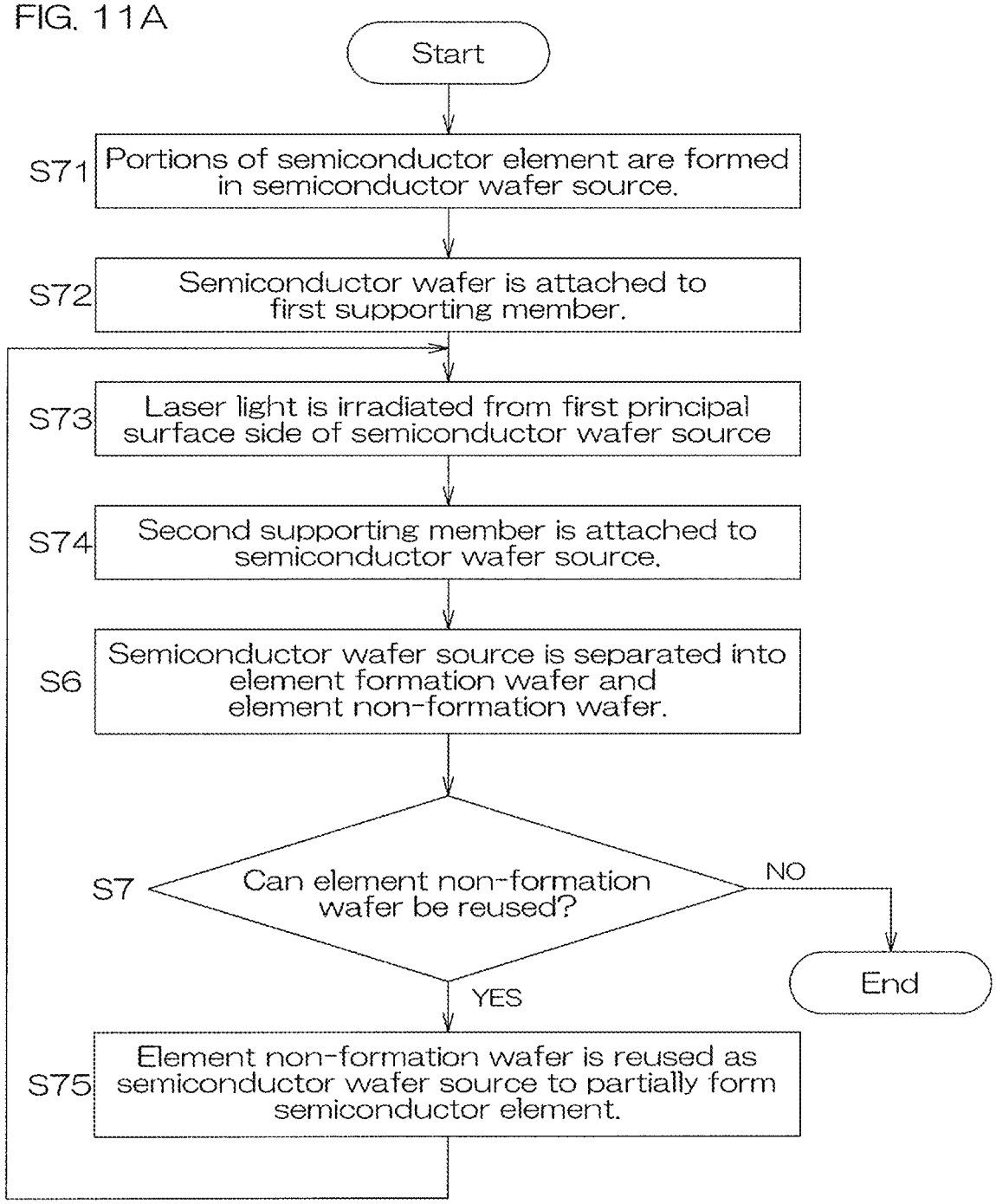
FIG. 11A is a process chart for describing a method for manufacturing a semiconductor device according to a sixth preferred embodiment of the present invention.
Figure 11B:
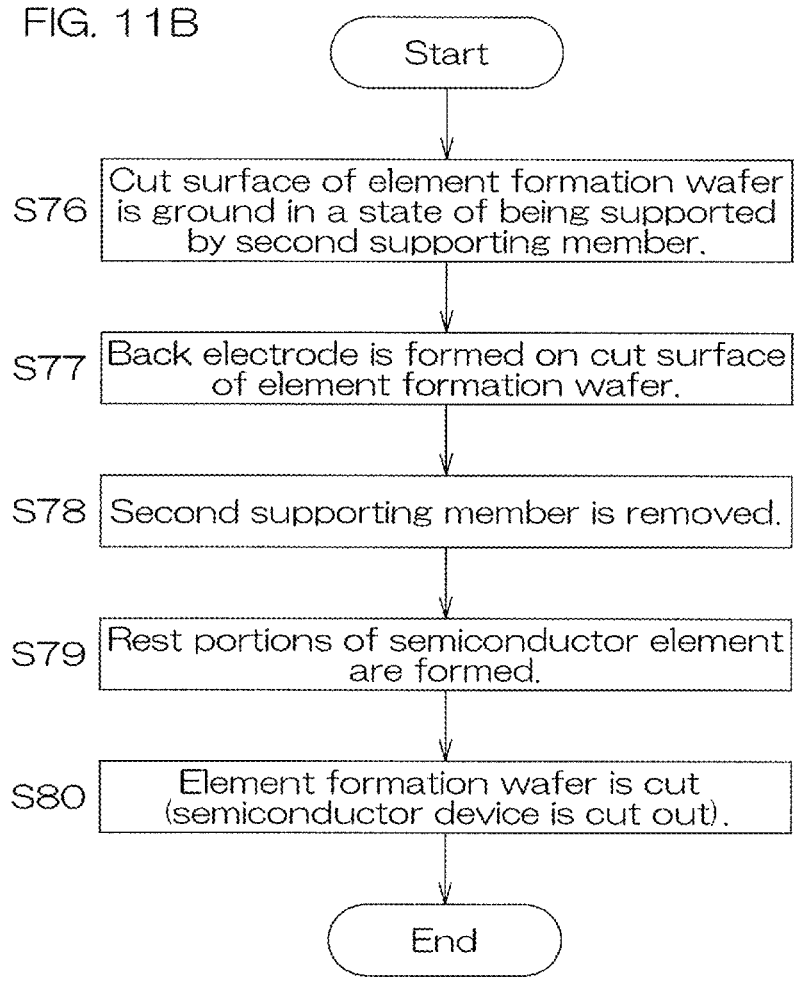
FIG. 11B is a process chart for describing a step performed on an element formation wafer obtained from the step shown in FIG. 11A.

FIG. 11A is a process chart for describing the method for manufacturing the semiconductor device according to the sixth preferred embodiment of the present invention. FIG. 11B is a process chart for describing a step performed on the element formation wafer 41 which is obtained from a step shown in FIG. 11A.

FIG. 12A to FIG. 12I are each a schematic cross sectional view for describing the manufacturing method shown in FIG. 11A and FIG. 11B by applying the manufacturing method shown in FIG. 11A and FIG. 11B to the method for manufacturing the semiconductor device 111 shown in FIG. 10.

Hereinafter, a description of a step corresponding to the step described in the first preferred embodiment will be omitted. In FIG. 12A to FIG. 12I, for the sake of convenience of description, only a region in which one semiconductor device 111 is formed is shown, and regions of other semiconductor devices and an end region of the semiconductor wafer source are omitted.

In this embodiment, in place of Step S1 to Step S5 (refer to FIG. 2A) according to the first preferred embodiment, Step S71 to Step S74 are performed. Further, in this embodiment, after Step S7 according to the first preferred embodiment, Step S75 is performed.

More specifically, first, with reference to FIG. 12A, the semiconductor wafer source 1 made of an n⁺ type SiC monocrystal is prepared. Next, portions of the semiconductor element 11 are formed on the first main surface 2 of the semiconductor wafer source 1 (Step 771 of FIG. 11A).

In this embodiment, the step of forming the portions of the semiconductor element 11 includes a step of forming the n type SiC epitaxial layer 117 on the first main surface 2 of the semiconductor wafer source 1. Further, the step of forming the portions of the semiconductor element 11 includes a step of forming the diode region 118 of the n type and a guard region 119 of the p⁺ type in the surface layer portion of the SiC epitaxial layer 117.

In the step of forming the SiC epitaxial layer 117, SiC undergoes epitaxial growth from the first main surface 2 of the semiconductor wafer source 1. The diode region 118 is formed by using a part of the SiC epitaxial layer 117.

Next, with reference to FIG. 12B, the semiconductor wafer source 1 in which the portions of the semiconductor element 11 are formed is attached to the first supporting member 21 (Step S72 of FIG. 11A). The semiconductor wafer source 1 is attached to the first supporting member 21 in a posture that the second main surface 3 faces a first supporting main surface 22 of the first supporting member 21. Thereby, the wafer-attached structure 101 is formed. The method for attaching the semiconductor wafer source 1 to the first supporting member 21 is as described in the first preferred embodiment and, therefore, a description thereof will be omitted.

Next, with reference to FIG. 12C, laser light is irradiated toward the semiconductor wafer source 1 from the laser light irradiation apparatus 33 (Step S73 of FIG. 11A). In this embodiment, laser light is irradiated from the first main surface 2 side of the semiconductor wafer source 1 to the thickness direction intermediate portion of the semiconductor wafer source 1.

In this step, no electrode layer is formed on a surface of the SiC epitaxial layer 117 on the first main surface 2 side of the semiconductor wafer source 1. Further, no insulation layer is formed either on the surface of the SiC epitaxial layer 117 on the first main surface 2 side of the semiconductor wafer source 1. Therefore, it is possible to irradiate laser light with respect to an interior of the semiconductor wafer source 1 from the first main surface 2 side of the semiconductor wafer source 1 with few obstacles.

The distance W1 from the first main surface 2 of the semiconductor wafer source 1 to the light collecting portion of laser light is set depending on the thickness of a semiconductor device which is to be obtained. The distance W1 may be not less than 50 μm and not more than 100 μm.

The laser light irradiation position to the semiconductor wafer source 1 is moved along the horizontal direction parallel to the first main surface 2 of the semiconductor wafer source 1. Thereby, the first altered layer 34, the crystalline state of which is altered in properties different from those of other regions, is formed in the thickness direction intermediate portion of the semiconductor wafer source 1. The first altered layer 34 may be formed in the intermediate portion of the n⁺ type semiconductor wafer source 1.

In a case in which the semiconductor wafer source 1 has a chamfered portion at an edge portion thereof, an error will occur at a light collecting portion (a focal point) of laser light. Therefore, there is a possibility that the first altered layer 34 will not be formed such as to be parallel to the first main surface 2. Thus, in this embodiment, the semiconductor wafer source 1 which includes the second wafer edge portion 6 that is not chamfered is prepared.

Thereby, it is possible to suppress an error occurring at the light collecting portion (the focal point) of laser light. As a result, the first altered layer 34 can be formed inside the semiconductor wafer source 1 across an entire region of the semiconductor wafer source 1 in the thickness direction such as to be parallel to the first main surface 2. Thereby, it is possible to appropriately separate (cleave) the semiconductor wafer source 1 into an element formation wafer 41 and an element non formation wafer 42.

Figure 12D:
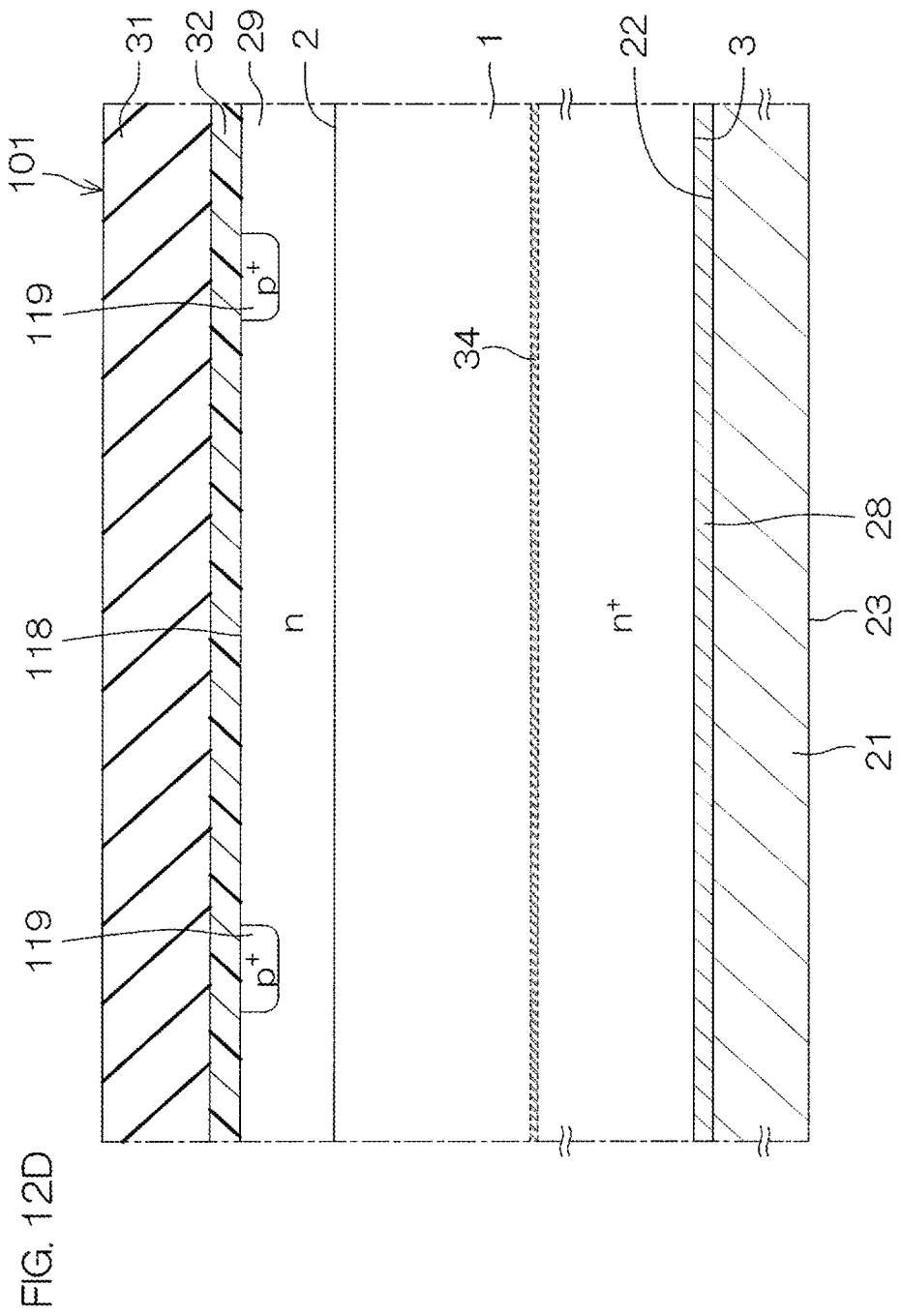
FIG. 12D is a cross sectional view for describing a step subsequent to that of FIG. 12C.

Next, with reference to FIG. 12D, a second supporting member 31 is attached to the first main surface 2 of the semiconductor wafer source 1 (Step S74 of FIG. 11A). The second supporting member 31 may be attached to the semiconductor wafer source 1 via the double-sided adhesive tape 32.

Next, with reference to FIG. 12E, the semiconductor wafer source 1 is cut along a horizontal direction parallel to the first main surface 2 from a thickness direction intermediate portion of the semiconductor wafer source 1 (Step S6 of FIG. 11A). More specifically, the semiconductor wafer source 1 is cleaved along the horizontal direction with the first altered layer 34 as a starting point.

The semiconductor wafer source 1 is cleaved in a state in which the semiconductor wafer source 1 is supported by (held between) the first supporting member 21 and the second supporting member 31. Thereby, the semiconductor wafer source 1 is separated into the element formation wafer 41 having the portions of the semiconductor element 11 and the element non-formation wafer 42 free of the semiconductor element 11.

In the step of cutting the semiconductor wafer source 1 (Step S6 of FIG. 11A), the semiconductor wafer source 1 needs only to be separated into the element formation wafer 41 having the semiconductor element 11 and the element non-formation wafer 42 free of the semiconductor element 11. In addition to a case that the semiconductor wafer source 1 is cleaved as in this embodiment, for example, the first altered layer 34 is adjusted for a position and a condition of the formation so that the semiconductor wafer source 1 can be separated by itself into the element formation wafer 41 and the element non-formation wafer 42.

Figure 12F:
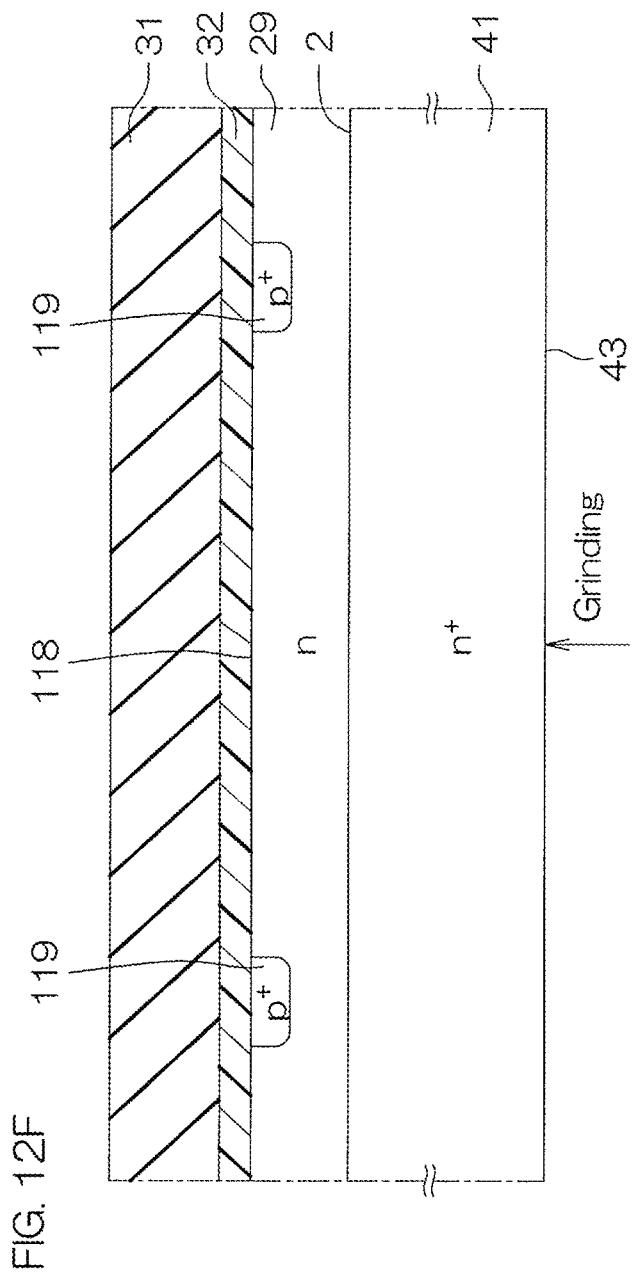
FIG. 12F is a cross sectional view for describing a step subsequent to that of FIG. 12E.

With reference to FIG. 12F, after the step of separating the semiconductor wafer source 1, first cut surface 43 of the element formation wafer 41 is ground (Step S76 of FIG. 11B). The step of grinding the first cut surface 43 may be performed by a CMP method.

The step of grinding the first cut surface 43 may be performed until the element formation wafer 41 attains a desired thickness. That is, the step of grinding the first cut surface 43 may include a step of thinning the element formation wafer 41.

Next, with reference to FIG. 12G, the second main surface electrode 45 is formed on the first cut surface 43 of the element formation wafer 41 (Step S77 of FIG. 11B). Of course, the step of grinding the first cut surface 43 may be omitted. That is, the second main surface electrode 45 may be directly formed on the first cut surface 43 immediately after a step of separating the semiconductor wafer source 1.

After the step of grinding the element formation wafer 41 (Step S76 of FIG. 11B) and prior to the step of forming the second main surface electrode 45 (Step S77 of FIG. 11B), annealing treatment lay be performed on the first cut surface 43 (ground surface) of the element formation wafer 41. Annealing treatment may be performed by the laser light irradiation method. In this case, the second main surface electrode 45 can be enhanced in Ohmic property in relation to the first cut surface 43 of the element formation wafer 41.

Figure 12H:
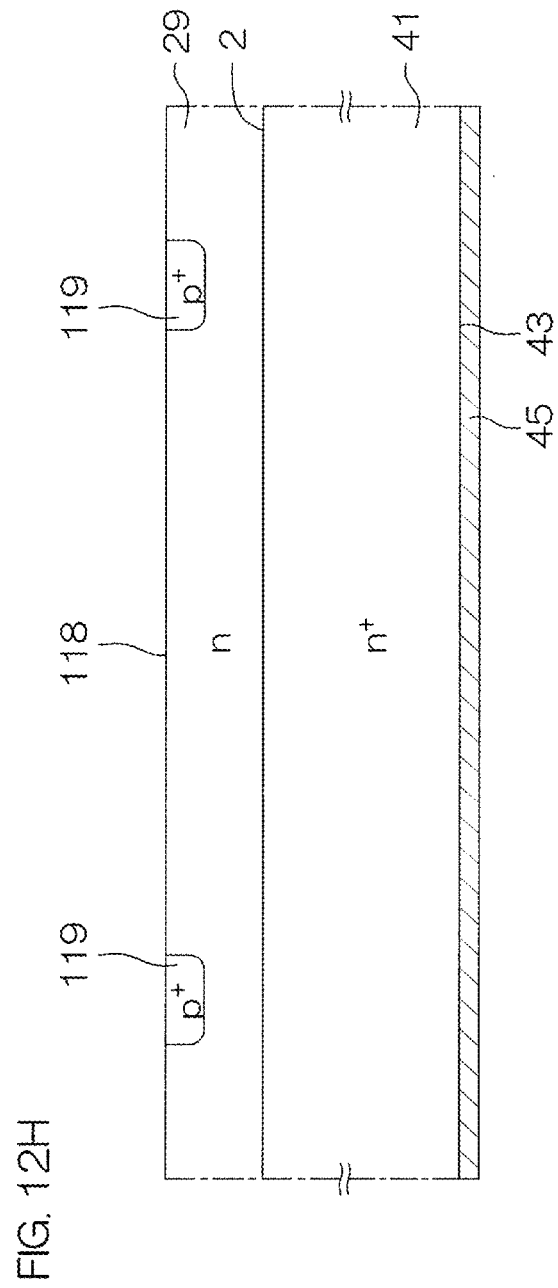
FIG. 12H is a cross sectional view for describing a step subsequent to that of FIG. 12G.

Next, with reference to FIG. 12H, the second supporting member 31 is removed from the first main surface 2 of the semiconductor wafer source 1 (Step S78 of FIG. 11B). The step of removing the second supporting member 31 may be performed prior to the step of grinding the first cut surface 43 or the step of forming the second main surface electrode 45.

Next, with reference to FIG. 12I, the rest portions of the semiconductor element 11 are formed on the first main surface 2 of the semiconductor wafer source 1 (Step S79 of FIG. 11B). In this embodiment, the insulation layer 120 and the first main surface electrode 30 are formed on the first main surface 2 of the semiconductor wafer source 1 as the rest portions of the semiconductor element 11.

Thereafter, the element formation wafer 41 is cut along the dicing line 12 (also refer to FIG. 1A and FIG. 1B) (Step S80 of FIG. 11B). Thereby, the plurality of semiconductor devices 111 are cut out from the element formation wafer 41.

After the step of separating the semiconductor wafer source 1, the determination on whether the element non-formation wafer 42 is reusable as the new semiconductor wafer source 51 is made (Step S7 of FIG. 11A). The way of the determination on whether the element non-formation wafer 42 is reusable is as described in the first preferred embodiment and, therefore, a description thereof will be omitted.

In a case in which the element non-formation wafer 42 is not reusable (Step S7 of FIG. 11A: NO), the method for manufacturing the semiconductor device by using one semiconductor wafer source 1 is ended.

In a case in which the element non-formation wafer 42 is reusable as the new semiconductor wafer source 51 (Step S7 of FIG. 11A: YES), as with Step S71, portions of the semiconductor element 52 are formed in the element non-formation wafer 42 (the new semiconductor wafer source 51) (Step S75 of FIG. 11A).

The step of forming the portions of the semiconductor element 52 (Step S75 of FIG. 11A) may be performed in a state in which the new semiconductor wafer source 51 is attached to the supporting member 21. Of course, prior to the step of forming the portions of the semiconductor element 52 (Step S75 of FIG. 11A), the first supporting member 21 maybe removed. In this case, after the step of partially forming the new semiconductor element 52 (Step S75 of FIG. 11A), the supporting member 21 may be attached again to the new semiconductor wafer source 51.

Thereafter, Step S73 is performed. As described above, in this embodiment, the step of Step S73 to Step S7 is repeated until the element non-formation wafer is not reusable as the new semiconductor wafer source. Even with this manufacturing method, the same effects as those described in the first embodiment can be realized.

In this embodiment, a description has been made for an example in which the Schottky barrier diode is formed as an example of the semiconductor element 11. However, the semiconductor element 11 may include a functional element different from the Schottky barrier diode. As described in the first preferred embodiment, the semiconductor element 11 may include at least any one of the semiconductor rectifier element, the semiconductor switching element and the semiconductor passive element.

The preferred embodiments of the present invention are described, and the present invention can be implemented in other modes.

Figure 13:
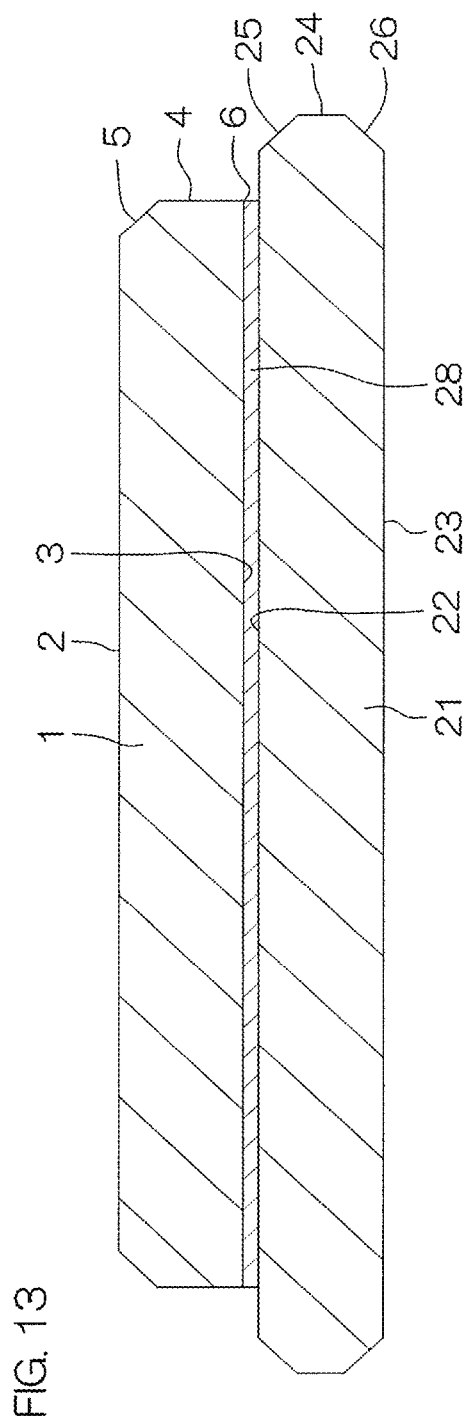
FIG. 13 is a cross sectional view of showing a first modification example of a wafer-attached structure.

In each of the preferred embodiments described above, the wafer-attached structure 101 shown in FIG. 13 may be adopted. FIG. 13 is a cross sectional view which shows a first modification example of the wafer-attached structure 101. Hereinafter, a description on a constitution corresponding to the constitution described in the first preferred embodiment will be omitted.

With reference to FIG. 13, in the wafer-attached structure 101 according to the present modification example, the first wafer edge portion 5 of the semiconductor wafer source 1 has a chamfered portion. The first wafer edge portion 5 may have a C-chamfered portion which is C-chamfered. The first wafer edge portion 5 may have an R-chamfered portion which is R-chamfered.

On the other hand, the second wafer edge portion 6 of the semiconductor wafer source 1 has no chamfered portion. Thereby, it is possible to suppress the formation of a clearance at a region between the second wafer edge portion 6 of the semiconductor wafer source 1 and the first supporting main surface 22 of the first supporting member 21 in the state in which the semiconductor wafer source 1 is supported by the first supporting member 21.

As a result, it is possible to suppress an error occurring at a light collecting portion a focal point) of laser light irradiated to an interior of the semiconductor wafer source 1. As described above, even with the wafer-attached structure 101 according to the present modification example, the same effects as those described in the first embodiment can be realized.

Figure 14:
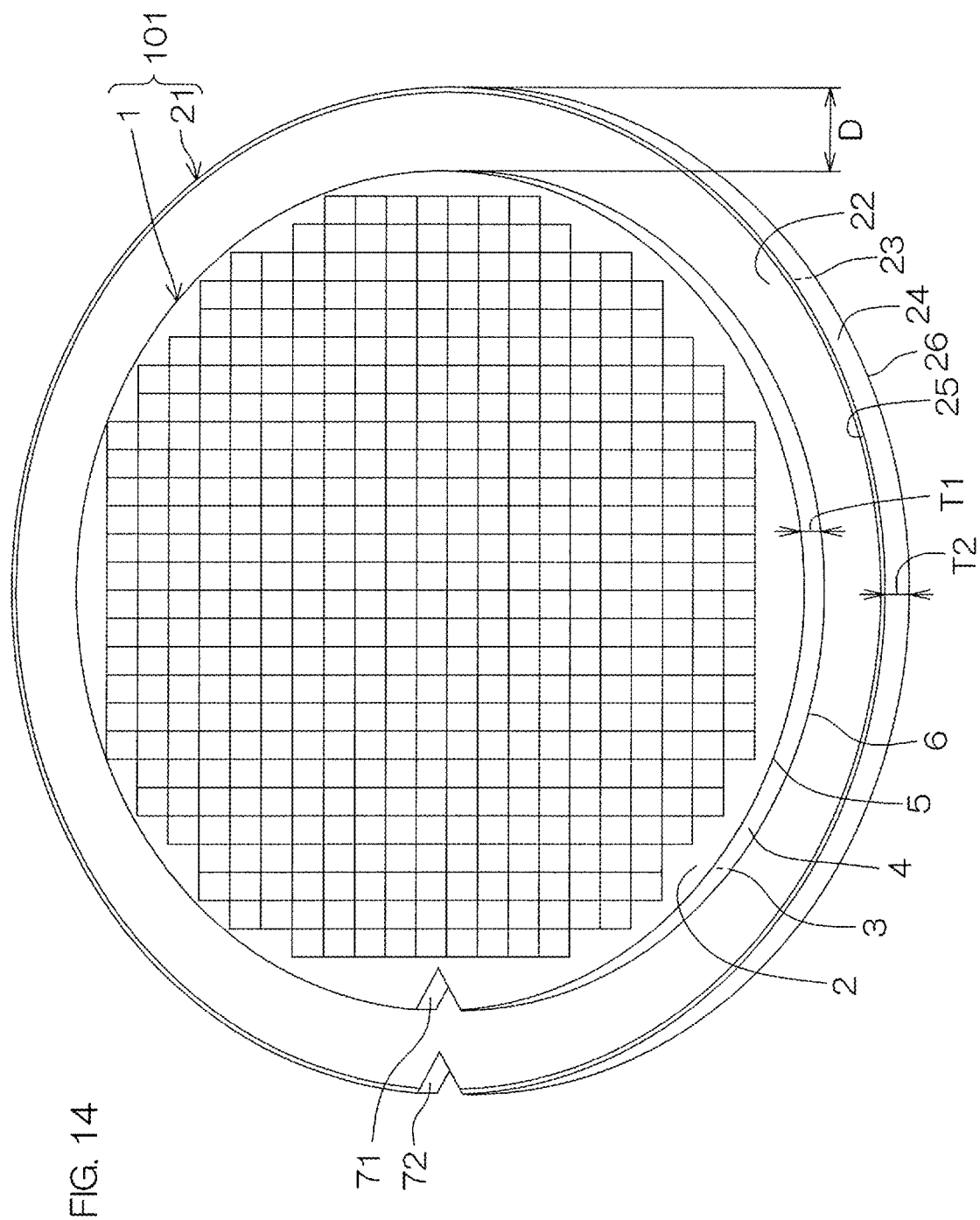
FIG. 14 is a perspective view of showing a second modification example of the wafer-attached structure.

In each of the previously described preferred embodiments, the wafer-attached structure 101 shown in FIG. 14 may be adopted. FIG. 14 is a cross sectional view which shows a second modification example of the wafer-attached structure 101. Hereinafter, a description on a constitution corresponding to the constitution described in the first preferred embodiment will be omitted.

With reference to FIG. 14, in the wafer-attached structure 101 according to the present modification example, in place of the first orientation flat 7, a first orientation notch 71 (first mark) which indicates a crystal orientation, etc., is formed on the semiconductor wafer source 1.

The first orientation notch 71 includes a notched portion formed at a peripheral edge of the semiconductor wafer source 1. The first orientation notch 71 includes a recessed portion which is recessed toward the central portion of the semiconductor wafer source 1 at a peripheral edge of the semiconductor wafer source 1.

Further, in the wafer-attached structure 101 according to the present modification example, in place of the second orientation flat 27, a second orientation notch 72 (second mark) which indicates a crystal orientation, etc., is formed in the first supporting member 21.

The second orientation notch 72 includes a notched portion which is formed at a peripheral edge of the first supporting member 21. The second orientation notch 72 includes a recessed portion which is recessed toward the central portion of the first supporting member 21 at the peripheral edge of the first supporting member 21.

The second orientation notch 72 of the first supporting member 21 may indicate a crystal orientation which is equal to a crystal orientation of the first orientation notch 71 of the semiconductor wafer source 1. Thereby, the semiconductor wafer source 1 can be attached to the first supporting member 21, with the crystal orientation understood.

The second orientation notch 72 of the first supporting member 21 may be positionally aligned with the first orientation notch 71 of the semiconductor wafer source 1. That is, the second orientation notch 72 may face the first orientation notch 71 at a position proximate to the first orientation notch 71.

Thereby, the crystal orientation of the semiconductor wafer source 1 is in agreement with the crystal orientation of the first supporting member 21. Thus, it is possible to easily determine the crystal orientation of the semiconductor wafer source 1. Thereby, the semiconductor wafer source 1 can be handled more conveniently.

As described above, even with the wafer-attached structure 101 according to the present modification example, the same effects as those described in the first embodiment can be realized.

Of course, while the semiconductor wafer source 1 has the first orientation flat 7, the first supporting member 21 may have the second orientation notch 72. Further, while the semiconductor wafer source 1 has the first orientation notch 71, the first supporting member 21 may have the second orientation flat 27.

In each of the preferred embodiments described above, in place of the semiconductor wafer source 1 made of the SiC monocrystal, the semiconductor wafer source 1 made of an Si (silicon) monocrystal. In this case, the thickness T1 of the semiconductor wafer source 1 may be not less than 100 μm and not more than 1000 μm. The thickness T1 of the semiconductor wafer source 1 may be not less than 500 μm and not more than 800 μm.

In a case in which the semiconductor wafer source 1 made of an Si monocrystal is adopted, the first supporting member 21 preferably includes a semiconductor wafer made of Si monocrystal. Thereby, physical properties of the first supporting member 21 are substantially equal to those of the semiconductor wafer source 1.

The thickness T2 of the first supporting member 21 may be not less than 100 μm and not more than 1000 μm. Specifically, the thickness T2 of the first supporting member 21 is not less than 500 μm and not more 800 μm. The thickness T2 of the first supporting member 21 may be equal to the thickness T1 of the semiconductor wafer source 1.

A description of configurations of the first supporting member 21 according to the first preferred embodiment is also applicable to a case in which the first supporting member 21 is made of the Si monocrystal semiconductor wafer.

Si is lower in hardness than SiC. For this reason, difficulty in processing the Si monocrystal semiconductor wafer source 1 is lower than difficulty in processing the SiC monocrystal semiconductor wafer source 1. Thus, even with the semiconductor wafer source 1 made of Si monocrystal, the same effects as those described in the first embodiment can be realized.

Of course, in each of the preferred embodiments described above, the first supporting member 21 may include a substrate (wafer) made of a material other than a semiconductor wafer. For example, the first supporting member 21 may include an insulation substrate which has light permeability. The insulation substrate may include a glass substrate or a resin substrate.

In each of the preferred embodiments described above, a description has been made about the step of separating the semiconductor wafer source 1 by using the laser light irradiation method (Step S5 and Step S6 of FIG. 2A). However, the cutting method used in the separating step is not restricted to the laser light irradiation method, as long as it is able to efficiently consume the semiconductor wafer source 1.

In place of, or in addition to the laser light irradiation method, the step of separating the semiconductor wafer source 1 may include at least any one of a wire saw processing method, a dicing blade processing method and an etching processing method. It is preferable that, of these methods, the step of separating the semiconductor wafer source 1 includes the laser light irradiation method.

In each of the preferred embodiments described above, after removal of the element non-formation wafer 42 from the first supporting member 21, the new semiconductor element 52 may be formed at the element non-formation wafer 42.

In this case, in order to perform Step S4 to Step S8, the element non-formation wafer 42 at which the new semiconductor element 52 is formed may be bonded again to the first supporting member 21. In order to perform Step S4 to Step S8, the element non-formation wafer 42 at which the new semiconductor element 52 is formed may be bonded again to a supporting member different from the first supporting member 21.

In each of the preferred embodiments described above, after removal of the second element non-formation wafer 62 from the first supporting member 21, a new semiconductor element may be formed at the second element non-formation wafer 62.

In this case, in order to perform Step S4 to Step S8, the second element non-formation wafer 62 at which the new semiconductor element is formed may be bonded again to the first supporting member 21. In order to perform Step S4 to Step S8, the second element non-formation wafer 62 at which the new semiconductor element is formed may be bonded again to a supporting member different from the first supporting member 21.

In each of the preferred embodiments described above, the element non-formation wafer 42 may be used in an application other than formation of the new semiconductor element 52. The element non-formation wafer 42 may be reused as a supporting member for supporting another semiconductor wafer source. Another semiconductor wafer source may be a semiconductor wafer source smaller in diameter and thinner in thickness than the element non-formation wafer 42.

In each of the preferred embodiments described above, an example of manufacturing a vertical type semiconductor device which includes the first main surface electrode 30 and the second main surface electrode 45 has been shown. However, a horizontal type semiconductor device which includes only the first main surface electrode 30 may be manufactured. In this case, the step of forming the second main surface electrode 45 is omitted.

In each of the preferred embodiments described above, the step of forming the epitaxial layer 29 may be omitted. That is, a semiconductor device which is free of the epitaxial layer 29 may be manufactured.

This description shall not restrict any mode of combination of the features shown in the first to the sixth preferred embodiments. The first to the sixth preferred embodiments can be combined in any given form or in any given mode among these embodiments. That is, a mode that the features shown in the first to the sixth preferred embodiments are combined in any given form or in any given mode is included in examples of the present invention.

The present application corresponds to Japanese Patent Application No. 2017-119704 filed on Jun. 19, 2017 in the Japan Patent Office, and the entire disclose of this application is incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 Semiconductor wafer source
2 First main surface of semiconductor wafer source
3 Second main surface of semiconductor wafer source
4 Side wall of semiconductor wafer source
5 First wafer edge portion of semiconductor wafer source
6 Second wafer edge portion of semiconductor wafer source
10 Element forming region
11 Semiconductor element
21 First supporting member
22 First supporting main surface of first supporting member
23 Second supporting main surface of first supporting member
24 Supporting side wall of first supporting member
25 First supporting edge portion of first supporting member
26 Second supporting edge portion of first supporting member
34 First altered layer
41 Element formation wafer
42 Element non-formation wafer
51 New semiconductor wafer source
52 New semiconductor element
55 Second altered layer
61 Second element formation wafer
62 Second element non-formation wafer

The invention claimed is:

1. A method for manufacturing a semiconductor device comprising:
　a step of preparing a n+ type SiC semiconductor wafer source having a first impurity concentration, a first main surface on one side, and a second main surface on the other side;
　a step of forming an n type SiC epitaxial layer having a second impurity concentration that is lower than the first impurity concentration on the first main surface;
　a step of forming a semiconductor element in a surface side of the n type SiC epitaxial layer which is opposite to the second main surface;
　a step of attaching a first main surface side supporting member to the surface side of the n type SiC epitaxial layer after the step of forming the semiconductor element;
　a step of forming a modified layer extending along a horizontal direction parallel to the first main surface in a thickness position of an intermediate portion of the n+ type SiC semiconductor wafer source, in a condition that a laminated structure including the n+ type SiC semiconductor wafer source and the n type SiC epitaxial layer is supported by the first main surface side supporting member; and
　a step of separating the n+ type SiC semiconductor wafer source along the modified layer into an element formation wafer having the semiconductor element and supported by the first main surface side supporting member and an element non-formation wafer.

2. The method for manufacturing the semiconductor device according to claim 1, wherein the step of forming the modified layer includes a step of irradiating a laser light into the n+ type SiC semiconductor wafer source and modifying a property of the n+ type SiC semiconductor wafer source.

3. The method for manufacturing the semiconductor device according to claim 2, wherein the step of forming the modified layer includes:
　a step of setting a light condensing portion of the laser light into the thickness position of the intermediate portion of the n+ type SiC semiconductor wafer source, and
　a step of shifting an irradiation position of the laser light with respect to the n+ type SiC semiconductor wafer source along the horizontal direction parallel to the first main surface.

4. The method for manufacturing the semiconductor device according to claim 2, wherein the laser light is irradiated from the second main surface side.

5. The method for manufacturing the semiconductor device according to claim 1, further comprising:
a step of attaching a second main surface side supporting member to the second main surface side of the n+ type SiC semiconductor wafer source having the modified layer, wherein
the step of separating the n+ type SiC semiconductor wafer source is performed in a condition that the n+ type SiC semiconductor wafer source is supported by the first main surface side supporting member and the second main surface side supporting member, and
the element non-formation wafer is supported by the second main surface side supporting member.

6. The method for manufacturing the semiconductor device according to claim 1, further comprising:
a step of forming a back electrode on a separation surface of the element formation wafer, in a condition that the element formation wafer is supported by the first main surface side supporting member, after the step of separating the n+ type SiC semiconductor wafer source.

7. The method for manufacturing the semiconductor device according to claim 1, further comprising:
a step of grinding a separation surface of the element formation wafer, in a condition that the element formation wafer is supported by the first main surface side supporting member, after the step of separating the n+ type SiC semiconductor wafer source.

8. The method for manufacturing the semiconductor device according to claim 1, further comprising:
a step of reusing the element non-formation wafer as a new n+ type SiC semiconductor wafer source after the step of separating the n+ type SiC semiconductor wafer source;
wherein the step of reusing the element non-formation wafer includes:
a step of forming a new n type SiC epitaxial layer on a separation surface of the element non-formation wafer; and
a step of forming a semiconductor element in a surface of the new n type SiC epitaxial layer.

9. The method for manufacturing the semiconductor device according to claim 8, wherein the step of reusing the element non-formation wafer is performed when a thickness of the element non-formation wafer is not less than a thickness of the element formation wafer.

10. The method for manufacturing the semiconductor device according to claim 8, further comprising:
a step of attaching a second main surface side supporting member to the second main surface side of the new n+ type SiC semiconductor wafer source having the modified layer, wherein
the step of separating the semiconductor wafer source is performed in a condition that the new n+ type SiC semiconductor wafer source is supported by the first main surface side supporting member and the second main surface side supporting member, and
the step of reusing the element non-formation wafer is performed in a condition that the element non-formation wafer is supported by the second main surface side supporting member.

11. The method for manufacturing the semiconductor device according to claim 10, further comprising:
a step of attaching a new first main surface side supporting member to the new n type SiC epitaxial layer side of the element non-formation wafer after the step of forming the semiconductor element in the new n type SiC epitaxial layer.

12. The method for manufacturing the semiconductor device according to claim 11, further comprising:
a step of removing the second main surface side supporting member from the element non-formation wafer before the step of attaching the new first main surface side supporting member.

13. The method for manufacturing the semiconductor device according to claim 8, wherein the step of reusing the element non-formation wafer includes a step of grinding the separation surface of the element non-formation wafer before the step of forming the new n type SiC epitaxial layer.

14. The method for manufacturing the semiconductor device according to claim 13, wherein the separation surface of the element non-formation wafer is ground until an arithmetic average roughness Ra becomes 1 nm or less.

15. The method for manufacturing the semiconductor device according to claim 11, wherein the step of forming the semiconductor element includes a step of forming a surface electrode over the first main surface.

16. The method for manufacturing the semiconductor device according to claim 6, further comprising:
a step of performing an annealing treatment on a ground surface of element formation wafer before the step of forming the back electrode.

17. The method for manufacturing the semiconductor device according to claim 16, wherein the annealing treatment includes irradiating a laser light on the ground surface of element formation wafer.

* * * * *